(12) United States Patent
Choi et al.

(10) Patent No.: US 8,575,753 B2
(45) Date of Patent: Nov. 5, 2013

(54) SEMICONDUCTOR DEVICE HAVING A CONDUCTIVE STRUCTURE INCLUDING OXIDE AND NON OXIDE PORTIONS

(75) Inventors: Suk-hun Choi, Suwon-si (KR); Ki-ho Bae, Seoul (KR); Yi-koan Hong, Suwon-si (KR); Kyung-hyun Kim, Seoul (KR); Tae-hyun Kim, Suwon-si (KR); Kyung-tae Nam, Suwon-si (KR); Jun-ho Jeong, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 533 days.

(21) Appl. No.: 12/787,056

(22) Filed: May 25, 2010

(65) Prior Publication Data

US 2010/0301480 A1    Dec. 2, 2010

(30) Foreign Application Priority Data

May 27, 2009   (KR) .................. 10-2009-0046383
Nov. 17, 2009  (KR) .................. 10-2009-0110694

(51) Int. Cl.
    *H01L 29/40*     (2006.01)
(52) U.S. Cl.
    USPC ........................... 257/758; 257/759; 257/760
(58) Field of Classification Search
    USPC ................................ 257/758–760
    See application file for complete search history.

(56) References Cited

U.S. PATENT DOCUMENTS

| | | | | |
|---|---|---|---|---|
| 4,291,391 A * | 9/1981 | Chatterjee et al. | ............ | 365/184 |
| 4,715,109 A * | 12/1987 | Bridges | ............ | 438/647 |
| 5,423,939 A * | 6/1995 | Bryant et al. | ............ | 216/18 |
| 6,277,720 B1 * | 8/2001 | Doshi et al. | ............ | 438/586 |
| 6,326,320 B1 * | 12/2001 | Yang et al. | ............ | 438/788 |
| 6,365,452 B1 * | 4/2002 | Perng et al. | ............ | 438/241 |
| 6,380,578 B1 * | 4/2002 | Kunikiyo | ............ | 257/301 |
| 6,455,424 B1 * | 9/2002 | McTeer et al. | ............ | 438/675 |
| 7,012,335 B2 * | 3/2006 | Lee et al. | ............ | 257/758 |
| 7,388,240 B2 * | 6/2008 | Kim | ............ | 257/261 |
| 7,569,453 B2 * | 8/2009 | Fishburn | ............ | 438/257 |
| 7,863,173 B2 * | 1/2011 | Kang et al. | ............ | 438/584 |
| 8,164,160 B2 * | 4/2012 | Nakao et al. | ............ | 257/532 |
| 2004/0072401 A1 * | 4/2004 | Iizuka et al. | ............ | 438/240 |
| 2004/0235242 A1 * | 11/2004 | Basceri et al. | ............ | 438/240 |
| 2005/0253272 A1 * | 11/2005 | Ohtake et al. | ............ | 257/759 |
| 2006/0141771 A1 * | 6/2006 | Jang | ............ | 438/633 |
| 2006/0183293 A1 * | 8/2006 | Sasaki | ............ | 438/401 |
| 2007/0123033 A1 * | 5/2007 | Wu et al. | ............ | 438/624 |
| 2009/0117697 A1 * | 5/2009 | Park et al. | ............ | 438/211 |

FOREIGN PATENT DOCUMENTS

JP         53117985     * 10/1978

* cited by examiner

*Primary Examiner* — James Mitchell
(74) *Attorney, Agent, or Firm* — F. Chau & Associates, LLC

(57) ABSTRACT

A semiconductor device includes an interlayer insulating layer disposed on a substrate, the interlayer insulating layer comprising an opening exposing the substrate, a barrier layer pattern disposed within the opening, and a conductive pattern disposed on the barrier layer pattern, the conductive pattern having an oxidized portion extending out of the opening and a non-oxidized portion within the opening, wherein a width of the conductive pattern is determined by a thickness of the barrier layer pattern.

32 Claims, 43 Drawing Sheets

SEMICONDUCTOR DEVICE HAVING A CONDUCTIVE STRUCTURE INCLUDING OXIDE AND NON OXIDE PORTIONS

CROSS-REFERENCE TO RELATED APPLICATION

The present application claims priority to Korean patent applications 2009-0046383 filed on May 27, 2009 and 2009-0110694 filed on Nov. 17, 2009, the entire contents of both are incorporated herein by reference.

BACKGROUND

1. Technical Field

Example embodiments of the inventive concept relate to a semiconductor device having a conductive structure, and more particularly to a semiconductor device having a conductive structure contacting a data storage device.

2. Discussion of Related Art

Data can be stored into or read from a resistance memory device by applying heat at a predetermined position of the resistance memory device. For generating a local heating at the predetermined position of the resistance memory device, the resistance memory device may include a conductive structure serving as a heating electrode. As such, a conductive structure that can provide a high heating efficiency for the resistance memory device is needed.

SUMMARY OF THE INVENTION

According to an exemplary embodiment of the inventive concept, a semiconductor device comprises an interlayer insulating layer disposed on a substrate, the interlayer insulating layer comprising an opening exposing the substrate, a barrier layer pattern disposed within the opening, and a conductive pattern disposed on the barrier layer pattern, the conductive pattern having an oxidized portion extending out of the opening and a non-oxidized portion within the opening, wherein a width of the conductive pattern is determined by a thickness of the barrier layer pattern.

The width of the conductive pattern can be smaller than a width of the opening.

The oxidized portion extending out of the opening can be thicker than an oxidized portion disposed within the opening.

A width of the oxidized portion can be substantially the same as a width of the non-oxidized portion.

A width of the oxidized portion can be larger than a width of the non-oxidized portion.

The semiconductor device may further comprise a filling pattern disposed within the opening such that the conductive pattern is disposed between the barrier layer pattern and the filling pattern.

The conductive pattern may have a cylindrical tube shape.

The conductive pattern can comprise tungsten.

The barrier layer pattern may comprise at least one of titanium or titanium nitride.

The barrier layer pattern may comprise at least one of nitride or oxynitride.

The oxidized portion of the conductive pattern may contact a phase change material thin film in a PRAM.

The barrier layer pattern may contact a P-N diode disposed under the barrier layer pattern.

The oxidized portion of the conductive pattern may contact a free layer pattern in an MRAM.

The barrier layer pattern may electrically contact a MOS transistor disposed under the barrier layer pattern.

A size of a cross-sectional area of the oxidized portion in a plan view can be smaller than a size of a cross-sectional area of the opening in the plan view.

The size of the cross-sectional area of the oxidized portion in the plan view can be determined by a size of the cross-sectional area of the barrier layer pattern.

According to an exemplary embodiment of the inventive concept, a method of forming a semiconductor device comprises forming an interlayer insulating layer on a substrate, forming an opening in the interlayer insulating layer, the opening exposing the substrate, forming a barrier layer pattern within the opening, forming a conductive pattern on the barrier layer pattern within the opening, and growing the conductive pattern so that a portion of the conductive pattern extends out of the opening by oxidizing the conductive pattern.

Growing the conductive pattern may comprise performing an RTA process under an oxygen atmosphere at a temperature of about 400° C. to about 600° C. for about one minute to about 10 minutes.

Growing the conductive pattern may comprise performing a plasma treatment under an oxygen atmosphere for about one minute to about 10 minutes by applying a power of about 20 W to about 100 W.

Growing the conductive pattern may comprise growing is performed isotropically or anisotropically.

The method may further comprise providing a nitrogen atmosphere around the oxidized portion of the conductive pattern.

The method may further comprise forming a filling pattern within the opening such that the conductive pattern is disposed between the filling pattern and the barrier layer pattern.

According to an exemplary embodiment of the inventive concept, a semiconductor device comprises a substrate, an insulating layer having an opening disposed on the substrate, a metal pattern disposed on the substrate, and a metal oxide pattern disposed on the metal pattern and inside the opening, wherein a cross-sectional area of the metal oxide pattern is smaller than a cross-sectional area of the metal pattern.

The metal pattern may comprise tungsten.

A portion of the metal pattern contacting the metal oxide pattern may be recessed and the recessed portion receives a protruding portion of the metal oxide pattern.

A spacer can be disposed between the metal oxide pattern and the insulating layer.

The metal pattern can be disposed on a P-N junction.

The metal pattern can be electrically connected to a MOS transistor.

The metal oxide pattern may contact a free layer pattern of an MRAM.

The metal oxide pattern may contact a phase change material thin film of a PRAM.

A spacer can be disposed between the phase change material thin film and the insulating layer.

A top portion of the phase change material thin film may have a wider width than a width of a bottom portion of the phase change material.

According to an exemplary embodiment of the inventive concept, a method of forming a semiconductor device comprises forming a metal pattern on a substrate, forming an insulting layer on the metal pattern, forming an opening through the insulating layer, the opening exposing a portion of the metal pattern, and oxidizing the exposed portion of the metal pattern to form a metal oxide pattern in the opening.

The metal oxide pattern may contact a free layer of an MRAM.

The metal pattern may electrically contact a MOS transistor of the MRAM.

The metal oxide pattern may contact a phase change thin film of a PRAM.

The metal pattern may contacts a P-N diode of the PRAM.

A width of the metal oxide pattern can be smaller than a width of the metal pattern.

BRIEF DESCRIPTION OF THE DRAWINGS

Exemplary embodiments of the inventive concepts can be understood in more detail from the following description taken in conjunction with the accompanying drawings, in which.

DESCRIPTION OF EXEMPLARY EMBODIMENTS

Exemplary embodiments of the inventive concept are described more fully hereinafter with reference to the accompanying drawings. The inventive concept may, however, be embodied in many different forms and should not be construed as limited to the exemplary embodiments set forth herein.

It will be understood that when an element or layer is referred to as being "on," "connected to" or "coupled to" another element or layer, it can be directly on, connected or coupled to the other element or layer or intervening elements or layers may be present.

Figure 1:
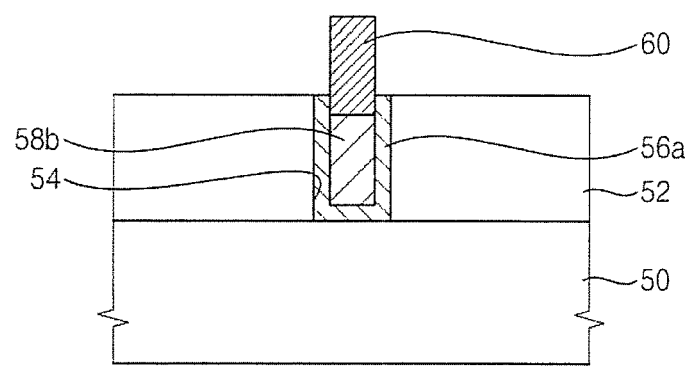
FIG. 1 is a cross sectional view illustrating a conductive structure in accordance with an exemplary embodiment of the inventive concept.
Figure 2:
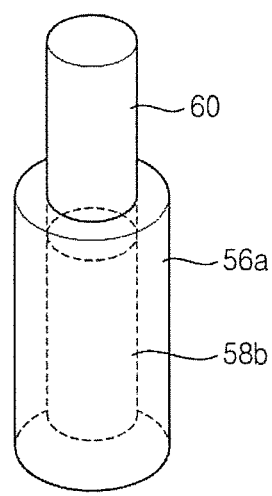
FIG. 2 is a perspective view illustrating the conductive structure in FIG. 1.

FIG. 1 is a cross sectional view illustrating a conductive structure in accordance with an exemplary embodiment of the inventive concept. FIG. 2 is a perspective view illustrating a conductive structure according to an exemplary embodiment of the inventive concept.

Referring to FIGS. 1 and 2, an insulating interlayer 52 is provided on a substrate 50. The insulating interlayer 52 includes an opening 54 that exposes a portion of the substrate 50. For example, the opening 54 may expose a conductive region of the substrate 50. In an exemplary embodiment, a conductive pattern may be positioned on the substrate 50 such that the opening 54 may expose the conductive pattern on the substrate 50.

In an exemplary embodiment, the opening 54 may have a shape of a contact hole. However, the structure of the opening 54 may vary in accordance with the configuration of the conductive structure. That is, the opening 54 may have various shapes so that the structure of the opening 54 may not be limited to that illustrated in FIG. 1. For example, the opening 54 may have a trench structure.

A barrier metal layer pattern 56a is formed on a bottom and a sidewall of the opening 54. The barrier metal layer pattern 56a may have a cylindrical structure. The barrier metal layer pattern 56a may include at least one of metal or nitride. For example, the barrier metal layer pattern 56a may include at least one of titanium (Ti) or titanium nitride (TiNx). The barrier metal layer pattern 56a may have a single layer structure or a multilayer structure. For example, the barrier metal layer pattern 56a may include a titanium film and a titanium nitride film.

The barrier metal layer pattern 56a may prevent metal atoms and/or metal ions in a metal pattern 58b from diffusing toward the insulating interlayer 52. The barrier metal layer pattern 56a increases a contact area of the conductive structure such that the conductive structure has a reduced contact resistance.

In an exemplary embodiment, the barrier metal layer pattern 56a may include a material which is slowly oxidized or barely oxidized.

A metal pattern 58b is disposed on the barrier metal layer pattern 56a. The metal pattern 58b may include, for example, tungsten (W). The metal pattern 58b may not completely fill up the opening 54. The barrier metal layer pattern 56a and the metal pattern 58b may serve as a conductive pattern electrically connected to the conductive region of the substrate 50.

A metal oxide pattern 60 is formed on the metal pattern 58b. The metal oxide pattern 60 may include, for example, tungsten oxide (WOx). In an exemplary embodiment, the metal oxide pattern 60 may be obtained by oxidizing a surface of the metal pattern 58b. The metal oxide pattern 60 may protrude upward from the insulating interlayer 52. In an exemplary embodiment, a protruding portion of the metal oxide pattern 60 may have a thickness (t) substantially larger than a portion of the metal oxide pattern 60 filling the opening 54. Further, the metal oxide pattern 60 may have a width (w) substantially the same as that of the metal pattern 58b.

In an exemplary embodiment, the metal oxide pattern 60 may have a resistance substantially higher than a resistance of the metal pattern 58b. The thickness (t) of the metal oxide pattern 60 may be adjusted by controlling conditions of an oxidation process in which the metal pattern 58b is oxidized to form the metal oxide pattern 60. Thus, the resistance of the metal oxide pattern 60 may also be adjusted.

The width (w) of the metal oxide pattern 60 may be substantially smaller than a critical dimension (CD) of a photolithography process. In an exemplary embodiment, the width (w) of the metal oxide pattern 60 may decrease as the thickness (t) of the barrier metal layer pattern 56b increases. For example, the width (w) of the metal oxide pattern 60 may be less than about 50 nm.

When the metal oxide pattern 60 has a high resistance, the metal oxide pattern 60 may serve as a heating electrode because the Joule heating effect may be generated in the metal oxide pattern 60 by applying a current to the metal oxide pattern 60.

In an exemplary embodiment, the metal oxide pattern 60 may serve as a contact plug with a high resistance and a width substantially smaller than the CD of the photolithography process.

In an exemplary embodiment, the metal oxide pattern 60 may serve as a wiring having a width smaller than the CD of the photolithography process when the metal oxide pattern 60 has a line shape.

Figure 3:
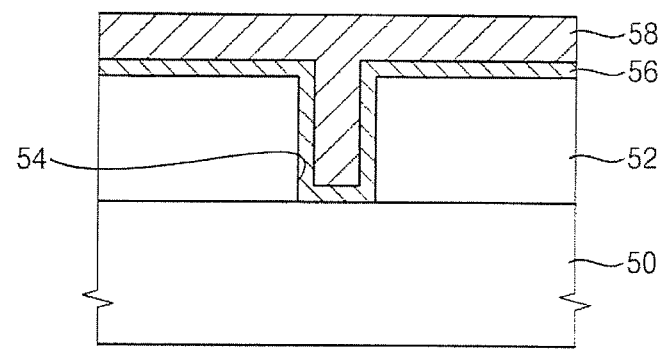
FIGS. 3 to 5 are cross sectional views illustrating a method of forming the conductive structure in FIG. 1.
Figure 4:
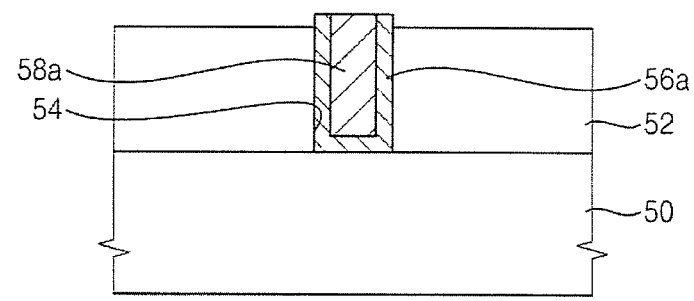
Figure 5:
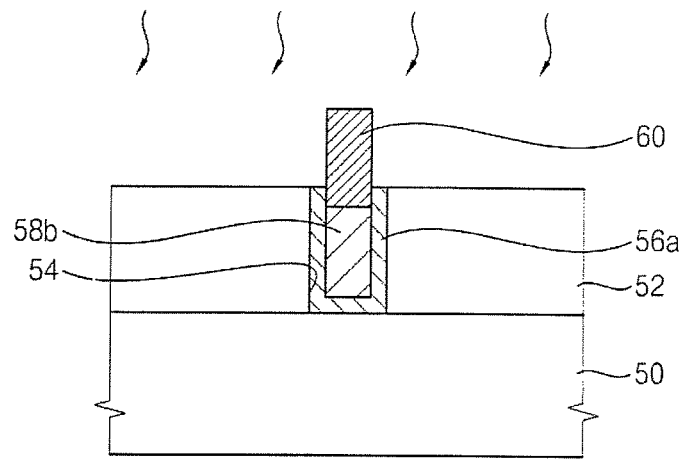

FIGS. 3 to 5 are cross sectional views illustrating a method of forming a conductive structure according to an exemplary embodiment of the inventive concept.

Referring to FIG. 3, the insulating interlayer 52 is formed on the substrate 50. The substrate 50 may include at least one of a semiconductor substrate, a substrate having a semiconductor layer, or a metal oxide substrate. The insulating interlayer 52 may be formed using oxide such as, for example, silicon oxide.

The insulating interlayer 52 is partially etched to form an opening 54 exposing a portion of the substrate 50. The opening 54 may be formed through the insulating interlayer 52 by a photolithography process. The exposed portion of the substrate 50 may include a conductive region. In an example embodiment, the opening 54 may have a shape of a contact hole. When the opening 54 is formed by the photolithography process, the opening 54 may have a width substantially the same as or substantially larger than a critical dimension (CD) of the photolithography process.

A barrier metal layer 56 is formed on a bottom and a side wall of the opening 54 and the insulating interlayer 52. The barrier metal layer 56 may be formed along profiles of the opening 54 and the insulating interlayer 52. The barrier metal layer 56 may prevent metal atoms and/or metal ions included in a metal layer 58 from diffusing toward the insulating interlayer 52. The barrier metal layer 56 may be formed using a material that is slowly oxidized or barely oxidized. For example, the barrier metal layer 56 may comprise at least one of titanium, titanium nitride, tantalum, or tantalum nitride.

These may be used alone or in a mixture thereof. The barrier metal layer 56 may have a single layer structure or a multi layer structure.

The barrier metal layer 56 may not completely fill up the opening 54. The barrier metal layer 56 may be conformally formed on the bottom and the sidewall of the opening 54. When the barrier metal layer 56 is formed on the sidewall of the opening 54, the opening 54 may have a width reduced by twice the thickness of the barrier metal layer 56. Hence, the width of the opening 54 may be adjusted by controlling the thickness of the barrier metal layer 56.

A metal layer 58 is formed on the barrier metal layer 56 to fully fill up the opening 54. The metal layer 58 may comprise, for example, tungsten. In an exemplary embodiment, the metal layer 58 may have a thickness or a width varied in accordance with the thickness of the barrier metal layer 56 because the width of the opening 54 varies by adjusting the thickness of the barrier metal layer 56.

Referring to FIG. 4, the metal layer 58 and the barrier metal layer 56 are partially removed until the insulating interlayer 52 is exposed. The metal layer 58 and the barrier metal layer 56 may be partially removed by, for example, a chemical mechanical polishing (CMP) process. Hence, the barrier metal layer pattern 56a and a preliminary metal pattern 58a are formed in the opening 54.

In the CMP process according to an exemplary embodiment, the insulating interlayer 52 may be polished so that the preliminary metal pattern 58a and the barrier metal layer pattern 56a may protrude upward from the insulating interlayer 52. For example, each of protruding portions of the preliminary metal pattern 58a and the barrier metal layer pattern 56a may have a height of about 10 nm. In this case, the preliminary metal pattern 58a and the barrier metal layer pattern 56a having the protruding portions may be obtained through a single CMP process without an additional etching or planarizing process.

In an exemplary embodiment, the preliminary metal pattern 58a and the barrier metal layer pattern 56a having the protruding portions may be formed by performing more than one CMP process having different process conditions. For example, the metal layer 58 and the barrier metal layer 56 may be polished under a first process condition in a first CMP process, and then the insulating interlayer 52 may be polished under a second process condition in a second CMP process. As a result, the preliminary metal pattern 58a and the barrier metal layer pattern 56a may have portions protruded from the insulating interlayer 52.

Referring to FIG. 5, the preliminary metal pattern 58a is thermally treated under an oxygen atmosphere, such that the metal pattern 58b and the metal oxide pattern 60 are formed on the barrier metal pattern 56a.

When the preliminary metal pattern 58a is thermally treated under the oxygen atmosphere, a surface of the preliminary metal pattern 58a is reacted with oxygen and thus the surface of the preliminary metal pattern 58a is thermally expanded along the sidewall of the opening 54. As a result, the metal oxide pattern 60 is generated on the preliminary metal pattern 58a while changing the preliminary metal pattern 58a into the metal pattern 58b. In an exemplary embodiment, the metal oxide pattern 60 may have a shape varied in accordance with the structure of the preliminary metal pattern 58a.

When the preliminary metal pattern 58a has a top surface formed higher than a top surface of the insulating interlayer 52, the metal oxide pattern 60 may be anisotropically grown from the upper surface of the preliminary metal pattern 58a. Thus, the metal oxide pattern 60 may have a width substantially similar to a width of the preliminary metal pattern 58a.

However, when the top surface of the preliminary metal pattern 58a is substantially lower than the top surface of the insulating interlayer 52, the metal oxide pattern 60 may be isotropically grown from the top surface of the preliminary metal pattern 58a. In an exemplary embodiment, the metal oxide pattern 60 may be wider than the preliminary metal pattern 58a.

As illustrated in FIG. 4, the preliminary metal pattern 58a has the top surface slightly higher than the top surface of the insulating interlayer 52, so that the metal oxide pattern 60 may be anisotropically grown from the top surface of the preliminary metal pattern 58a. That is, the metal oxide pattern 60 may be vertically formed from the preliminary metal pattern 58a and the metal oxide pattern 60 may have the width substantially similar to the width of the preliminary metal pattern 58a. Therefore, the width of the metal oxide pattern 60 may be substantially smaller than that of the opening 54.

Meanwhile, the metal oxide pattern 60 may have a reduced surface roughness when the width of the metal oxide pattern 60 is reduced. For example, when the metal oxide pattern 60 has a width of about 50 nm, the metal oxide pattern 60 may have a reduced surface roughness in a range of several tenth Å to about 1 Å. As a result, an electrical failure caused by the surface roughness of the metal oxide pattern 60 may be prevented. In an exemplary embodiment, the metal oxide pattern 60 may have a width below about 50 nm by adjusting the thickness of the barrier metal layer pattern 56a when the opening 54 is formed by the photolithography process.

In an exemplary embodiment, the metal oxide pattern 60 may be formed on an upper portion of the opening 54 while reacting oxygen with the upper surface of the preliminary metal pattern 58a. Thus, the metal oxide pattern 60 may protrude from the opening 54. While forming the metal oxide pattern 60, the preliminary metal pattern 58a is changed into the metal pattern 58b having a height smaller than that of the preliminary metal pattern 58a. The height (h) of the preliminary metal pattern 58a may be reduced to a height (h') as the thickness (t) of the metal oxide pattern 60 increases. In an exemplary embodiment, the metal oxide pattern 60 may have a resistance substantially higher than a resistance of the metal pattern 58b.

In an exemplary embodiment, the metal pattern 58b may be obtained by thermally treating the preliminary metal pattern 58a. A thermal treatment process may be performed near the preliminary metal pattern 58a. The thermal treatment process may include at least one of a plasma treatment or a rapid thermal annealing (RTA) process. For example, the metal oxide pattern 60 may be formed by executing the plasma treatment or the RTA process. Alternatively, the plasma treatment and the RTA process may be successively carried out to form the metal pattern 58b.

Each of the metal pattern 58b and the metal oxide pattern 60 may respectively have a height (h') and a thickness (t) varied by controlling conditions of the thermal treatment process. Further, the widths of the metal pattern 58b and the metal oxide pattern 60 may be adjusted by controlling the thickness of the barrier metal layer 56. Thus, the resistances of the metal pattern 58a and the metal oxide pattern 60 may be controlled.

In an exemplary embodiment, the metal pattern 58b and the metal oxide pattern 60 may be formed by the RTA process. The RTA process may be carried out under an oxygen atmosphere at a temperature of about 400° C. to about 600° C. for about one minute to about 10 minutes. Alternatively, the metal pattern 58b and the metal oxide pattern 60 may be obtained by the plasma treatment. In an exemplary embodiment, the plasma treatment may be executed under an oxygen atmosphere for about one minute to about 10 minutes by applying a power of about 20 W to about 100 W.

In an exemplary embodiment, the preliminary metal pattern 58a may be oxidized using a process gas including an oxygen ($O_2$) gas or an ozone ($O_3$) gas. For example, the preliminary metal pattern 58a may be oxidized by providing the oxygen gas with a flow rate of about 500 sccm. However, the preliminary metal pattern 58a may be oxidized by various gases and process conditions without limiting the above-described gas and/or process conditions.

In an exemplary embodiment, the barrier metal layer pattern 56a may not be oxidized while oxidizing the preliminary metal pattern 58a. Although the barrier metal layer pattern 56a is slightly oxidized, an oxidized portion of the barrier metal layer pattern 56a may have a thickness substantially smaller than that of the metal oxide pattern 60. For example, the barrier metal layer pattern 56a may not be substantially oxidized when the barrier metal layer pattern 56a comprises at least one of titanium or titanium nitride.

After forming the metal oxide pattern 60, a surface treatment process may be performed. The surface treatment process may include a rapid thermal nitration (RTN) process in which the surface of the metal oxide pattern 60 is subjected to a nitrogen atmosphere. Further, a reduction process may be performed on the surface of the metal oxide pattern 60 to reduce the amount of metal oxide in the metal oxide pattern 60. The resistance of the metal oxide pattern 60 may vary through the surface treatment process and/or the reduction process, so that the resistance of the conductive structure can be controlled.

According to an exemplary embodiment, the metal oxide pattern 60 may be obtained without deposition of metal oxide or etching deposited metal oxide. The metal oxide pattern 60 may have a width substantially smaller than the CD of the photolithography process. The metal pattern 58b and the barrier metal layer pattern 56a serving as the contact plug may be provided beneath the metal oxide pattern 60. Thus, the contact plug may have a resistance substantially smaller than that of the metal oxide pattern 60 whereas the contact plug may have a width substantially larger than that of the metal oxide pattern 60. The conductive structure may determine a resistance because the resistances of the metal oxide pattern 60 and the metal pattern 58b may be adjusted by controlling the thicknesses and widths thereof.

Figure 6:
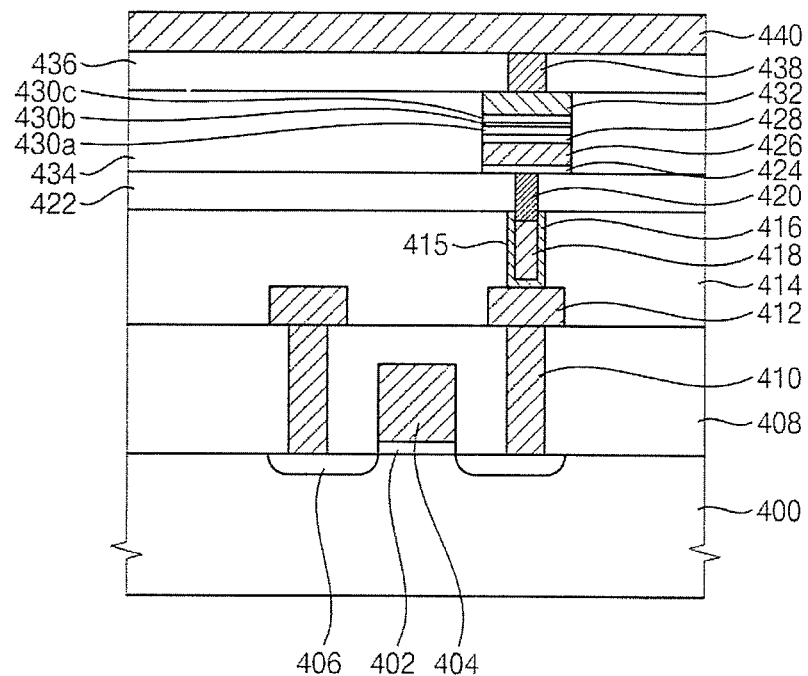
FIG. 6 is a cross sectional view illustrating a magnetic memory device in accordance with an exemplary embodiment of the inventive concept.

FIG. 6 is a cross sectional view illustrating a magnetic memory device in accordance with an exemplary embodiment of the inventive concept. The magnetic memory device illustrated in FIG. 6 may include a conductive structure according to an exemplary embodiment of the inventive concept. For example, the magnetic device may include a conductive structure having a configuration substantially the same as that of the conductive structure described with reference to FIG. 1.

Referring to FIG. 6, a metal oxide semiconductor (MOS) transistor is provided on a semiconductor substrate 400. The MOS transistor may select at least one unit cell of the magnetic memory device. The MOS transistor may include a gate insulation layer 402, a gate electrode 404 and an impurity region 406. The gate electrode 404 may serve as a word line of the magnetic memory device. In an exemplary embodiment, the gate electrode 404 may extend along a first direction.

A current may be provided into a magnetic tunnel junction (MTJ) structure in a spin transfer torque magnetic memory device along both directions relative to the magnetic memory device. Thus, the MOS transistor may be employed in a magnetic memory device as a switching element.

A first insulating interlayer 408 is formed on the semiconductor substrate 400 to cover the MOS transistor. The first insulating interlayer 408 may include oxide such as, for example, silicon oxide. A contact plug 410 is formed through the first insulating interlayer 408. The contact plug 410 electrically contacts the impurity region 406.

A conductive pattern 412 is disposed on the contact plug 410. The conductive pattern 412 may extend along the first direction. The conductive pattern 412 may have a line shape. The conductive line 412 may include metal such as, for example, tungsten.

A second insulating interlayer 414 is formed on the first insulating interlayer 408 to cover the conductive pattern 412. The second insulating interlayer 414 may include oxide such as, for example, silicon oxide. An opening 415 is formed through the second insulating interlayer 414. The opening 415 partially exposes the conductive pattern 412. The opening 415 may have a shape of a contact hole. In an exemplary embodiment, a plurality of openings may be provided periodically in a cell area of the magnetic memory device. In an exemplary embodiment, one opening may correspond to one unit cell of the magnetic memory device.

A first barrier metal layer pattern 416 is formed on a bottom and a sidewall of the opening 415. A metal pattern 418 is positioned on the first barrier metal layer pattern 416. The metal pattern 418 may include tungsten. The metal pattern 418 may partially fill up the opening 415.

A metal oxide pattern 420 is disposed on the metal pattern 418. The metal oxide pattern 420 may be protruded from the opening 415. The metal oxide pattern 420 may be obtained by oxidizing the metal pattern 418. When the metal pattern 418 includes tungsten, the metal oxide pattern 420 may include tungsten oxide.

In an exemplary embodiment, the metal pattern 418 may have a width substantially the same as a width of the metal oxide pattern 420. For example, the first barrier metal layer pattern 416, the metal pattern 418 and the metal oxide pattern 420 may correspond to the barrier metal layer pattern 56a, the metal pattern 58b and the metal oxide pattern 60 described with reference to FIG. 1.

In the conductive structure, the metal pattern 418 and the first barrier metal layer pattern 416 serve as a lower electrode contact of the magnetic memory device. The metal oxide pattern 420 having a high resistance may function as a heating electrode for heating a free layer pattern in a magnetic tunnel junction structure of the magnetic memory device.

A third insulating interlayer 422 is formed on the second insulating interlayer 414. The third insulating interlayer 422 may fill up a gap between adjacent metal oxide patterns 420. The third insulating interlayer 422 may include a material having a dense structure and good step coverage. For example, the third insulating interlayer 422 may include silicon oxide obtained by, for example, an HDP-CVD process or an ALD process. Thus, the third insulating interlayer 422 may be conformally formed along a profile of the metal oxide pattern 420.

In an exemplary embodiment, upper surfaces of the third insulating interlayer 422 and the metal oxide pattern 420 may be positioned on a substantially same plane. An upper surface of the first barrier metal layer pattern 416 is covered with the third insulating interlayer 422, so the first barrier metal layer pattern 416 may not be exposed.

The magnetic tunnel junction structure is disposed on the third insulating interlayer 422. The magnetic tunnel junction structure may have a sandwich-shaped multi layer structure which ensures the tunneling of electrons through a very thin tunnel oxide layer interposed between two ferromagnetic layers when signals are applied to the magnetic tunnel junction structure. The magnetic tunnel junction structure includes a free layer pattern 426, a tunnel oxide layer pattern 428 and pinned layer patterns 430a, 430b, 430c and 432. The pinned layer patterns 430a, 430b, 430c and 432 may include spins having a magnetization direction substantially the same as a magnetization direction of magnetic polarization pinned in the two ferromagnetic layers.

In the magnetic tunnel junction structure, at least a portion of bottom of the free layer pattern 426 may contact the upper surface of the metal oxide pattern 420. The magnetic tunnel junction structure may include the free layer pattern 426, the tunnel oxide layer pattern 428 and the pinned layer patterns 430a, 430b, 430c and 432 according to an exemplary embodiment of the inventive concept.

In an exemplary embodiment, the free layer pattern 426 may include a metal compound such as, for example, cobalt-iron-boron (Co—Fe—B).

A second barrier metal layer pattern 424 is formed between the third insulating interlayer 422 and the free layer pattern 426. The second barrier metal layer pattern 424 may prevent an abnormal growth of metal included in the free layer pattern 426. The second barrier metal layer pattern 424 may include at least one of metal or metal compound. The second barrier metal layer pattern 424 may include, for example, tantalum, titanium, tantalum nitride, or titanium nitride.

The tunnel oxide layer pattern 428 may include metal oxide such as, for example, magnesium oxide (MgOx). The pinned layer patterns 430a, 430b, 430c and 432 may have a stacked structure that includes first pinned layer patterns 430a, 430b and 430c and a second pinned layer pattern 432. The first pinned layer patterns 430a, 430b and 430c may directly contact the tunnel oxide layer pattern 428.

In an exemplary embodiment, the first pinned layer patterns 430a, 430b and 430c are divided into a lower ferromagnetic layer pattern 430a, an anti-ferromagnetic coupling spacer 430b and an upper ferromagnetic layer pattern 430c. The first pinned layer patterns 430a, 430b and 430c may have a synthetic anti-ferromagnetic layer structure. The lower ferromagnetic layer pattern 430a may include cobalt-iron-boron (Co—Fe—B), and the upper ferromagnetic layer pattern 430c may include cobalt-iron (Co—Fe). The anti-ferromagnetic coupling spacer 430a may include metal, for example, ruthenium (Ru). The second pinned layer patterns 432 may include platinum-manganese (Pt—Mn).

In the magnetic tunnel junction structure, the bottom of the free layer pattern 426 is disposed on the metal oxide pattern 420. The metal oxide pattern 420 may further serve as a heating layer pattern for heating the free layer pattern 426. The metal oxide pattern 420 has a width substantially smaller than that of the opening 415 formed through the first insulating interlayer 408, such that the metal oxide pattern 420 may have a high resistance for more effectively heating the free layer pattern 426.

A magnetic tunnel junction structure may have deteriorated characteristics caused by Neel coupling phenomenon when the magnetic tunnel junction structure is provided on a layer having a poor roughness such as a layer having a rugged surface. However, the magnetic memory device according to exemplary embodiments is disposed on the metal oxide pattern 420 having an excellent roughness, so that the magnetic memory device may ensure good operation characteristics.

When the free layer pattern 426 has a high temperature, the free layer pattern 426 may have a reduced coercive force when data is stored in the magnetic memory device. A spin transfer torque magnetic random access memory (SIT-MRAM) may have decreased power consumption by reducing writing current or critical current thereof when the free layer pattern 426 has the high temperature. In an exemplary embodiment, a hard mask pattern may be disposed on the magnetic tunnel junction structure.

A fourth insulating interlayer 434 is disposed on the third insulating interlayer 422 to fill up a gap between adjacent magnetic tunnel junction structures. A fifth insulating interlayer 436 is disposed on the fourth insulating interlayer 434. The fourth insulating interlayer 434 and the fifth insulating interlayer 436 may include, for example, oxides.

An upper electrode 438 is located in the fifth insulating interlayer 436. The upper electrode 438 may pass through the fifth insulating interlayer 436 and may contact an upper most pinned layer pattern of the magnetic tunnel junction structure. The upper electrode 438 may include a material having a small resistance such as, for example, tungsten.

A bit line 440 is formed on the fifth insulating interlayer 436. The bit line 440 may be electrically connected to the upper electrode 438. The bit line 440 may extend along a second direction substantially perpendicular to the first direction where the word line extends.

Hereinafter, a process for storing data into the magnetic memory device according to an exemplary embodiment is described.

Referring to FIG. 6, a word line signal is applied to the gate electrode 404 of the transistor, and a bit line writing signal is simultaneously applied to the bit line 440. The word line signal may correspond to a voltage pulse signal that has a word line voltage substantially larger than a threshold voltage of the transistor during a predetermined period. Thus, the transistor electrically connected to the word line is turned on while applying the word line voltage to the transistor. The bit line signal may be a current pulse signal that applies a current to the bit line 440 while applying the word line signal to the transistor. As a result, writing current may flow through the magnetic tunnel junction structure and the transistor electrically connected to the magnetic tunnel junction structure in serial.

The writing current may include a first writing current or a second writing current. The first writing current may flow from the free layer pattern 426 toward the second pinned layer pattern 432. The second writing current may flow from the second pinned layer pattern 432 toward the free layer pattern 426. In an exemplary embodiment, the first writing current may flow in the magnetic tunnel junction structure along a positive direction of a Y axis whereas the second writing current may flow along a negative direction of the Y axis. That is, electrons may move along the negative direction of the Y axis while the first writing current flows in the magnetic tunnel junction structure. The electrons may move in the positive direction of the Y axis while the second writing current flows in the magnetic tunnel junction structure.

When the first writing current flows through the magnetic tunnel junction structure, the electrons may be injected into the free layer pattern 426. The electrons may include up-spin electrons and down-spin electrons. When most of the magnetic polarizations fixed in the second pinned layer pattern 432 have up spin states, only the up-spin electrons injected in the free layer pattern 426 may flow the tunnel oxide layer pattern 428, and then may reach the second pinned layer pattern 432. The down-spin electrons injected into the free layer pattern 426 may be accumulated in the free layer pattern 426.

The number of the up-spin and down-spin electrons injected into the free layer pattern 426 may be proportional to the density of the first writing current. When the density of the first writing current increases, the free layer pattern 426 may have a plurality of majority magnetic polarizations reversely parallel relative to that of the magnetization polarization of the second pinned layer pattern 426 by the down-spin electrons accumulated in the free layer pattern 426 without reference to the initial polarization of the free layer pattern 426. As a result, the magnetic tunnel junction structure may be switched to have a maximum resistance when the density of the first writing current is larger than a first critical current density. As the first writing is provided to the magnetic tunnel junction structure, the metal oxide pattern 420 may heat the free layer pattern 426 to reduce the coercive force formed on the free layer pattern 426 and the first critical current density. Therefore, the magnetic memory device may have minimized power consumption while decreasing the first writing current.

Most of the electrons passing through the second pinned layer pattern 432 may have spins indicating a magnetization direction substantially the same as that of the fixed magnetic polarizations of the second pinned layer pattern 432 when the second writing current flows through the magnetic tunnel junction structure. For example, most of the electrons passing through the second pinned layer pattern 432 may have up spin states when a plurality of majority magnetic polarizations in the second pinned layer pattern 432 have up-spin states. For example, most of the electrons may have spins denoting a direction substantially the same as that of the upper ferromagnetic layer pattern 430a in the synthetic anti-ferromagnetic layer structure.

The up-spin electrons may pass through the tunnel oxide layer pattern 428 and may reach the free layer pattern 426. The number of the up-spin electrons reached to the free layer pattern 426 may be proportional to the density of the second writing current. When the density of the second writing current increases, the free layer pattern 426 may have a plurality of magnetic polarizations substantially parallel relative to that of the fixed magnetization polarizations of the second pinned layer pattern 426 without reference to the initial polarization of the free layer pattern 426. This results from the up-spin electrons injected into the free layer pattern 426. As a result, the magnetic tunnel junction structure may be switched to have a low resistance when the density of the second writing current is larger than a second critical current density. As the second writing is provided to the magnetic tunnel junction structure, the metal oxide pattern 420 may heat the free layer pattern 426 to reduce the coercive force formed on the free layer pattern 426 and the second critical current density. Hence, the magnetic memory device may have minimized power consumption while decreasing the second writing current.

FIGS. 7 to 10 are cross sectional views illustrating a method of manufacturing a magnetic memory device according to an exemplary embodiment of the inventive concept.

Figure 7:
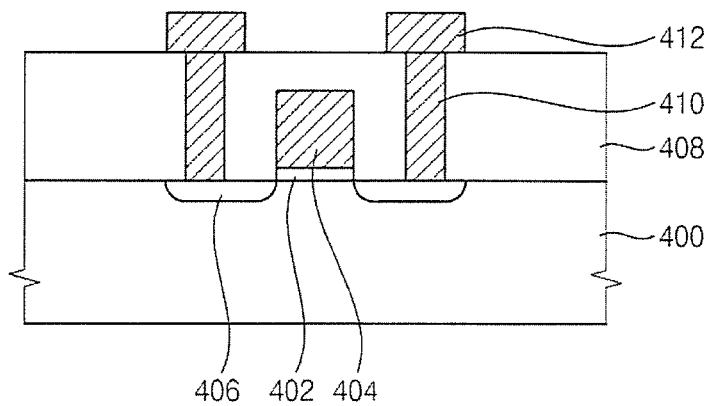
FIGS. 7 to 10 are cross sectional views illustrating a method of manufacturing the magnetic memory device in FIG. 6.

Referring to FIG. 7, a MOS transistor for selecting a desired unit cell of the magnetic memory device is formed on a semiconductor substrate 400.

In forming the MOS transistor, a gate insulation layer 402 and a gate electrode layer are formed on the semiconductor substrate 400. Then, the gate electrode layer is etched to form a gate electrode 404 on the gate insulation layer 402. An impurity region 406 is formed at a portion of the semiconductor substrate 400 adjacent to the gate electrode 404. The gate electrode 404 may serve as a word line of the magnetic memory device. The gate electrode 404 may have a line shape that extends along a first direction.

A first insulating interlayer 408 is formed on the semiconductor substrate 400 to cover the MOS transistor. A contact plug 410 is formed through the first insulating interlayer 408. The contact plug 410 contacts the impurity region 406. A conductive pattern 412 is formed on the contact plug 410 and the first insulating interlayer 408. The conductive pattern 412 may be electrically connected to the impurity region 406 through the contact plug 410. Each of the contact plug 410 and the conductive structure may comprise metal having a low resistance.

In forming the contact plug 410 and the conductive pattern 412, the first insulating interlayer 408 may be partially etched to form a contact hole there through. The contact hole may be formed by, for example, a photolithography process. A conductive layer may be formed on the first insulating interlayer 408 to fill up the contact hole. The conductive layer may be patterned to form the contact plug 410 and the conductive pattern 412. In an exemplary embodiment, the contact plug 410 may be formed in the contact hole. The conductive pattern 412 may be formed on the contact plug 410 and the first insulating interlayer 408 by forming an additional conductive layer on the contact plug 410 and the first insulating interlayer 408. The additional conductive layer can be patterned subsequently. In an exemplary embodiment, the contact plug 410 and the conductive pattern 412 may be formed by a damascene process.

Figure 8:
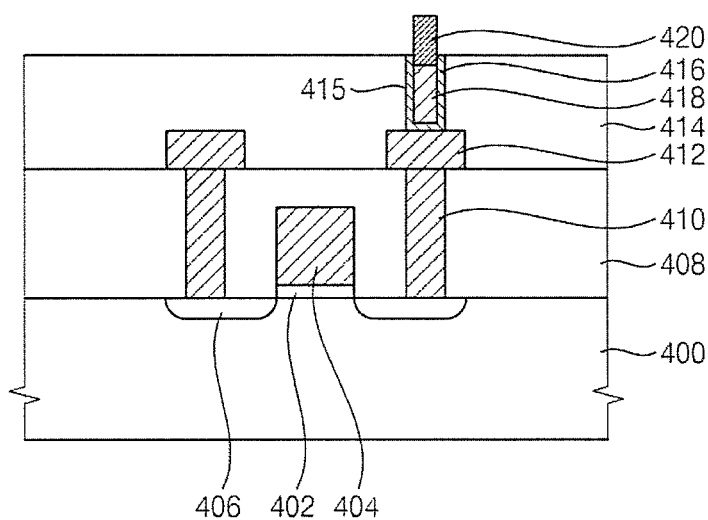

Referring to FIG. 8, a second insulating interlayer 414 is formed on the first insulating interlayer 408 to cover the conductive pattern 412. The second insulating interlayer 414 is partially etched to form an opening 415 that at least partially exposes the conductive pattern 412. The opening 415 may be obtained by, for example, a photolithography process. The opening 415 may have a shape of a contact hole.

A conductive structure is formed to fill up the opening 415 through processes substantially the same as the processes described with reference to FIGS. 3 to 5. The conductive structure may be protruded from the opening 415. The conductive structure includes a first barrier metal layer pattern 416, a metal pattern 418 and a metal oxide pattern 420. The first barrier metal layer pattern 416 is formed on a bottom and a sidewall of the opening 415, and the metal pattern 418 is formed on the first barrier metal layer pattern 416. The metal pattern 418 partially fills up the opening 415. The metal oxide pattern 420 is protruded from the opening 415. The metal pattern 418 and the metal oxide pattern 420 may comprise tungsten and tungsten oxide, respectively. In an exemplary embodiment, the first barrier metal layer pattern 416 and the metal pattern 418 may serve as a lower electrode of the magnetic memory device and the metal oxide pattern 420 may function as a heating electrode of the magnetic memory device.

Figure 9:
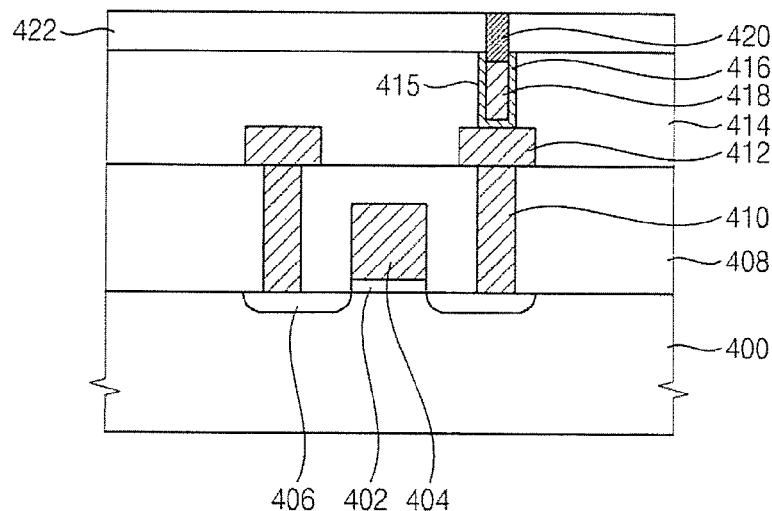

Referring to FIG. 9, a third insulating interlayer 422 covering the metal oxide pattern 420 is formed on the second insulating interlayer 414. Then, the third insulating interlayer 422 is partially removed until the metal oxide pattern 420 is exposed. The third insulating interlayer 422 may be partially removed by a CMP process.

The third insulating interlayer 422 may be formed using a material having a dense structure and excellent step coverage. For example, the third insulating interlayer 422 may be formed using silicon oxide by, for example, an HDP-CVD process or an ALD process. Thus, the third insulating interlayer 422 may be uniformly formed along a profile of the conductive structure. When the third insulating interlayer 422 has a dense structure, the third insulating interlayer 422 and the metal oxide pattern 420 may have uniform surfaces without rugged surfaces after performing the CMP process for partially removing the third insulating interlayer 422.

Figure 10:
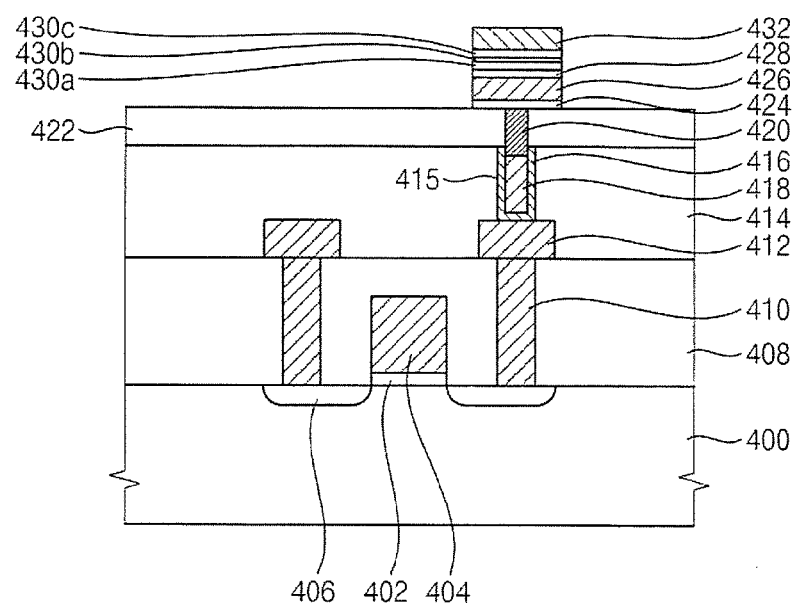

Referring to FIG. 10, a plurality of layers for a magnetic tunnel junction structure is sequentially formed on the third insulating interlayer 422 and the metal oxide pattern 420. In an exemplary embodiment, a second barrier metal layer, a free layer, a tunnel oxide layer, a first pinned layer and a second pinned layer may be successively formed for the magnetic tunnel junction structure. The first pinned layer may include a lower ferromagnetic layer, an anti-ferromagnetic coupling spacer layer, an upper ferromagnetic layer. The second barrier metal layer may prevent the abnormal growth of metal included in the free layer. The second barrier layer may be formed using amorphous metal. For example, the second barrier layer may include tantalum, titanium, tantalum nitride, or titanium nitride. The free layer may comprise cobalt-iron-boron, and the tunnel oxide layer may comprise magnesium oxide. As for the first pinned layer, the lower ferromagnetic layer, the upper ferromagnetic layer and the anti-ferromagnetic coupling spacer layer may comprise cobalt-iron-boron, cobalt-iron and ruthenium, respectively. The second pinned layer may comprise platinum-manganese.

The plurality of layers for the magnetic tunnel junction structure are sequentially patterned, so that a second barrier metal layer pattern 424, a free layer pattern 426, a tunnel oxide layer pattern 428, first pinned layer patterns 430a, 430b and 430c, and a second pinned layer pattern 432 are formed. That is, the magnetic tunnel junction structure includes the second barrier metal layer pattern 424, the free layer pattern 426, the tunnel oxide layer pattern 428, the first pinned layer patterns 430a, 430b and 430c, and the second pinned layer pattern 432. The magnetic tunnel junction structure may contact the metal oxide pattern 420. The magnetic tunnel junction structure may have an island shape. In an exemplary embodiment, a hard mask pattern may be formed on the magnetic tunnel junction structure. The hard mask pattern may serve as an etching mask for forming the magnetic tunnel junction structure.

Referring to FIG. 6, the fourth insulating interlayer 434 is formed on the third insulating interlayer 422 to cover the magnetic tunnel junction structure. The fourth insulating interlayer 434 may sufficiently fill up the gap adjacent magnetic tunnel junction structures. The fifth insulating interlayer 436 is formed on the fourth insulating interlayer 434.

A second contact hole is formed through the fifth insulating interlayer 436 by partially etching the fifth insulating interlayer 436. The second opening partially exposes the magnetic tunnel junction structures. That is, the second pinned layer pattern 432 is exposed through the second opening.

A conductive material is formed on the fifth insulating interlayer 436 to fill up the second opening, and then the conductive material is partially removed until the fifth insulating interlayer 436 is exposed. Hence, the upper electrode 438 is formed in the second opening. The conductive material may include tungsten, and the upper electrode 438 may be formed by a CMP process.

A conductive layer is formed on the fifth insulating interlayer 436 and the upper electrode 438. The conductive layer is patterned to form the bit line 440. The bit line 440 may be obtained by a photolithography process.

As described above, the conductive structure may have the metal oxide pattern 420 including tungsten oxide by simplified processes. The metal oxide pattern 420 may have the high resistance and the small width, so that the metal oxide pattern 420 may be used as the heating electrode of the magnetic memory device. The magnetic memory device may ensure low coercive force when the magnetic memory device includes the metal oxide pattern 420 of tungsten oxide.

Figure 11:
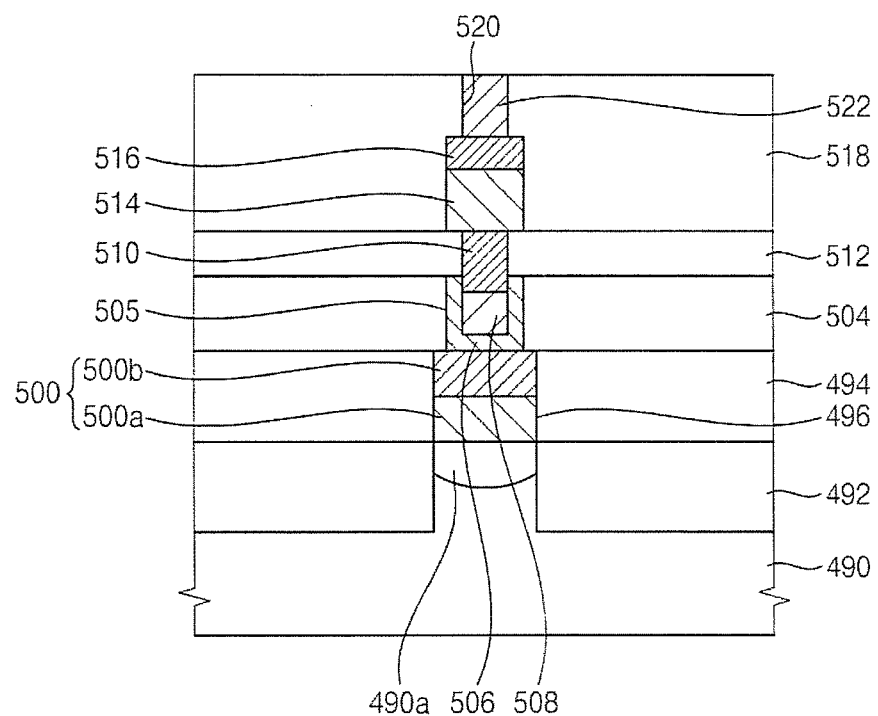
FIG. 11 is a cross sectional view illustrating a phase change memory device in accordance with an exemplary embodiment of the inventive concept.

FIG. 11 is a cross sectional view illustrating a phase change memory device in accordance with an exemplary embodiment of the inventive concept. The phase change memory device illustrated in FIG. 11 may include a conductive structure having a construction substantially the same as that of the conductive structure described with reference to FIG. 1.

Referring to FIG. 11, a substrate 490 including an isolation region and an active region is prepared. An impurity region 490a is formed in the active are of the substrate 490. The impurity region 490a may include N type impurities such as, for example, phosphorus (P) or arsenic (As). A trench for isolating elements is provided in the isolation region of the substrate 490, and an isolation layer pattern 492 is formed in the trench.

A first insulating interlayer 494 is formed on the substrate 490. A first opening 496 is formed through the first insulating interlayer 494 to expose the impurity region 490a. A P-N junction diode 500 is disposed in the first opening 496. The P-N diode 500 may substantially fill up the first opening 496. The P-N diode 500 may electrically contact the impurity region 490a.

In an exemplary embodiment, the P-N diode 500 includes a first polysilicon layer pattern 500a and a second polysilicon layer pattern 500b. The first polysilicon layer pattern 500a may be doped with N type impurities whereas P type impurities may be doped in the second polysilicon layer pattern 500b. A metal silicide pattern may be disposed on the P-N diode 500 to reduce an interface resistance between the P-N diode 500 and a conductive structure.

A second insulating interlayer 504 is formed on the first insulating interlayer 494 and the P-N diode 500. The second insulating interlayer 504 may have a second opening 505 that partially exposes the P-N diode 500. The second opening 505 may have a shape of a contact hole.

The conductive structure is located in the second opening 505. The conductive structure may have a configuration substantially the same as that of the contact structure described with reference to FIG. 1. The conductive structure includes a barrier metal layer pattern 506, a metal pattern 508 and a metal oxide pattern 510. The metal pattern 508 and the metal oxide pattern 510 may include, for example, tungsten and tungsten oxide, respectively. The conductive structure may serve as a lower electrode of a memory cell in the phase change memory device. The metal oxide pattern 510 of the conductive structure may heat a phase change material layer pattern 514 because the metal oxide pattern 510 of tungsten oxide may have a high resistance. For example, the metal oxide pattern 510 has a higher resistance than that of the metal pattern 508. For example, the metal oxide pattern 510 has a higher resistance than that of the combination of the metal pattern 508 and the barrier metal layer pattern 506.

A third insulating interlayer 512 is formed on the second insulating interlayer 504. The metal oxide pattern 510 of the conductive structure may be protruded from the second insulating layer 504 and may be buried in the third insulating interlayer 512. Hence, the third insulating interlayer 512 may fill a gap between adjacent metal oxide patterns 510.

In an exemplary embodiment, the third insulating interlayer 512 may include a material that has a dense structure and a good step coverage, so that the third insulating interlayer 512 may be conformally formed on the second insulating interlayer 504 along a profile of the metal oxide pattern 510 while sufficiently insulating adjacent metal oxide patterns 510. For example, the third insulating interlayer 512 may include silicon oxide obtained by a high density plasma-chemical vapor deposition (HDP-CVD) process, or silicon oxide formed by an atomic layer deposition (ALD) process. The third insulating interlayer 512 may have a height substantially the same as that of the metal oxide pattern 510. In an exemplary embodiment, upper faces of the third insulating interlayer 512 and the metal oxide pattern 510 may be positioned on the substantially same plane.

The phase change structure 514 is disposed on the metal oxide pattern 510 of the conductive structure. When the metal oxide pattern 510 has a width substantially smaller than a critical dimension of a photolithography process, a contact area between the phase change structure 514 and the conductive structure may be reduced. Therefore, a phase transition reaction may easily occur in the phase change structure 514 by the Joule heating mechanism.

In an exemplary embodiment, the phase change structure 514 may include a chalcogenide compound of which crystalline structure is reversibly changed between an amorphous state and a crystalline state. When the chalcogenide compound has the crystalline structure, the chalcogenide compound may have a high optical reflectivity and a low electrical resistance. The chalcogenide compound may have a low optical reflectivity and a high electrical resistance when the chalcogenide compound has the amorphous structure. The phase change structure 514 may be formed using a chalcogenide compound including an alloy of germanium (Ge)-antimony (Sb)-tellurium (Te).

An upper electrode 516 is disposed on the phase change material layer pattern 514. The upper electrode 516 may include metal nitride such as, for example, titanium nitride.

A fourth insulating interlayer 518 is formed on the third insulating interlayer 512 to cover the upper electrode 516. That is, the upper electrode 516 and the phase change structure 514 may be buried in the fourth insulating interlayer 518.

A contact hole is provided in the fourth insulating interlayer 518. The contact hole may partially expose the upper electrode 516. An upper contact 522 is formed in the contact hole, so that the upper contact 522 may contact the upper electrode 516. The upper contact 522 may include metal such as, for example, tungsten.

In a phase change memory device according to an exemplary embodiment, a conductive structure may include a metal oxide pattern contacting a phase change structure. Since the metal oxide pattern of tungsten oxide may have a high resistance and a small width, the phase change structure may have improved Joule heating effect, and the phase change memory device may ensure a reduced reset current. In an exemplary embodiment, the phase change memory device may have apparently distinct set and reset states because the phase change structure may have reduced resistance distributions of the set and the reset states.

Figure 12:
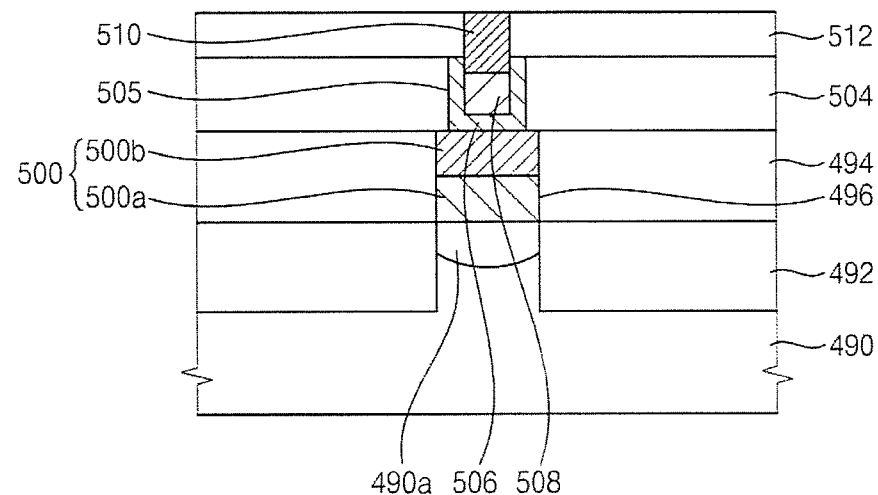
FIG. 12 is a cross sectional view illustrating a method of manufacturing the phase change memory device in FIG. 11.

FIG. 12 is a cross sectional view illustrating a method of manufacturing the phase change memory device according to an exemplary embodiment of the present invention.

Referring to FIG. 12, an impurity region 490a is formed at a predetermined portion of a substrate 490 by doping impurities into the predetermined portion of the substrate 490. The impurity region 490a may be formed by an ion implantation process.

A trench for isolating elements is formed on the substrate 490 by partially etching the substrate 490. The trench may extend along a first direction. An isolation layer is formed on the substrate 490 to fill up the trench, and then the isolation layer is partially removed to form an isolation layer pattern 492 in the trench. The isolation layer pattern 492 may comprise, for example, oxide.

A first insulating interlayer 494 is formed on the substrate 490 having the isolation layer pattern 492. The first insulating interlayer 494 may comprise oxide, for example, silicon oxide. The first insulating interlayer 494 is partially etched to form a first opening 496 that partially exposing the impurity region 490a.

A silicon layer filling the first opening 496 is formed on the first insulating interlayer 494. The silicon layer is partially removed until the first insulating interlayer 494 is exposed. Thus, a silicon layer pattern is formed on the impurity region 490a in the first opening 496.

P type impurities may be doped into an upper portion of the silicon layer pattern whereas N type impurities may be implanted into a lower portion of the silicon layer pattern. Thus, a P-N diode 500 is formed on the impurity region 490a in the first opening 496. The P-N diode 500 includes a first silicon layer pattern 500a and a second silicon layer pattern 500b. The first and the second silicon layer patterns 500a and 500b may include the N type and the P type impurities, respectively.

In an exemplary embodiment, a metal silicide pattern may be additionally formed on the P-N diode 500.

A second insulating interlayer 504 is formed on the P-N diode 500 and the first insulating interlayer 494. The second insulating interlayer 504 may comprise oxide such as, for example, silicon oxide. The second insulating interlayer 504 is partially etched to thereby form a second opening 505 exposing a portion of the P-N diode 500.

A conductive structure is formed on the P-N diode 500. The conductive structure may be formed by processes substantially the same as those described with reference to FIGS. 3 to 5. The conductive structure fills up the second opening 505 and is protruded from the second opening 505.

The conductive structure includes a barrier metal layer pattern 506, a metal pattern 508 and a metal oxide pattern 510. The barrier metal layer pattern 505 is formed on a bottom and a sidewall of the second opening 505. The metal pattern 508 is located on the barrier metal layer pattern 505. The metal pattern 508 may partially fill up the second opening 505. The metal pattern 508 may comprise tungsten. The metal oxide pattern 510 is positioned on the metal pattern 508 to completely fill up the second opening 505. The metal oxide pattern 510 may comprise tungsten oxide. The metal oxide pattern 510 is protruded from the second opening 505. The metal oxide pattern 510 has a width substantially smaller than a width of the second opening 505 because the metal oxide pattern 512 is formed in the second opening 505 by interposing the barrier metal layer pattern 505 therebetween.

A third insulating interlayer 512 covering the metal oxide pattern 510 is formed on the second insulating interlayer 504. The third insulating interlayer 512 may comprise a material having a dense structure and excellent step coverage. For example, the third insulating interlayer 512 may comprise silicon oxide by an HDP-CVD process or an ALD process. The third insulating interlayer 512 is partially removed until the metal oxide pattern 510 is exposed. The third insulating interlayer 512 may be partially removed by a CMP process and/or an etch-back process.

Referring to FIG. 11, a phase change material layer is formed on the third insulating interlayer 512. The phase change material layer may comprise a chalcogenide compound, for example, germanium-antimony-tellurium.

An upper electrode layer is formed on the phase change material layer. The upper electrode layer may comprise metal nitride such as, for example, titanium nitride. The upper electrode layer and the phase change material layer are patterned to form an upper electrode 516 and a phase change structure 514. The upper electrode 516 and the phase change structure 514 may be formed by a photolithography process.

The fourth insulating interlayer 518 is formed on the third insulating interlayer 512 to cover the upper electrode 516 and the phase change structure 514. The fourth insulating interlayer 518 is partially etched to form a contact hole 520 at least partially exposing the upper electrode 516.

A conductive material is deposited to fill up the contact hole 520, so that an upper electrode contact 522 is formed on the upper electrode 516. The upper electrode contact 522 may comprise metal such as, for example, tungsten, aluminum, titanium, tantalum, copper, or platinum.

According to exemplary embodiments, the metal oxide pattern 510 of tungsten oxide having a high resistance and a small width may be obtained through simplified processes. Such metal oxide pattern 510 may sufficiently serve as an electrode for heating the phase change structure 514. When the phase change memory device includes the metal oxide pattern 510, the phase change memory device may have reduced reset current and decreased resistance distribution, so that data may be easily stored into the phase change memory device and may easily read from the phase change memory device.

Figure 13:
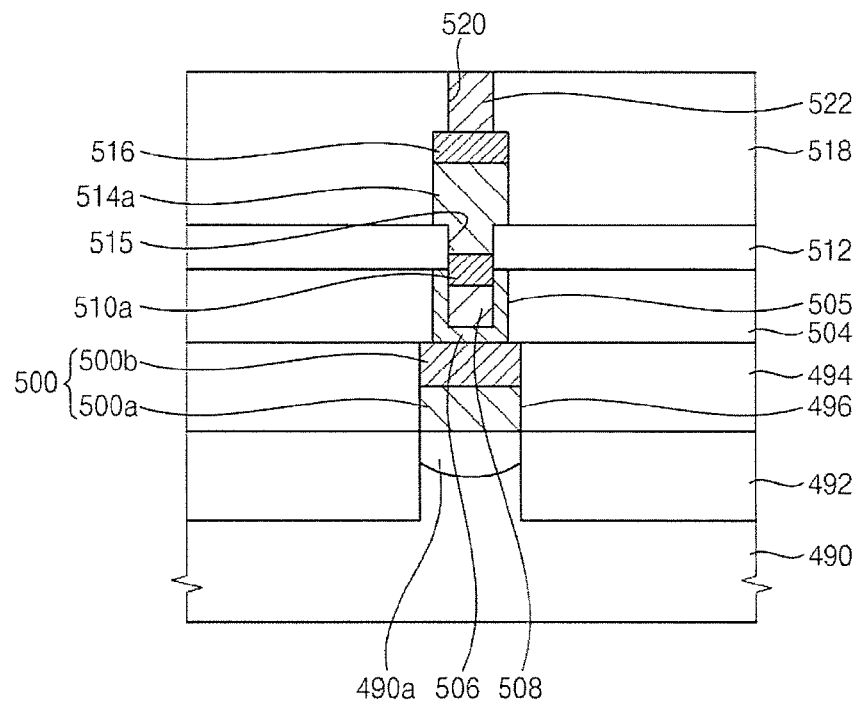
FIG. 13 is a cross sectional view illustrating a phase change memory device in accordance with an exemplary embodiment of the inventive concept.

FIG. 13 is a cross sectional view illustrating a phase change memory device in accordance with an exemplary embodiment of the inventive concept. The phase change memory device illustrated in FIG. 13 includes a conductive structure having a construction substantially the same as that of the conductive structure described with reference to FIG. 1. The phase change memory device in FIG. 13 may have a configuration substantially the same as that of the phase change memory device described with reference to FIG. 11 except for a phase change structure.

Referring to FIG. 13, a first insulating interlayer 494, a P-N diode 500 and a second insulating interlayer 504 are provided on a substrate 490. A second opening 505 exposing the P-N diode 500 is formed through the second insulating interlayer 504. The conductive structure is disposed in the second opening 505. The conductive structure includes a barrier metal layer pattern 506, a metal pattern 508 and metal oxide pattern 510 substantially the same as those described with reference to FIG. 11.

A third insulating interlayer 512 is disposed on the second insulating interlayer 504. The third insulating interlayer 512 covers the conductive structure. The third insulating interlayer 512 may include a material having a dense structure and good step coverage. For example, the third insulating interlayer 512 may include silicon oxide obtained by an HDP-CVD process or an ALD process. The third insulating interlayer 512 may have an upper surface substantially higher than an upper surface of the metal oxide pattern 510.

A third opening 515 exposing the metal oxide pattern 510 is formed through the third insulating interlayer 512. The third opening 515 may have a width substantially the same as a width of the metal oxide pattern 510.

A phase change structure 514a is formed on the metal oxide pattern 510 to fill up the third opening 515. The phase change structure 514a is protruded from the third opening 515. In an exemplary embodiment, the phase change structure 514a may have a lower width in the third opening 515 and an upper width over the third opening 515. The lower width of the phase change structure 514a may be substantially smaller than the upper width thereof. Since the phase change structure 514a contacts the metal oxide pattern 510, a portion of the phase change structure 514a heated by the metal oxide pattern 510 may be confined in the third opening 515.

An upper electrode 516 is positioned on the phase change structure 514a. A fourth insulating interlayer 518 covering the upper electrode 516 and the phase change structure 514a is formed on the third insulating interlayer 512. An upper electrode contact 522 is formed through the fourth insulating interlayer 518. The upper electrode contact 522 is electrically connected to the upper electrode 516.

Figure 14:
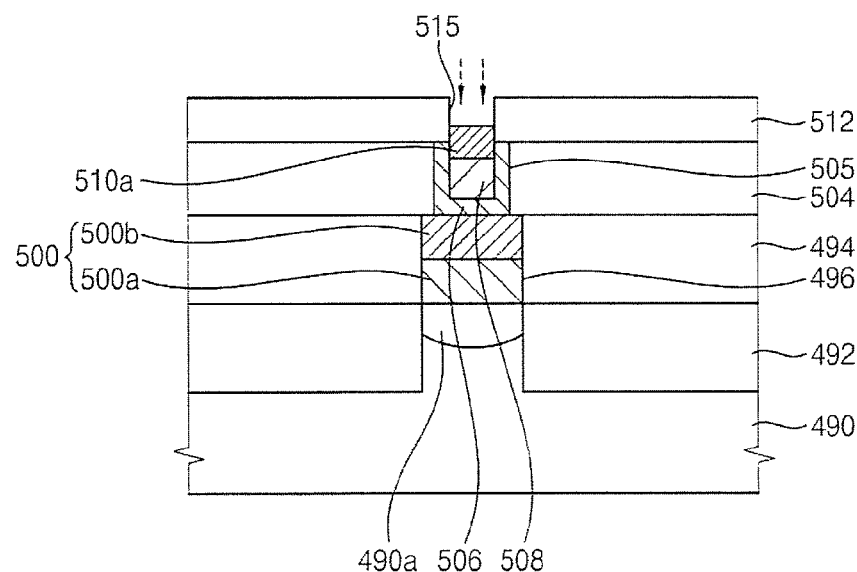
FIG. 14 is a cross sectional view illustrating a method of manufacturing the phase change memory device in FIG. 13.

FIG. 14 is a cross sectional view illustrating a method of manufacturing the phase change memory device according to an exemplary embodiment of the present invention.

Referring to FIG. 12, an isolation layer pattern 492, a first insulating interlayer 494 and a P-N diode 500 are formed on a substrate 490. A second insulating interlayer 504 is formed on the first insulating interlayer 494 and the P-N diode 500. A second opening 505 is formed through the second insulating interlayer 504 by partially etching the second insulating interlayer 504. The second opening 505 at least partially expose the P-N diode 500.

A preliminary conductive structure is formed on the P-N diode 500 through processes substantially the same as those described with reference to FIGS. 3 to 5. The preliminary conductive structure may fill up the second opening 505 and may protrude from the second opening 505. The preliminary conductive structure includes a barrier metal layer pattern 506, a metal pattern 508 and a preliminary metal oxide pattern.

The metal pattern 508 and the preliminary metal oxide pattern may be formed using tungsten and tungsten oxide, respectively. The barrier metal layer pattern 506 is formed on a bottom and a sidewall of the second opening 505. The metal pattern 508 is formed on the barrier metal layer pattern 506 to partially fill the second opening 505. The preliminary metal oxide pattern may be protruded over the second opening 505. The preliminary metal oxide pattern may have a height substantially larger than a height of a metal oxide pattern 510a subsequently formed. For example, the height of the preliminary metal pattern may be substantially the same as a sum of heights the metal oxide pattern 510a and a lower portion of a phase change structure 514a. Here, the lower portion of the phase change structure 514a may have a smaller width as compared to the upper portion of the phase change structure 514a.

A third insulating interlayer 512 is formed on the second insulating interlayer 504 to cover the preliminary conductive structure. The third insulating interlayer 512 may be formed using a material having a dense structure and good step coverage. The third insulating interlayer 512 is partially removed until the preliminary metal oxide pattern is exposed. The third insulating interlayer 512 may be partially removed by a CMP process and/or an etch-back process.

Referring to FIG. 14, the preliminary metal oxide pattern is partially removed to form a metal oxide pattern 510a on the metal pattern 508. Here, the metal oxide pattern 510a may be protruded over the third insulating interlayer 512, so that the barrier metal layer pattern 506 is not exposed after forming the metal oxide pattern 510a.

When the metal oxide pattern 510a is formed on the metal pattern 508, a third opening 515 is formed on the metal oxide pattern 510a. That is, a removed portion of the preliminary metal pattern may correspond to the third opening 515. Thus, the third opening 515 is positioned in the third insulating interlayer 512. The third opening 515 exposes the metal oxide pattern 510a. The third opening 515 may have a width substantially the same as that of the metal oxide pattern 510a.

Referring to FIG. 13, a phase change material layer is formed on the third insulating interlayer 512 to fully fill up the third opening 515. The phase change material layer may comprise a chalcogenide compound such as, for example, an alloy of germanium-antimony-tellurium. An upper electrode layer is formed on the phase change material layer. The upper electrode layer may be formed using metal nitride like titanium nitride.

The upper electrode layer and the phase change material layer are patterned, so that the phase change structure 514a and the upper electrode 516 are sequentially formed on the metal oxide pattern 510a. In an exemplary embodiment, the phase change structure 514a may have the lower portion positioned on the metal oxide pattern 510a in the third opening 515. The phase change structure 514a may have an upper portion being protruded over the third opening 515. The lower portion of the phase change structure 514a may have a width smaller than a width of the upper portion of the phase change structure 514a.

A fourth insulating interlayer 518 covering the upper electrode 516 is formed on the third insulating interlayer 512. An upper electrode contact 522 is formed through the fourth insulating interlayer 518. The upper electrode contact 522 contacts the upper electrode 516.

Figure 15:
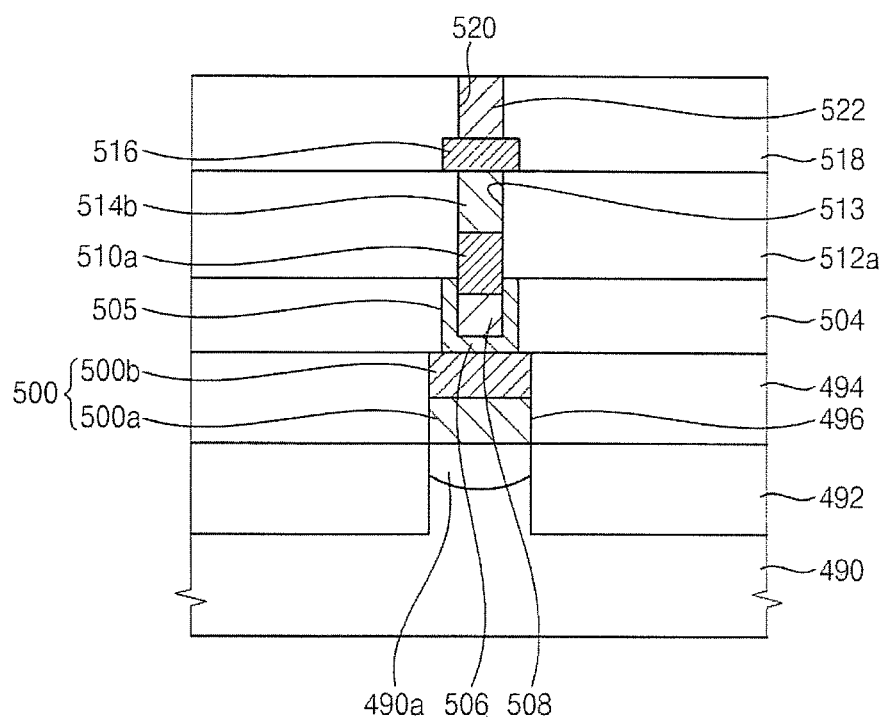
FIG. 15 is a cross sectional view illustrating a phase change memory device in accordance with an exemplary embodiment of the inventive concept.

FIG. 15 is a cross sectional view illustrating a phase change memory device in accordance with an exemplary embodiment of the inventive concept. The phase change memory device illustrated in FIG. 15 includes a conductive structure having a construction substantially the same as that of the conductive structure described with reference to FIG. 1. The phase change memory device in FIG. 15 may have a configuration substantially the same as that of the phase change memory device described with reference to FIG. 13 except for a phase change structure.

Referring to FIG. 15, the conductive structure is positioned in a second opening 505 formed through a second insulating interlayer 504. The conductive structure includes a barrier metal layer pattern 506, a metal pattern 508 and metal oxide pattern 510a.

A third insulating interlayer 512a is located on the second insulating interlayer 504. A third opening 513 is formed through the third insulating interlayer 512a. The third opening 513 at least partially exposes the metal oxide pattern 510a. The third opening 513 may have a width substantially the same as a width of the metal oxide pattern 510a.

A phase change structure 514a is disposed on the metal oxide pattern 510a in the third opening 513. The phase change structure 514a is positioned in the third opening 515 and is not protruded over the third opening 513. That is, the phase change structure 514a may have width substantially the same as a depth of the third opening 513.

An upper electrode 516 is disposed on the phase change structure 514a and the third insulating interlayer 512a. A fourth insulating interlayer 518 covering the upper electrode 516 and the phase change structure 514a is formed on the third insulating interlayer 512a. An upper electrode contact 522 is formed through the fourth insulating interlayer 518. The upper electrode contact 522 may be electrically connected to the upper electrode 516.

The phase change memory device illustrated in FIG. 15 may be manufactured by the following processes.

The resultant structure having a construction substantially the same as that illustrated in FIG. 14 through processes described with reference to FIG. 14.

Referring to FIG. 15, a phase change material layer is formed on the third insulating interlayer 512a to completely fill up the third opening 513. The phase change material layer is partially removed until the third insulating interlayer 513a is exposed. Hence, a phase change structure 514a is formed in the third opening 513. The phase change structure 514a may be formed by, for example, a CMP process.

An upper electrode layer is formed on the phase change structure 514a and the third insulating interlayer 512a. Then, the upper electrode layer is patterned to form an upper electrode 516 on the phase change structure 514a.

A fourth insulating interlayer 518 is formed on the third insulating interlayer 512a to cover the upper electrode 516 and the phase change material structure 514a. An upper electrode contact 522 is formed through the fourth insulating interlayer 518 to be electrically connected to the upper electrode 516.

Figure 16:
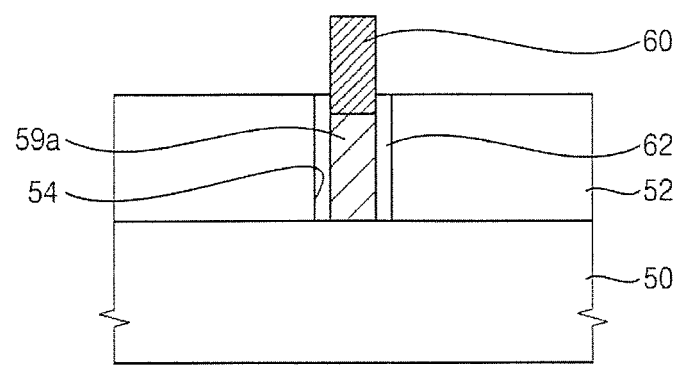
FIG. 16 is a cross sectional view illustrating a conductive structure in accordance with an exemplary embodiment of the inventive concept.

FIG. 16 is a cross sectional view illustrating a conductive structure in accordance with an exemplary embodiment of the inventive concept.

Referring to FIG. 16, an insulating interlayer 52 is provided on a substrate 50. The insulating interlayer 52 includes an opening 54 that exposes a portion of the substrate 50.

A spacer 62 is disposed on a sidewall of the opening 54. The spacer 62 may include nitride such as silicon nitride or an oxynitride like silicon oxynitride. The spacer 62 may prevent metal atoms and/or metal ions included in a metal pattern 59a from diffusing into the insulating interlayer 52. In an exemplary embodiment, a barrier metal layer may not be provided on the sidewall of the opening 54. In an exemplary embodiment, a barrier metal layer may be disposed on the spacer 62 and the substrate 50 in the opening 54.

A metal pattern 59a is disposed in the opening 54. The metal pattern 59a may partially fill up the opening 54. The metal opening 59a may include tungsten. A metal oxide pattern 60 is positioned on the metal pattern 59a in the opening 54. The metal oxide pattern 60 may include tungsten oxide. The metal oxide pattern 60 may have a width substantially narrower than a width of the opening 54. The metal oxide pattern 60 may be caused by the metal pattern 59a. For example, the metal pattern 59a may be oxidized to form the metal oxide pattern 60. The metal oxide pattern 60 may be protruded over the opening 54.

In an exemplary embodiment, the metal oxide pattern 60 may have a width substantially smaller than the CD of the photolithography process. The width of the metal oxide pattern 60 may be controlled by adjusting a thickness of the spacer 62 positioned on the sidewall of the opening 54.

Figure 17:
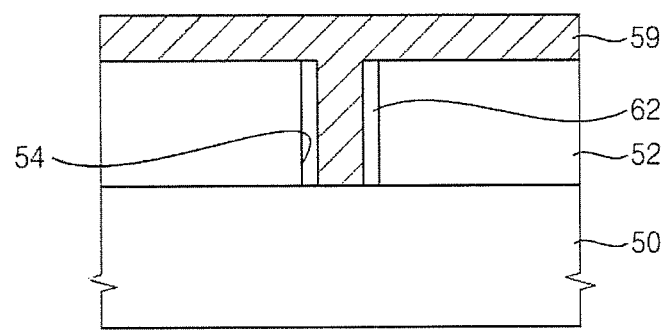
FIG. 17 is a cross sectional view illustrating a method of forming the conductive structure in FIG. 16.

FIG. 17 is a cross sectional view illustrating a method of forming a conductive structure according to an exemplary embodiment of the inventive concept.

Referring to FIG. 17, an insulating interlayer 52 having an opening 54 is formed on a substrate 50. The opening 54 exposes a predetermined portion of the substrate 50, for example, a conductive region.

A spacer formation layer is formed on a bottom of the opening 54, a sidewall of the opening 54 and the insulating interlayer 52. The spacer formation layer may comprise, for example, nitride or oxynitride. For example, the spacer formation layer may comprise silicon nitride or silicon oxynitride. The spacer formation layer is anisotropically etched to form a spacer 62 on the sidewall of the opening 54. When the spacer 62 is formed, the opening 54 may have a width reduced by twice of a thickness of the spacer 62.

A metal layer 59 is formed on the spacer 62, the substrate 50 and the insulating interlayer 52 to fully fill up the opening 54. The metal layer 59 may comprise, for example, tungsten.

Referring to FIGS. 16 and 17, the metal layer 59 is partially removed until the insulating interlayer 52 is exposed, so that a preliminary metal pattern is formed in the opening 54. The preliminary metal pattern may be formed by a CMP process. In an exemplary embodiment, the preliminary metal pattern may have an upper surface substantially higher than upper surfaces of the insulating interlayer 52 and the spacer 62. For example, the upper surface of the preliminary metal pattern may be protruded over the insulating interlayer 52 by a thickness above about 10 Å. Namely, the upper surface of the preliminary metal pattern may be slightly protruded from the upper surface of the insulating interlayer 52.

The preliminary metal pattern is thermally treated under an atmosphere including oxygen, such that a metal oxide pattern 60 is obtained. Here, the metal layer 59 is changed into a metal pattern 59a while oxidizing the preliminary metal pattern. The preliminary metal pattern may be subjected to a process substantially the same as that described with reference to FIG. 5.

Through the above-described processes, the conductive structure illustrated in FIG. 16 may be formed on the substrate 50. In exemplary embodiments, the conductive structure illustrated in FIG. 16 may be employed in the magnetic memory device in FIG. 6, the phase change memory device in FIG. 11, or the phase change memory device in FIG. 13.

Figure 18:
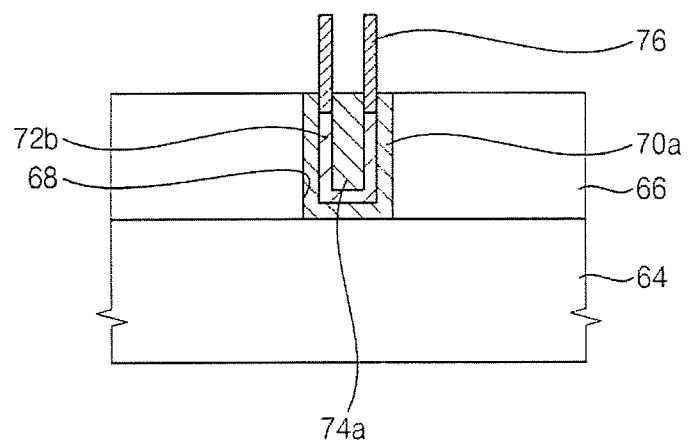
FIG. 18 is a cross sectional view illustrating a conductive structure in accordance with an exemplary embodiment of the inventive concept.
Figure 19:
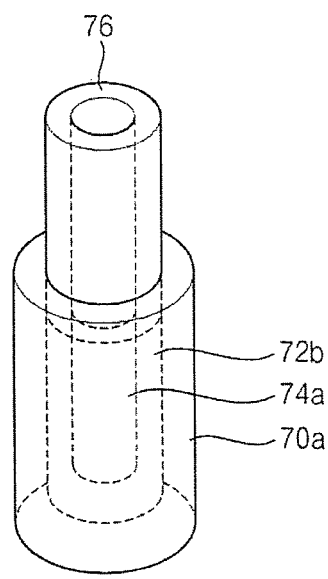
FIG. 19 is a perspective view illustrating the conductive structure in FIG. 18.
Figure 20:
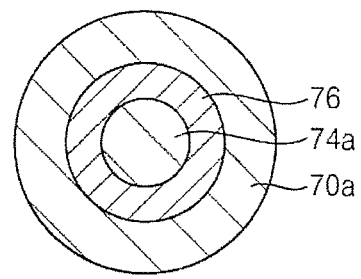
FIG. 20 is a plan view illustrating the conductive structure in FIG. 18.

FIG. 18 is a cross sectional view illustrating a conductive structure in accordance with an exemplary embodiment of the inventive concept. FIG. 19 is a perspective view illustrating a conductive structure according to an exemplary embodiment of the inventive concept. FIG. 20 is a plan view illustrating a conductive structure according to an exemplary embodiment of the inventive concept.

Referring to FIGS. 18 to 20, an insulating interlayer 66 is disposed on a substrate 64. The insulating interlayer 66 includes an opening 68 that exposes a contact region on a substrate 64. Alternatively, the opening 68 may directly expose a portion of the substrate 64.

In exemplary embodiments, the opening 68 may have various shapes such as a shape of a contact hole or a shape of a trench.

A barrier metal layer pattern 70a is positioned on a bottom and a sidewall of the opening 68. The barrier metal layer pattern 70a may be conformally formed along a profile of the opening 68. The barrier metal layer pattern 70a may include, for example, titanium, titanium nitride, tantalum, or tantalum nitride. These may be used alone or in a mixture thereof.

The barrier metal layer pattern 70a may prevent the diffusion of metal atoms and/or metal ions included in a metal pattern 72b. The barrier metal layer pattern 70a may increase a contact area between the conductive structure and the conductive region or the substrate, so that a contact resistance of the conductive structure may decrease.

The metal pattern 72b is disposed on the barrier metal layer pattern 70a in the opening 68. The metal pattern 72b may have a cylindrical shape and may include tungsten. An upper portion of the metal pattern 72b may have a ring shape. In an exemplary embodiment, the metal pattern 72b has a cylindrical tube shape. An upper surface of the metal pattern 72b may be substantially lower than an upper surface of the barrier metal layer pattern 70a. Thus, the metal pattern 72b may be located in an inside of the opening 68.

A metal oxide pattern 76 is formed on the metal pattern 72b. A lower outside of the metal oxide pattern 76 may contact the barrier metal layer pattern 70a. The metal oxide pattern 76 extends upwardly from the upper surface of the metal pattern 72b, such that the metal oxide pattern 76 protrudes from the insulating interlayer 66. The metal oxide pattern 76 may include, for example, tungsten oxide. The metal oxide pattern 76 may have a resistance substantially larger than a resistance of the metal pattern 72b.

In an exemplary embodiment, an upper portion of the metal oxide pattern 76 may have a ring shape substantially the same as that of the upper portion of the metal pattern 72b. The metal oxide pattern 76 may have a width substantially the same as a width of the metal pattern 72b. The metal oxide pattern 76 may be generated from the metal pattern 72b. When the upper portion of the metal oxide pattern 76 has the ring shape, the metal oxide pattern 76 may have an area substantially smaller than that of a circular or a polygonal pillar structure. The metal oxide pattern 76 may have a width smaller than that of the opening 68.

A buried layer pattern 74a is disposed on the metal pattern 72b to completely fill up the opening 68. Thus, an upper surface of the buried layer pattern 74a and an upper face of the insulating interlayer 66 may be positioned on a substantially same plane. A lower inside of the metal oxide pattern 76 may contact the buried layer pattern 74a.

In exemplary embodiments, the buried layer pattern 74a may include a material which is substantially slowly oxidized or barely oxidized. For example, the buried layer pattern 74a may include at least one of titanium, titanium nitride, tantalum, or tantalum nitride. These may be used alone or in a mixture thereof. Alternatively, the buried layer pattern 74a may include an insulation material such as, for example, oxide, nitride, or oxynitride.

In an exemplary embodiment, the barrier metal layer pattern 70a, the metal pattern 72b and the buried layer pattern 74a may serve together as a conductive pattern electrically connected to the conductive region. The metal oxide pattern 76 may function as a heating electrode because the metal oxide pattern 76 may have a high resistance and a small area.

Figure 21:
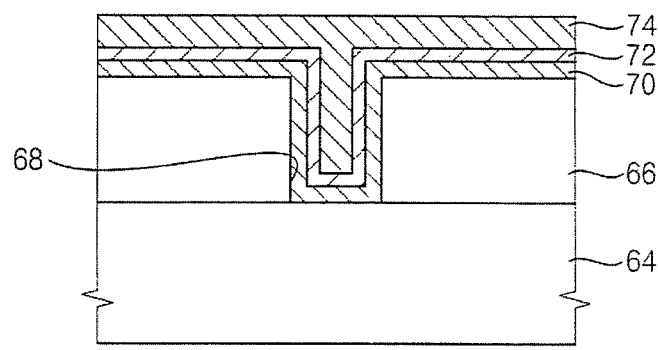
FIGS. 21 and 22 are cross sectional views illustrating a method of forming the conductive structure in FIG. 18.
Figure 22:
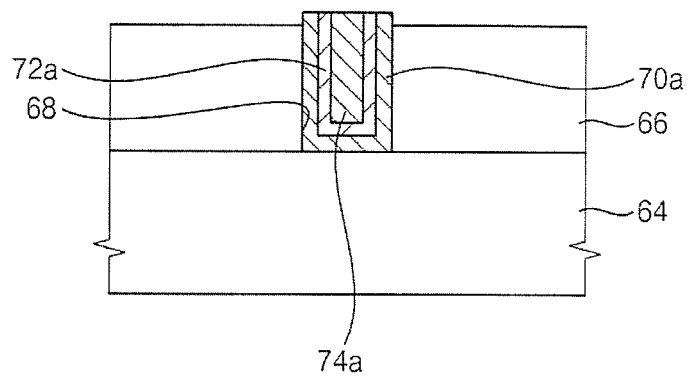

FIGS. 21 and 22 are cross sectional views illustrating a method of forming a conductive structure according to an exemplary embodiment of the present invention.

Referring to FIG. 21, an insulating interlayer 66 is formed on a substrate 64 having a conductive region formed thereon. The insulating interlayer 66 is partially etched to form an opening 68 that partially exposes the conductive region on the substrate 64. The opening 66 may be formed by a photolithography process.

A barrier metal layer 70 is formed on the insulating interlayer 66, on a bottom of the opening 68 and on a sidewall of the opening 68. The barrier metal layer 70 may be uniformly formed along profiles of the opening 68 and the insulating interlayer 66. When the barrier metal layer 70 is formed on the opening 68, the opening 68 may have a width reduced by twice of a thickness of the barrier metal layer 70. Therefore, the width of the opening 68 may be adjusted by controlling the thickness of the barrier metal layer 70. As a result, a metal pattern 72a and a metal oxide pattern 76 may have widths controlled by adjusting the width of the opening 68.

A metal layer 72 is formed on the barrier metal layer 70. The metal layer 72 may comprise, for example, tungsten. The metal layer 72 may be conformally formed along a profile of the barrier metal layer 70. The metal layer 72 may have a thickness substantially corresponding to an upper width of the metal pattern 72a. Hence, the upper width of the metal pattern 72a may be adjusted by controlling the thickness of the metal layer 72.

A buried layer 74 is formed on the metal layer 72 to fully fill up the opening 68. The buried layer 74 may be formed using a material that is very slowly oxidized or barely oxidized. In an exemplary embodiment, the buried layer 74 may comprise a material substantially the same as that of the barrier metal layer 70. In an exemplary embodiment, the buried layer 74 may comprise an insulation material such as, for example, oxide, nitride, oxynitride, or organic material.

Referring to FIG. 22, the buried layer 74, the metal layer 72 and the barrier metal layer 70 are partially removed until the insulating interlayer 66 is exposed. The buried layer 74, the metal layer 72 and the barrier metal layer 70 may be partially removed by a CMP process and/or an etch-back process. Thus, the barrier metal layer pattern 70a, a preliminary metal pattern 72a and a burier layer pattern 74a are formed in the opening 68. Each of the barrier metal layer pattern 70a and the preliminary metal pattern 72a may have a cylindrical shape. The buried layer pattern 74a on the preliminary metal pattern 72a may fill up the opening 68.

In partially removing the buried layer 74, the metal layer 72 and the barrier metal layer 70 with the CMP process, the insulating interlayer 66 may be partially polished with a polishing rate substantially larger than that of the metal layer 72. Thus, the preliminary metal layer pattern 72a, the barrier metal layer pattern 70a and the buried layer pattern 74a may be protruded over the insulating interlayer 66. For example, upper surfaces of the preliminary metal layer pattern 72a, the barrier metal layer pattern 70a and the buried layer pattern 74a may be slightly protruded from an upper face of the insulating interlayer 66 by a thickness above about 10 Å.

As illustrated in FIG. 18, the preliminary metal layer pattern 72a is thermally treated under an atmosphere including oxygen, such that the metal oxide pattern 76 and the metal pattern 72a are formed on the barrier metal layer pattern 70a. The metal oxide pattern 76 and the metal pattern 72a may be obtained processes substantially the same as those described with reference to FIG. 5.

In an exemplary embodiment, the preliminary metal layer pattern 72a may be partially oxidized to form the metal pattern 72b having a height substantially lower than that of the preliminary metal layer pattern 72a. Thus, the metal pattern 72b may have a cylindrical shape substantially lower than the upper surface of the insulating interlayer 66. The metal oxide pattern 76 may have a cylindrical shape extending from the metal pattern 72b. Here, the upper portion of the metal oxide pattern 76 may have a ring shape and may protrude over the insulating interlayer 66. In an example embodiment, the height of the metal oxide pattern 76 may be controlled by adjusting the oxidation degree of the preliminary metal layer pattern 72a.

According to exemplary embodiments, a tungsten oxide pattern having a cylindrical shape may be obtained without performing the deposition of tungsten and/or the etching of a tungsten layer. A plug or a contact such as a tungsten pattern may be provided beneath the tungsten oxide pattern. The plug or the contact may have a resistance substantially smaller than that of the tungsten oxide pattern. Because each of the tungsten pattern and the tungsten oxide pattern may have easily adjusted thickness and width, a conductive structure including the tungsten pattern and the tungsten oxide pattern may ensure desired resistances for various semiconductor memory devices.

Figure 23:
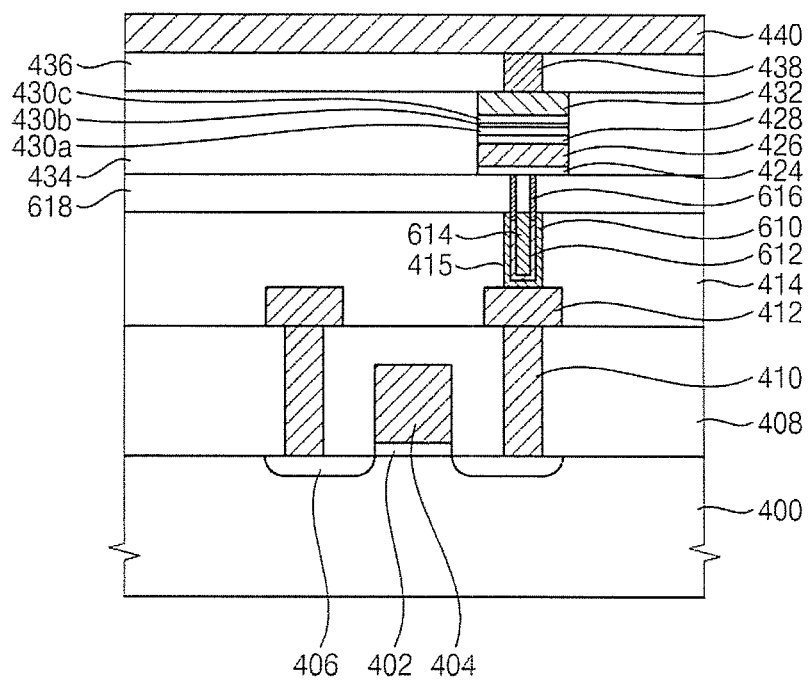
FIG. 23 is a cross sectional view illustrating a magnetic memory device in accordance with an exemplary embodiment of the inventive concept.

FIG. 23 is a cross sectional view illustrating a magnetic memory device in accordance with an exemplary embodiment of the inventive concept. The magnetic memory device illustrated in FIG. 23 includes a conductive structure having a construction substantially the same as that of the conductive structure described with reference to FIG. 18. In an exemplary embodiment, the magnetic memory device illustrated in FIG. 23 may have a configuration substantially the same as that of the conductive structure described with reference to FIG. 6 except for the conductive structure.

Referring to FIG. 23, a MOS transistor is provided on a semiconductor substrate 400, and a first insulating interlayer 408 covering the MOS transistor is formed on the semiconductor substrate 400 to cover the MOS transistor. A contact plug 410 is formed through the first insulating interlayer 408. The contact plug 410 electrically contacts an impurity region 406 of the MOS transistor. A conductive pattern 412 is disposed on the contact plug 410.

A second insulating interlayer 414 covering the conductive pattern 412 is formed on the first insulating interlayer 408. An opening 415 partially exposing the conductive pattern 412 is formed through the second insulating interlayer 414. The opening 415 may have a shape of a contact hole.

The conductive structure is disposed in the opening 415. The conductive structure may have a construction substantially the same as that of the conductive structure described with reference to FIG. 18. The conductive structure includes a first barrier metal layer pattern 610 formed on a bottom and a sidewall of the opening 415, a metal pattern 612 positioned on the first barrier metal layer pattern 610, a buried layer pattern 614 disposed on the metal pattern 612, and a metal oxide pattern 616 extending from the metal pattern 612.

The metal pattern 612 and the metal oxide pattern 616 may include, for example, tungsten and tungsten oxide, respectively. The metal pattern 612 may have a cylindrical shape, and the buried layer pattern 614 may fill up the opening 415. The metal oxide pattern 616 may be protruded over the opening 415. The metal oxide pattern 616 may be formed by oxidizing the metal pattern 612. Thus, the metal oxide pattern 616 includes tungsten oxide when the metal pattern 612 includes tungsten.

As for the conductive structure, the metal pattern 612 and the first barrier metal layer pattern 610 and the buried layer pattern 614 may serve together as a lower electrode contact on the magnetic memory device. The metal oxide pattern 616 having a relatively high resistance may serve as a heating electrode for heating a free layer pattern in a magnetic tunnel junction structure of the magnetic memory device.

A third insulating interlayer 618 is disposed on the second insulating interlayer 414. The third insulating interlayer 618 may fill up a gap between adjacent metal oxide patterns 616. The third insulating interlayer 618 may include a material having a dense structure and good step coverage such as, for example, silicon oxide obtained by an HDP-CVD process or an ALD process. Upper surfaces of the third insulating interlayer 618 and the metal oxide pattern 616 may be disposed on a substantially same plane. An upper surface of the first barrier metal layer pattern 610 is covered with the third insulating interlayer 618, such that the first barrier metal layer pattern 610 may not be exposed outside.

The magnetic tunnel junction structure is positioned on the third insulating interlayer 618. The magnetic tunnel junction structure may have a construction substantially the same as that of the magnetic tunnel junction structure described with reference to FIG. 6. A free layer pattern 426 of the magnetic tunnel junction structure is disposed on the metal oxide pattern 616. When the metal oxide pattern 616 has the ring structure, a contact area between the free layer pattern 426 and the metal oxide pattern 616 may be reduced. Therefore, the heating efficiency of the free layer pattern 426 by the metal oxide pattern 616 may be increased. The upper surface of the metal oxide pattern 616 may have a reduced size so that the metal oxide pattern 616 has an upper surface having a smooth profile.

Through processes substantially the same as the processes described with reference to FIG. 6, a third insulating interlayer 618, a fourth insulating interlayer 434, a fifth insulating interlayer 436, an upper electrode 438 and a bit line 440 are provided on the magnetic tunnel junction structure.

Figure 24:
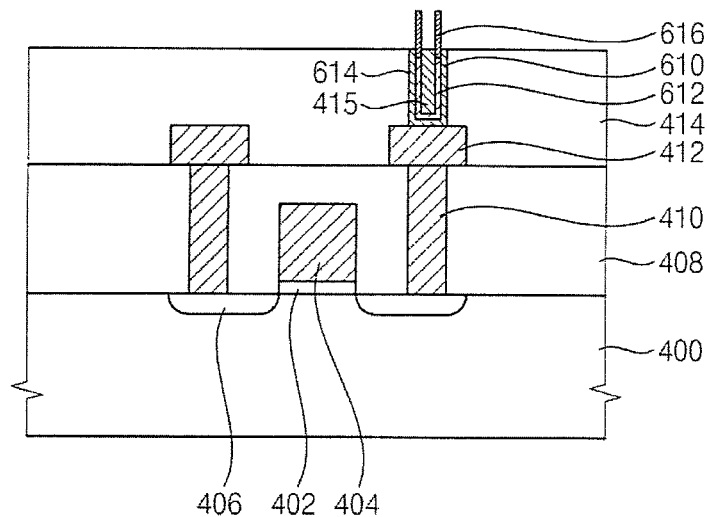
FIGS. 24 and 25 are cross sectional views illustrating a method of manufacturing the magnetic memory device in FIG. 23.
Figure 25:
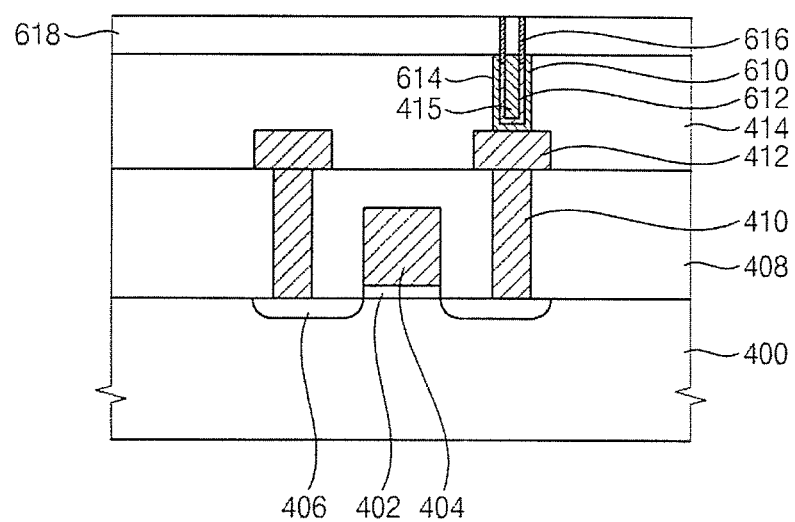

FIGS. 24 to 25 are cross sectional views illustrating a method of manufacturing a magnetic memory device according an exemplary embodiment of the inventive concept. The magnetic memory device in FIG. 23 may have a configuration substantially the same as that of the magnetic memory device described with reference to FIG. 6 except for a conductive structure. Thus, the magnetic memory device in FIG. 23 may be manufactured through processes substantially the same as those described with reference to FIGS. 7 to 10 except for a process forming the conductive structure.

A transistor, a first insulating interlayer 408, a contact plug 410 and a conductive pattern 412 are formed on a semiconductor substrate 400 through processes substantially the same as those described with reference to FIG. 7.

Referring to FIG. 24, a second insulating interlayer 414 covering the conductive pattern 412 is formed on the first insulating interlayer 408. The second insulating interlayer 414 is partially etched to form an opening 415 that at least partially exposes the conductive pattern 412.

A conductive structure is formed to fill up the opening 415 through processes substantially the same as the processes described with reference to FIGS. 21 and 22. The conductive structure may be protruded over the opening 415. The conductive structure includes a barrier metal layer pattern 610 having a cylindrical shape, a metal pattern 418 having a cylindrical shape, a buried layer pattern 614 filling the opening 415, and a metal oxide pattern 616 upwardly extending from the metal pattern 612. The metal pattern 612 and the metal oxide pattern 616 may comprise, for example, tungsten and tungsten oxide, respectively.

Referring to FIG. 25, a third insulating interlayer 618 covering the metal oxide pattern 616 is formed on the second insulating interlayer 414. The third insulating interlayer 618 may comprise a material having a dense structure and good step coverage. For example, the third insulating interlayer 618 may comprise silicon oxide by an HDP-CVD process or an ALD process.

The third insulating interlayer 618 is partially removed until the metal oxide pattern 616 is exposed. The third insulating interlayer 618 may be partially removed a CMP process. Here, the barrier metal layer pattern 610 is not exposed through the third insulating interlayer 618. Since the third insulating interlayer 618 has the dense structure, the third insulating interlayer 618 and the metal oxide pattern 616 may have uniform surfaces without rugged surfaces after performing the CMP process for partially removing the third insulating interlayer 618.

As illustrated in FIG. 23, a magnetic tunnel junction structure formed on the third insulating interlayer 618 and the metal oxide pattern 616. A fourth insulating interlayer 434 covering the magnetic tunnel junction structure, a fifth insulating interlayer 436, an upper electrode 438 and a bit line 440 are formed on the third insulating interlayer 618. The processes for forming the fourth insulating interlayer 434, the fifth insulating interlayer 436, the upper electrode 438 and the bit line 440 may be substantially the same as those described with reference to FIG. 10.

Figure 26:
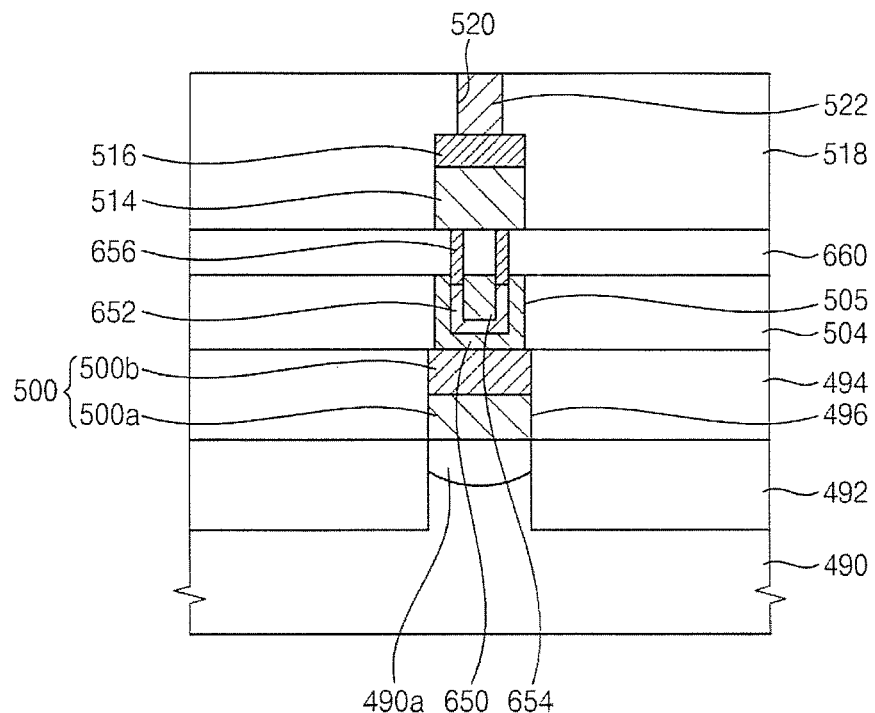
FIG. 26 is a cross sectional view illustrating a phase change memory device in accordance with an exemplary embodiment of the inventive concept.

FIG. 26 is a cross sectional view illustrating a phase change memory device in accordance with an exemplary embodiment of the inventive concept. The phase change memory device illustrated in FIG. 26 may include a conductive structure having a construction substantially the same as that of the conductive structure described with reference to FIG. 1 or FIG. 22. In an exemplary embodiment, the phase change memory device in FIG. 3 may have a configuration substantially the same as that of the phase change memory device described with reference to FIG. 11 except for the conductive structure.

Referring to FIG. 26, a first insulating interlayer 494, a P-N diode 500 and a second insulating interlayer 504 are disposed on a substrate 490. The first insulating interlayer 494 includes a first opening where the P-N diode 500 is positioned.

A second opening 505 is formed through the second insulating interlayer 504. The P-N diode 500 may be partially exposed through the second opening 505.

A barrier metal layer pattern 650, a metal pattern 652, a buried layer pattern 654 and a metal oxide pattern 656 are disposed in the second opening 505. The metal pattern 652 and the metal oxide pattern 656 may include, for example, tungsten and tungsten oxide, respectively. The barrier metal layer pattern 650, the metal pattern 652, the buried layer pattern 654 and the metal oxide pattern 656 may have structures substantially the same as those of the first barrier metal layer pattern 70a, the metal pattern 72b, the buried layer pattern 74a and the metal oxide pattern 67 described with reference to FIG. 18. The metal oxide pattern 656 may heat a phase change structure 514.

A third insulating interlayer 660 is formed on the second insulating interlayer 504. The third insulating interlayer 660 may fill a gap between adjacent metal oxide patterns 656.

The phase change structure 514 is disposed on the metal oxide pattern 656 and the third insulating interlayer 660. The phase change structure 514 contacts the metal oxide pattern 656. When the metal oxide pattern 656 has a ring shape, a contact area between the metal oxide pattern 656 and the phase change structure 514 may be reduced. Thus, a phase transition may easily occur in the phase change structure 514 by the Joule heating mechanism.

An upper electrode 516, a fourth insulating interlayer 518 and an upper electrode contact 522 are provided on the phase change structure 514.

According to exemplary embodiments, a phase change memory device may ensure improved Joule heating efficiency and reduced reset current. The resistance distribution of a set state and a reset state of the phase change memory device may decrease, so that the set and the reset states may be distinct while operating the phase change memory device.

In processes for manufacturing the phase change memory device in FIG. 26, the first insulating interlayer 494, and P-N diode 500, the second insulating interlayer 504 and the second opening 505 are obtained on the substrate 490 through processes substantially the same as those described with reference to FIG. 12. Then, the conductive structure filling the second opening 505 and protruding over the second opening 505 may be formed through processes substantially the same as those described with reference to FIGS. 21 and 22.

The third insulating interlayer 660 covering the metal oxide pattern 656 of the conductive structure is formed on the second insulating interlayer 504, and then the third insulating interlayer 660 is partially removed by a CMP process to thereby expose the metal oxide pattern 656.

Through processes substantially the same as those described with reference to FIG. 11, the phase change structure 514, the upper electrode 516, the fourth insulating interlayer 518 and the upper electrode contact 522 are formed on the metal oxide pattern 656 and the third insulating interlayer 660.

Figure 27:
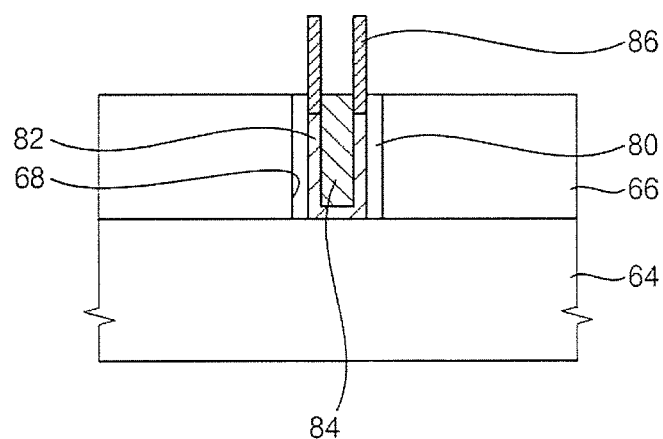
FIG. 27 is a cross sectional view illustrating a conductive structure in accordance with an exemplary embodiment of the inventive concept.

FIG. 27 is a cross sectional view illustrating a conductive structure in accordance with an exemplary embodiment of the inventive concept.

Referring to FIG. 27, an insulating interlayer 66 is provided on a substrate 64. The insulating interlayer 66 includes an opening 68 that exposes a conductive region on the substrate 64.

A spacer 80 including an insulation material is positioned on a sidewall of the opening 68. For example, the spacer 80 may include silicon nitride or silicon oxynitride. In an exemplary embodiment, a barrier metal layer may not be formed on the sidewall of the opening 68. In an exemplary embodiment, a barrier metal layer may be disposed on the spacer 80 and the substrate 64 in the opening 68.

A metal pattern 82 including tungsten having a cylindrical shape is disposed in the opening 68. The metal pattern 82 may be formed along profiles of the opening 68 and the substrate 64. A burier layer pattern 84 is disposed on the metal pattern 82. The buried layer pattern 84 fills up the opening 68. A metal oxide pattern 86 including tungsten oxide is disposed on the metal pattern 82. The metal oxide pattern 86 extends from the metal pattern 82. The metal pattern 82, the buried layer pattern 84 and the metal oxide pattern 86 may have structures substantially the same as those of the metal pattern 72a, the buried layer pattern 74a and the metal oxide pattern 76 described with reference to FIG. 18.

In a method of forming the conductive structure in FIG. 27, an insulating interlayer 66 is formed on the substrate 64. The insulating interlayer 66 is partially etched to form an opening 68 that exposes a portion of the substrate 64. The opening 68 may be formed by a photolithography process. A spacer 80 is disposed on a sidewall of the opening 68.

A metal layer including tungsten is formed on the spacer 80, the substrate 64 and the insulating interlayer 66. The metal layer may be conformally formed along a profile of the opening 68.

The metal layer and the spacer 80 are partially removed until the insulating interlayer 66 is exposed by a CMP process. Thus, a preliminary metal pattern is formed in the opening 68. The preliminary metal pattern is thermally treated under an atmosphere including oxygen, thereby forming a metal pattern 82 and a metal oxide pattern 86 including tungsten oxide in the opening 68. As a result, there is formed the conductive structure having a construction substantially the same as that of the conductive structure described with reference to FIG. 27.

In exemplary embodiments, the conductive structure illustrated in FIG. 27 may be employed in the magnetic memory device in FIG. 6, the phase change memory device in FIG. 11, or the phase change memory device in FIG. 13.

Figure 28:
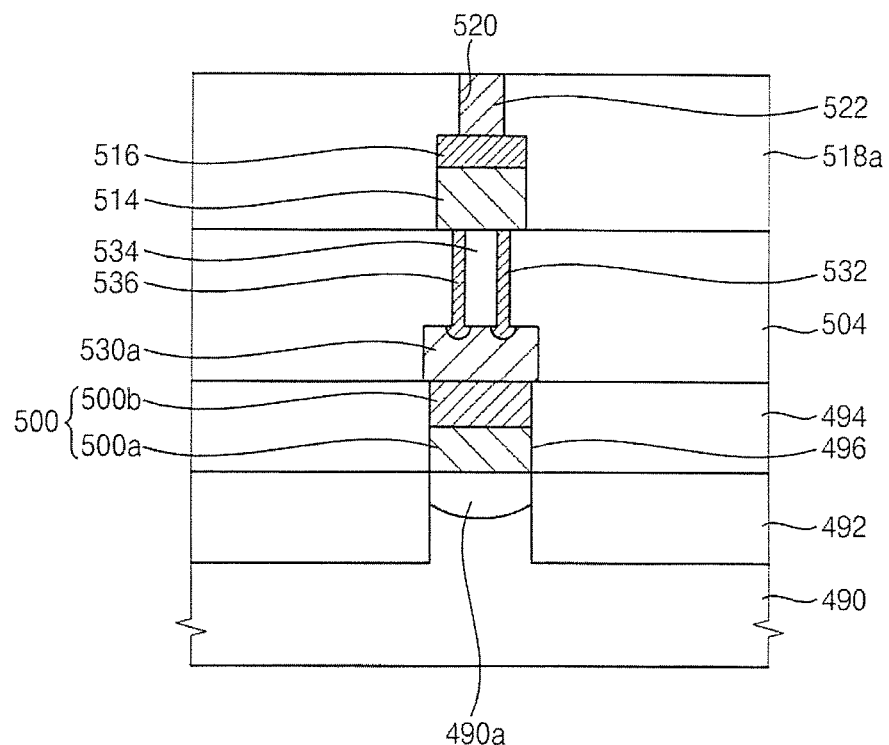
FIG. 28 is a cross sectional view illustrating a conductive structure in accordance with an exemplary embodiment of the inventive concept.

FIG. 28 is a cross sectional view illustrating a conductive structure in accordance with an exemplary embodiment of the inventive concept.

Referring to FIG. 28, a first insulating interlayer 494 and a P-N diode 500 are disposed on a substrate 490. The first insulating interlayer 494 and the P-N diode 500 may be substantially the same as those described with reference to FIG. 11.

A metal pattern 520a including tungsten is disposed in the first insulating interlayer 494. The metal pattern 520a electrically contacts the P-N diode 500. A second insulating interlayer 505 covering the metal pattern 520a is formed on the first insulating interlayer 494.

A metal oxide pattern 536 including tungsten oxide is disposed on the metal pattern 530a. The metal oxide pattern 536 may extend from the metal pattern 520a and may have a cylindrical shape.

An insulation layer pattern 534 is formed on an inner sidewall of the metal pattern 530a. The insulation layer pattern 534 may include oxide such as, for example, silicon oxide. Alternatively, the insulation layer pattern 534 may have a multi layer structure that includes a silicon nitride film and a silicon oxide film.

A phase change structure 514 is disposed on the insulation layer pattern 534 and the second insulating interlayer 505. The phase change structure 514 contacts the metal oxide pattern 536. An upper electrode 516 and an upper electrode contact 522 are disposed on the phase change structure 514.

Figure 29:
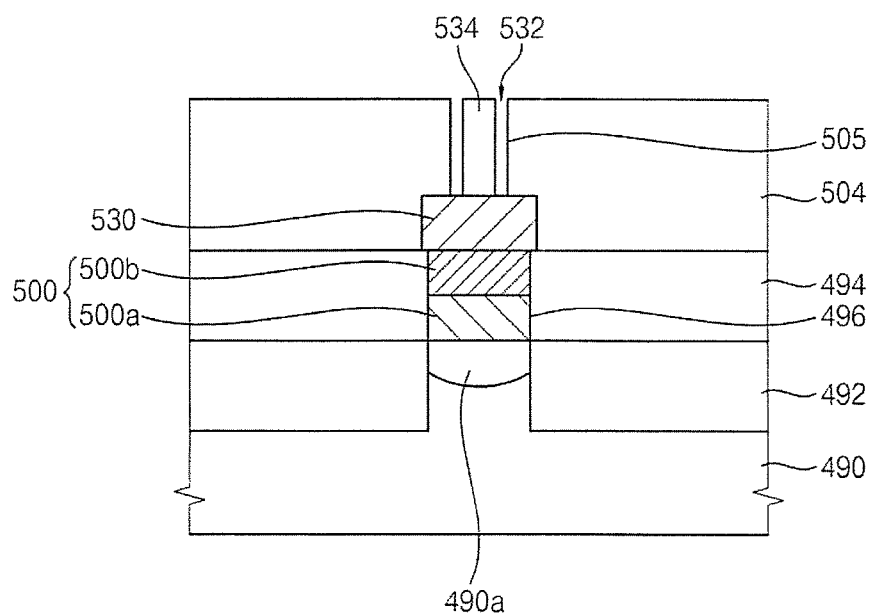
FIG. 29 is a cross sectional view illustrating a method of forming the conductive structure in FIG. 28.

FIG. 29 is a cross sectional view illustrating a method of manufacturing a phase change memory device according to an exemplary embodiment of the inventive concept.

Referring to FIG. 29, an isolation layer pattern 492, a first insulating interlayer 494 and a P-N diode 500 are formed on a substrate 490 through processes substantially the same as those described with reference to FIG. 12.

A preliminary metal pattern 530 including tungsten is formed on the P-N diode 500, and a second insulating interlayer 504 covering the preliminary metal pattern 530 is formed on the first insulating interlayer 494. The second insulating interlayer 504 is partially etched to form a second opening 505 that exposes a portion of the preliminary metal pattern 530.

A first insulation layer is formed on a bottom and a sidewall of the opening 505. The first insulation layer may comprise, for example, oxide, nitride, or oxynitride. For example, the first insulation layer may comprise silicon oxide, silicon nitride, or silicon oxynitride. The first insulation layer is partially etched by an anisotropic etching process to form an inner spacer on the sidewall of the second opening 505.

A second insulation layer is formed in the opening 505 where the inner spacer is positioned. The second insulation layer may comprise, for example, oxide, nitride, or oxynitride. In an exemplary embodiment, the second insulation layer may include a material having an etching selectivity relative to that in the first insulation layer. For example, the second insulation layer may include silicon oxide when the first insulation layer includes silicon nitride.

The second insulation layer is partially removed until the inner spacer and the second insulting interlayer 504 are exposed. The second insulation layer may be partially removed by a CMP process and/or an etch-back process.

The inner spacer is removed to form the second opening 505, so that an insulation layer pattern 534 having a third opening 532 is formed in the second opening 505. The insulation layer pattern 534 may have a cylindrical shape. The inner spacer may be etched by an isotropic etching process or an anisotropic etching process. The insulation layer pattern 534 may include silicon oxide when the second insulation layer is formed using silicon oxide. In an exemplary embodiment, a width of the third opening 532 may vary in accordance with a thickness of the insulation layer pattern 534.

Referring to FIG. 28, a metal oxide pattern 536 including tungsten oxide is formed in the third opening 532 by oxidizing the preliminary metal pattern 530 exposed by the third opening 532. The metal oxide pattern 536 may fill up the third opening 532. Simultaneously, a metal pattern 520a is formed from the preliminary metal pattern 530 in accordance with the formation of the metal oxide pattern 536. That is, the preliminary metal pattern 530 is partially consumed by the oxidation, so that the preliminary metal pattern 530 is changed into the metal pattern 530a.

The metal pattern 520a and the metal oxide pattern 536 are partially removed until the second insulating interlayer 504 is exposed. The metal pattern 520a and the metal oxide pattern 536 may be partially removed by, for example, a CMP process.

A phase change structure 514 is formed on the metal oxide pattern 536 and the second insulating interlayer 504. An upper electrode 516 and an upper electrode contact 522 are sequentially formed on the phase change structure 514.

Figure 30:
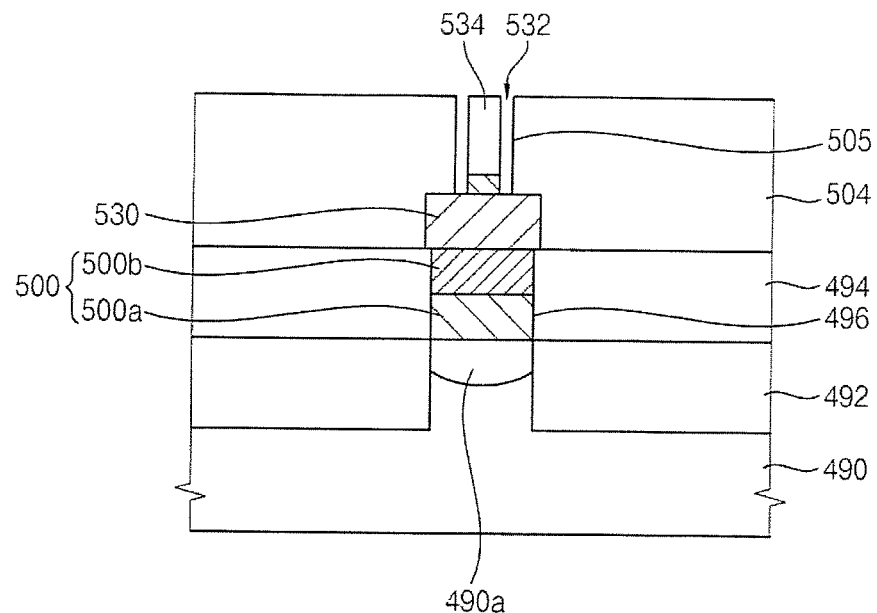
FIG. 30 is a cross sectional view illustrating a method of manufacturing the conductive structure in FIG. 28 according to an exemplary embodiment of the inventive concept.

FIG. 30 is a cross sectional view illustrating a method of manufacturing a conductive structure according to an exemplary embodiment of the inventive concept.

Referring to FIG. 30, an isolation layer pattern 492, a first insulating interlayer 494 and a P-N diode 500 are formed on a substrate 490 through processes substantially the same as those described with reference to FIG. 12.

A preliminary metal pattern 530 including tungsten, a second insulating interlayer 504 and a second opening 505 are formed through processes substantially the same as those described with reference to FIG. 29. The preliminary metal pattern 530 contacts the P-N diode 500 and the second insulating interlayer 504 covers the preliminary metal pattern 530. The second opening 505 partially exposes an upper surface of the preliminary metal pattern 530.

A first insulation layer is formed on a bottom and a sidewall of the opening 505. A second insulation layer is formed on the first insulation layer to completely fill up the second opening 505. In an exemplary embodiment, the second insulation layer may include a material having an etching selectivity relative to that in the first insulation layer. The first and the second insulation layers are partially removed until the second insulating interlayer 504 is exposed.

The first and the second insulation layers are partially etched to form an insulation layer pattern 534 having a third opening 532. The insulation layer pattern 534 may be formed by an anisotropic etching process. The insulation layer pattern 534 may have a cylindrical shape. Since the first insulation layer partially remains in the second opening 505, the insulation pattern 534 includes silicon oxide and silicon nitride. That is, the insulation layer pattern 534 includes remaining portions of the first and the second insulation layers.

Through processes substantially the same as those to described with reference to FIG. 28, a metal pattern 530a, a metal oxide pattern 536 including tungsten oxide, a phase change structure 514, an upper electrode 516 and an upper electrode contact 522 are sequentially formed on the insulation layer pattern 534.

Figure 31:
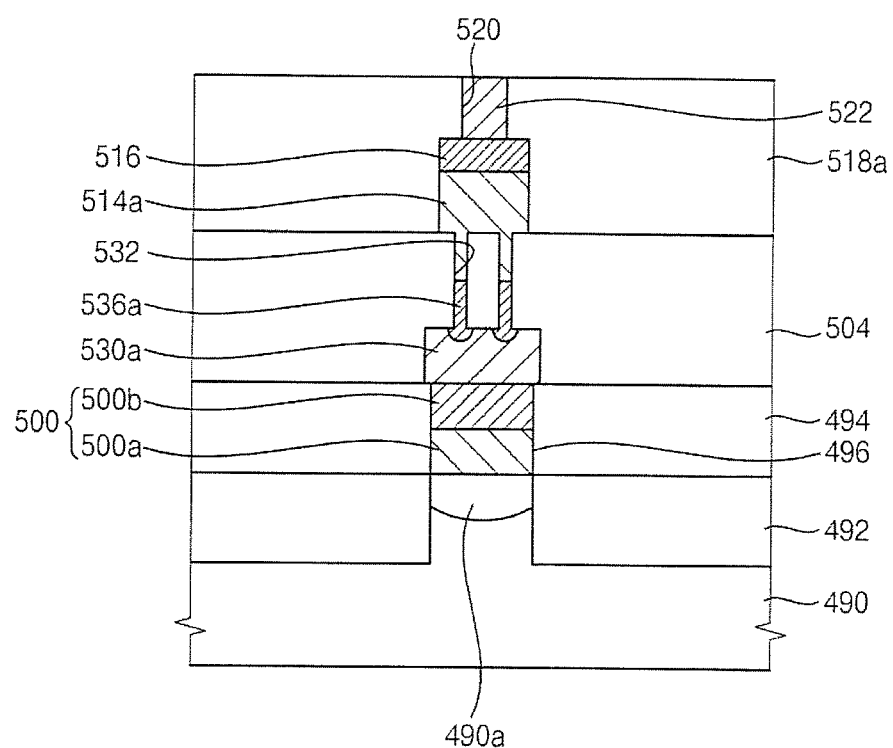
FIG. 31 is a cross sectional view illustrating a phase change memory device in accordance with an exemplary embodiment of the inventive concept.

FIG. 31 is a cross sectional view illustrating a phase change memory device in accordance with an exemplary embodiment of the inventive concept. The phase change memory device in FIG. 31 may have a configuration substantially the same as that of the phase change memory device described with reference to FIG. 28 except for a phase change structure.

Referring to FIG. 31, a phase change structure 514a of the phase change memory device has a lower portion extended from an upper portion of a metal oxide pattern 536a including tungsten oxide. Thus, the phase change structure 514a may have a cylindrical shape. The phase change structure 514a protrudes into a second insulating interlayer 504.

A method of manufacturing the phase change memory device in FIG. 31 may be substantially the same as those described with reference to FIG. 29.

In a method of manufacturing the phase change memory device in FIG. 31, a preliminary metal pattern including tungsten exposed by a third opening 532 is oxidized to form the metal oxide pattern 536a including tungsten oxide and a metal pattern 530a. Here, the metal oxide pattern 536a partially fills up the third opening 532. The metal oxide pattern 536a and the metal pattern 520a are not partially removed.

The phase change structure 514a is formed on the metal oxide pattern 536a and the second insulating interlayer 504 to completely fill up the third opening 532 because the third opening 532 is partially filled with the metal oxide pattern 536a.

In exemplary embodiments, the conductive structure serving as a heating electrode in FIG. 28 may be employed in the magnetic memory device in FIG. 6. That is, the conductive structure contacting the magnetic tunnel junction structure in FIG. 6 may be replaced with the conductive structure illustrated in FIG. 28.

Figure 32:
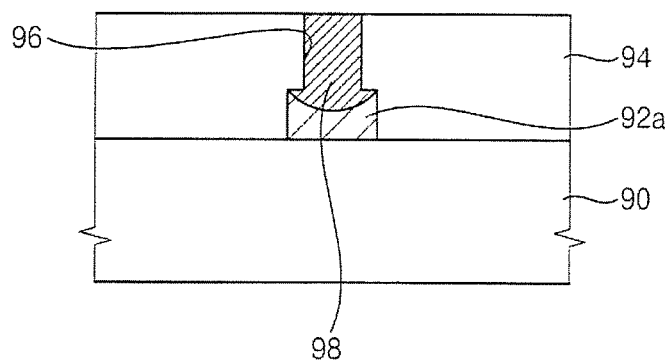
FIG. 32 is a cross sectional view illustrating a conductive structure in accordance with an exemplary embodiment of the inventive concept.

FIG. 32 is a cross sectional view illustrating a conductive structure in accordance with an exemplary embodiment of the inventive concept.

Figure 33:
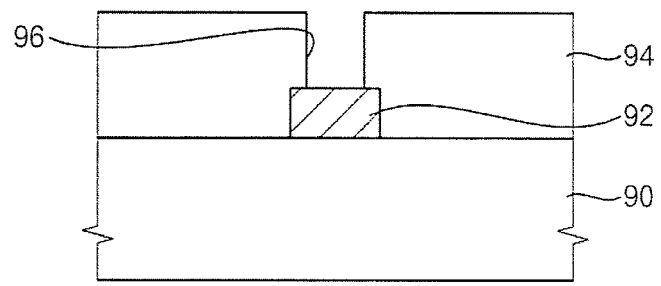
FIG. 33 is a cross sectional view illustrating a method of manufacturing the conductive structure in FIG. 32.

Referring to FIGS. 32 and 33, a metal pattern 92a including tungsten is disposed on a substrate 90. The metal pattern 92a has an upper portion including a recess formed thereon. That is, by controlling process conditions of a subsequent thermal treatment process, a center of the upper portion of a preliminary metal pattern 92 may be more rapidly oxidized than an edge of the upper portion of the preliminary metal pattern 92. The recess of the metal pattern 92a may have a rounded shape such as, for example, an arch shape. Thus, an edge of the upper portion of the metal pattern 92a may be substantially higher than a center of the upper portion of the metal pattern 92a.

An insulating interlayer 94 covering the metal pattern 92a is formed on the substrate 90. An opening 96 is provided through the insulating interlayer 94. The opening 96 exposes the upper portion of the metal pattern 92a having the recess.

A metal oxide pattern 98 including tungsten oxide is disposed on the metal pattern 92a. The metal oxide pattern 98 may fill up the opening 96. The metal oxide pattern 98 may be generated from the metal pattern 92a. For example, the metal oxide pattern 98 may be obtained by oxidizing the metal pattern 92a.

FIG. 33 is a cross sectional view illustrating a method of manufacturing a conductive structure according to an exemplary embodiment of the inventive concept.

Referring to FIG. 33, a metal layer including tungsten is formed on a substrate 90, and then the meal layer is patterned to form a preliminary metal pattern 92 on the substrate 90. An insulating interlayer 94 is formed on the substrate 90 to cover the preliminary metal pattern 92.

The insulating interlayer 94 is partially etched to form an opening 96 that at least partially exposes the preliminary metal pattern 92. The opening 94 may be formed by a photolithography process.

Referring to FIGS. 32 and 33, the preliminary metal pattern 92 exposed by the opening 96 is thermally treated under an atmosphere including oxygen, so that a metal oxide pattern 98 and a metal pattern 92a are formed on the substrate 90. The metal oxide pattern 98 and the metal pattern 92a include, for example, tungsten oxide and tungsten, respectively.

In a thermal treatment process for forming the metal oxide pattern 98 and the meal pattern 92a, the preliminary metal pattern 92 may be reacted with oxygen to be upwardly expanded in the opening 96. Thus, the metal oxide pattern 98 filling the opening 96 may be formed on the metal pattern 92a. Simultaneously, an upper portion of the preliminary metal pattern 92 may be oxidized, such that the preliminary metal pattern 92 may be changed into the metal patter 92a. By controlling process conditions of the thermal treatment process, a center of the upper portion of the preliminary metal pattern 92 may be rapidly oxidized than an edge of the upper portion of the preliminary metal pattern 92. Therefore, the metal pattern 92a may have an upper portion including a round shaped recess whereas the metal oxide pattern 98 may have a protrusion corresponding to the recess of the metal pattern 92a.

In an exemplary embodiment, the metal oxide pattern 98 and the insulation interlayer 94 may be planarized by a planarization process. For example, the metal oxide pattern 98 and the insulation interlayer 94 may be subjected to a CMP process.

Figure 34:
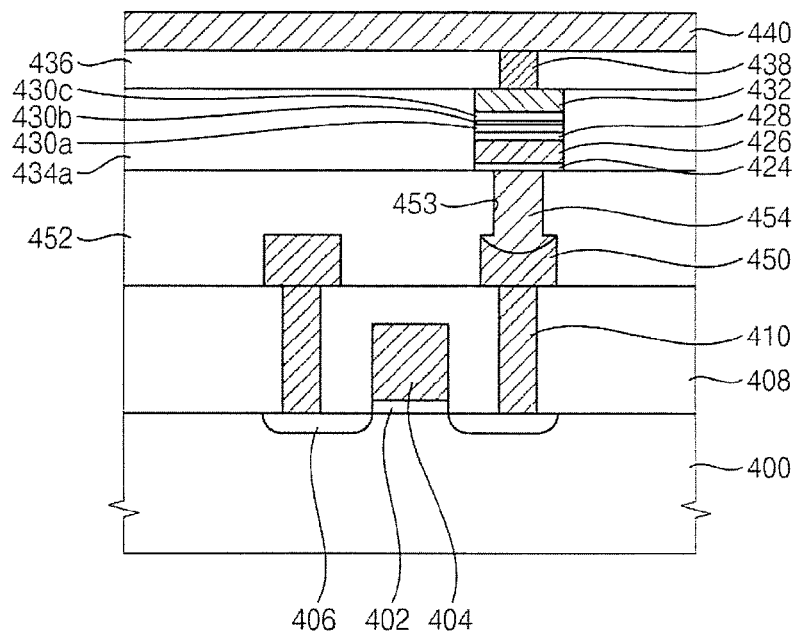
FIG. 34 is a cross sectional view illustrating a magnetic memory device in accordance with an exemplary embodiment of the inventive concept.

FIG. 34 is a cross sectional view illustrating a magnetic memory device in accordance with an exemplary embodiment of the inventive concept. The magnetic memory device in FIG. 34 includes a conductive pattern and a lower electrode contact having constructions substantially the same as those of the conductive pattern and lower electrode contact in the magnetic memory device described with reference to FIG. 29. The magnetic memory device in FIG. 34 may have a configuration substantially the same as that of the magnetic memory device described with reference to FIG. 6 except for the conductive pattern and the lower electrode contact.

Referring to FIG. 34, a conductive structure is disposed on a first insulating interlayer 408 and a contact plug 410. The conductive structure may have a construction substantially the same as that of the conductive structure described with reference to FIG. 30.

The conductive structure has a metal pattern 450 including tungsten and a metal oxide pattern 454 including tungsten oxide. The metal pattern 450 contacts the contact plug 410. The metal pattern 450 has an upper portion including a rounded recess. An edge of the upper portion of the metal pattern 450 may be substantially higher than a center of the upper portion of the metal pattern 450.

A second insulating interlayer 452 covering the metal pattern 450 is disposed on the first insulating interlayer 408. An opening 453 is provided through the second insulating interlayer 452. The opening 453 at least partially exposes the upper portion of the metal pattern 450 having the rounded recess.

A metal oxide pattern 454 including tungsten oxide is disposed on the metal pattern 450. The metal oxide pattern 454 fills up the opening 453. The metal oxide pattern 454 may be generated from the metal pattern 450 by oxidizing the metal pattern 450.

The metal oxide pattern 454 may serve as a heating electrode for heating a magnetic tunnel junction structure of the magnetic memory device. The metal oxide pattern 454 may function as the lower electrode contact in the magnetic memory device.

Since the magnetic memory device illustrated in FIG. 34 has the configuration substantially the same as that of the magnetic memory device described with reference to FIG. 6 except for the conductive pattern and the lower electrode contact, the magnetic memory device illustrated in FIG. 34 may be manufactured by processes substantially the same as those described with reference to FIGS. 7 to 10 except for processes of forming the conductive pattern and the lower electrode contact. The conductive pattern 450 and the lower electrode contact may be formed by processes substantially the same as those described with reference to FIG. 32.

Figure 35:
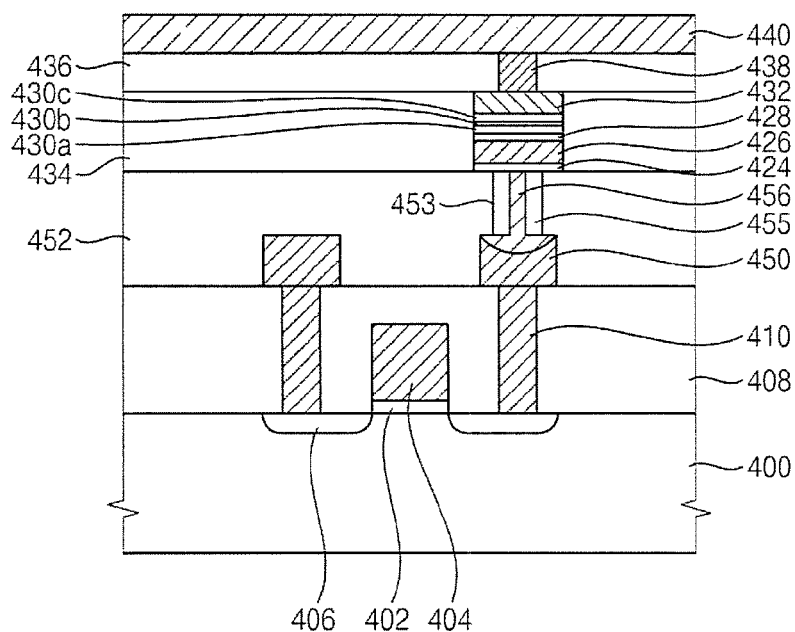
FIG. 35 is a cross sectional view illustrating a magnetic memory device in accordance with an exemplary embodiment of the inventive concept.

FIG. 35 is a cross sectional view illustrating a magnetic memory device in accordance with an exemplary embodiment of the inventive concept. The magnetic memory device in FIG. 35 may have a configuration substantially the same as that of the magnetic memory device described with reference to FIG. 6 except for a conductive patter and a lower electrode contact. The magnetic memory device in FIG. 35 includes the conductive pattern and the lower electrode contact having constructions substantially the same as those of the conductive structure described with reference to FIG. 28 except for a spacer on a sidewall of a metal oxide pattern.

Referring to FIG. 35, a spacer 455 is provided on a sidewall of an opening 453 formed through a second insulating interlayer 452. The spacer 455 may reduce a width of the opening 453, and thus a metal oxide pattern 456 including tungsten oxide may have a greater decreased upper width than the conductive structure described with reference to FIG. 34.

The processes of manufacturing the magnetic memory device in FIG. 35 may be substantially the same as that of the magnetic memory device described with reference to FIG. 34.

In an exemplary embodiment, the spacer 455 is formed on the sidewall of the opening 453 after forming the opening 453 through the second insulating interlayer 452. The spacer 455 may comprise, for example, oxide, nitride, or oxynitride. For example, the spacer 455 may comprise silicon oxide, silicon nitride, or silicon oxynitride.

Figure 36:
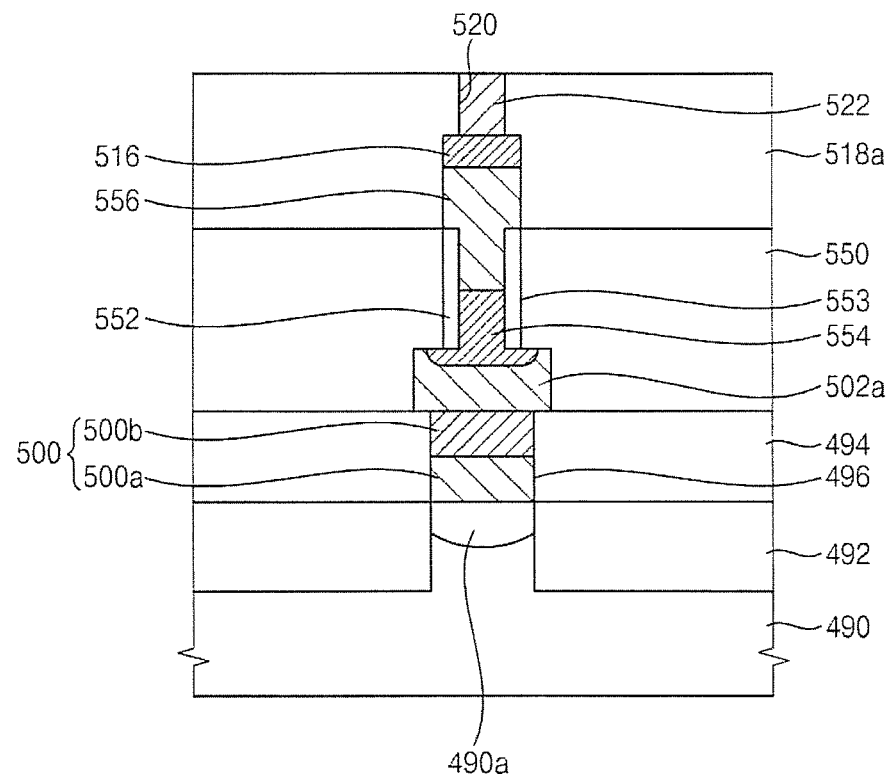
FIG. 36 is a cross sectional view illustrating a phase change memory device in accordance with an exemplary embodiment of the inventive concept.

FIG. 36 is a cross sectional view illustrating a phase change memory device in accordance with an exemplary embodiment of the inventive concept.

Referring to FIG. 36, a first insulating interlayer 494 and a P-N diode 500 are provided on a substrate 490. A metal pattern 502a including tungsten is positioned on the first insulating interlayer 494. The metal pattern 502a contacts the P-N diode 500. The metal pattern 502a may have an upper portion that includes a rounded recess. In an exemplary embodiment, the rounded recess can be formed during a subsequent oxidation process.

A second insulating interlayer 550 covering the metal pattern 502a is disposed on the first insulating interlayer 494. An opening 553 is formed through the second insulating interlayer 550. The opening 553 at least partially exposes the metal pattern 502a. A spacer 552 is provided on a sidewall of the opening 553. The spacer 552 may include an insulation material. When the spacer 552 is located in the opening 553, the opening 553 may have a reduced width.

A metal oxide pattern 554 including tungsten oxide is disposed on the metal pattern 502a in the opening 553 having the spacer 552. The metal oxide pattern 554 may be generated from the metal pattern 502a by partially oxidizing the metal pattern 502a. The metal oxide pattern 554 may have an upper surface substantially lower than an upper end of the opening 553. Namely, the metal oxide pattern 554 may partially occupy the opening 553. The metal oxide pattern 554 may serve as a lower electrode contact in the phase change memory device.

A phase change structure 556 is disposed on the metal oxide pattern 554. The phase change structure 556 fills up the opening 553 and protrudes into the opening 553. The phase change structure 556 may have a lower portion in the opening 553 and an upper portion protruding over the opening 553. The lower portion of the phase change structure 556 may have a width substantially smaller than a width of the upper portion thereof.

An upper electrode 516, a second insulting interlayer 518a and an upper electrode contact 552 are provided on the phase change structure 556.

Figure 37:
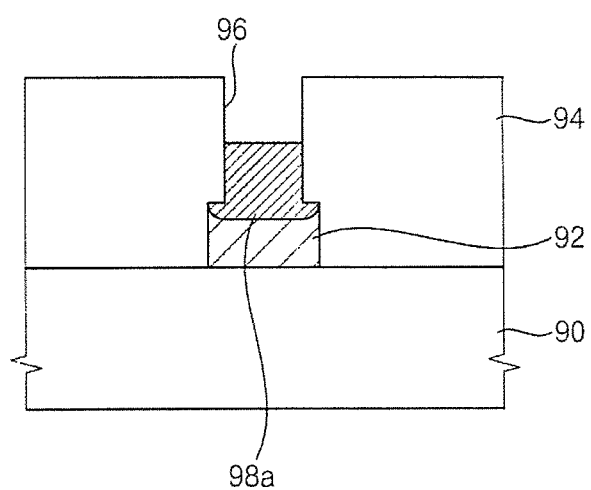
FIG. 37 is a cross sectional view illustrating a conductive structure in accordance with an exemplary embodiment of the inventive concept.

FIG. 37 is a cross sectional view illustrating a conductive structure in accordance with an exemplary embodiment of the inventive concept. The conductive structure in FIG. 37 may have a construction substantially the same as that of the conductive structure described with reference to FIG. 28 except that a metal oxide pattern 98a including tungsten oxide partially fills up an opening 96.

Processes of manufacturing the conductive structure in FIG. 37 may be substantially the same as those described with reference to FIG. 29. In an exemplary embodiment, the metal oxide pattern 98a partially fills up the opening 98 by controlling process conditions of an oxidation process performed in connection with a preliminary metal pattern.

Figure 38:
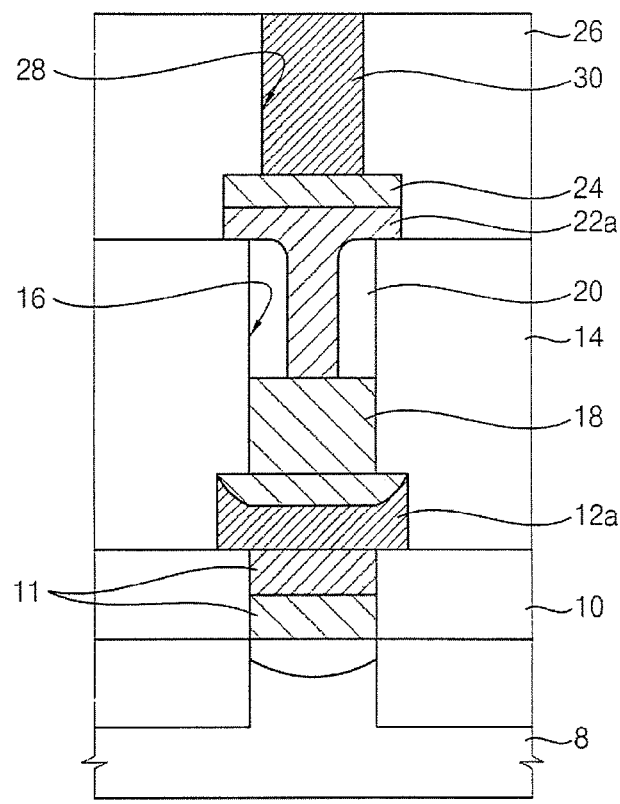
FIG. 38 is a cross sectional view illustrating a phase change memory device in accordance with an exemplary embodiment of the inventive concept.

FIG. 38 is a cross sectional view illustrating a phase change memory device in accordance with an exemplary embodiment of the inventive concept.

Referring to FIG. 38, a first insulating interlayer 10 and a P-N diode 11 are provided on a substrate 8. A conductive pattern 12a including a metal is disposed on the P-N diode 11 and the first insulating interlayer 10. The conductive pattern 12a may include a metal having a low resistance. For example, the conductive pattern 12a may include tungsten.

A second insulating interlayer pattern 14 covering the conductive pattern 12a is formed on the first insulating interlayer 10. A first opening 16 is formed through the second insulating interlayer pattern 14. The opening 16 at least partially expose the conductive pattern 12a. The second insulating interlayer pattern 14 may include oxide or nitride. For example, the second insulating interlayer pattern 14 may include silicon oxide or silicon nitride.

In an exemplary embodiment, the conductive pattern 12a has an upper portion including a recess formed thereon. An edge of the upper portion of the conductive pattern 12a is substantially higher than a center of the upper portion of the conductive pattern 12a. In an exemplary embodiment, by controlling process conditions of the thermal treatment process, a center of the upper portion of the preliminary metal pattern may be more rapidly oxidized than an edge of the upper portion of the preliminary metal pattern.

A lower electrode contact 18 is disposed in the first opening 16. The lower electrode contact 18 may include metal oxide generated from the conductive pattern 12a. The lower electrode contact 18 may fill up the first opening 16.

In an exemplary embodiment, the lower electrode contact 18 may be obtained by oxidizing the conductive pattern 12a. For example, metal oxide generated from the conductive pattern 12a may be upwardly grown in the first opening 16, thereby forming the lower electrode contact 18 in the first opening 16. The conductive pattern 12a may have a rounded recess thereon and the lower electrode contact 18 may have a rounded protrusion corresponding to the rounded recess of the conductive pattern 12a. An upper surface of the lower electrode contact 18 may be more spaced apart from an upper surface of the conductive pattern 12a when the lower electrode contact 18 includes the rounded protrusion and the conductive pattern 12a has the rounded recess. Therefore, heat generated between a phase change structure 22a and the lower electrode contact 18 may be more confined by reducing the dissipation of the heat. That is, the phase change structure 22a may have improved Joule heating efficiency.

In an exemplary embodiment, the conductive pattern 12a may include tungsten, and thus the lower electrode contact 18 may include tungsten oxide.

A spacer 20 is disposed on a sidewall of the first opening 16. The spacer 20 contacts the lower electrode contact 18. The first opening 16 may have a width reduced by the formation of the spacer 20. Thus, a contact area between the lower electrode contact 18 and the phase change structure 22a may also be decreased. The spacer 20 may include nitride such as silicon nitride, or oxynitride like silicon oxynitride.

The phase change structure 22a is disposed on the lower electrode contact 18 to completely fill up the first opening 16. In an exemplary embodiment, the contact area between the lower electrode contact 18 and the phase change structure 22a may be reduced by an amount corresponding to a contact area of the spacer 20 provided on the lower electrode contact 18. The phase change structure 22a may include a chalcogenide compound of which structure is changed between a crystalline state and an amorphous state. The chalcogenide compound has a relatively high reflectivity and a relatively small resistance when the chalcogenide is in the crystalline state. The chalcogenide compound has a low reflectivity and a large resistance when the chalcogenide is in the amorphous state. In an exemplary embodiment, the chalcogenide compound may include an alloy of germanium-antimony-tellurium. Phase change structure 22a filling the first opening 16 may protrude over the second insulating interlayer pattern 14. In an exemplary embodiment, an upper portion of the phase change structure 22a may have a width larger than that of a lower portion thereof.

An upper electrode 24 is disposed on the phase change structure 22a. The upper electrode 24 may include metal nitride such as, for example, titanium nitride. The upper electrode 24 may have a width substantially the same as that of the upper portion of the phase change structure 22a.

A third insulating interlayer pattern 26 is disposed on the second insulating interlayer pattern 14. The third insulating interlayer pattern 26 covers the upper electrode 24 and the phase change structure 22a. A second opening 28 is formed through the third insulating interlayer pattern 26. The second opening 28 at least partially exposes the upper electrode 24.

An upper electrode contact 30 is disposed in the second opening 28. The upper electrode contact 30 may include a metal such as, for example, tungsten.

According to exemplary embodiments, the phase change memory device may have a lower electrode contact including metal oxide generated from a conductive pattern including metal. In an exemplary embodiment, the lower electrode contact may have a large resistance. Because the phase change memory device includes the lower electrode contact of metal oxide, the phase change memory device may ensure a reduced reset current by enhancing the Joule heating efficiency. The phase change memory device may have distinct set and reset states because a phase change structure has a minute resistance distribution between the set state and the reset state. In an exemplary embodiment, an opening where the phase change structure is positioned may have a decreased aspect ratio because the lower electrode contact is disposed beneath the phase change structure in the opening. Therefore, a void or a seam may not be generated in phase change structure to prevent an operation failure of the phase change memory device.

FIGS. 39 to 44 are cross sectional views illustrating a method of manufacturing a phase change memory device according to an exemplary embodiment of the present invention.

Figure 39:
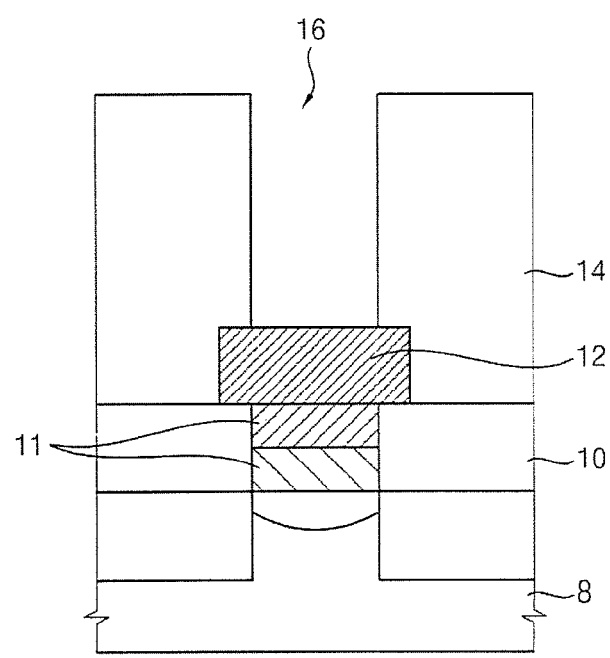
FIGS. 39 to 44 are cross sectional views illustrating a method of manufacturing the phase change memory device in FIG. 38.

Referring to FIG. 39, an isolation layer pattern and an impurity region 8a are formed on a substrate 8. A first insulating interlayer 10 is formed on the substrate 8 to cover the isolation layer pattern and the impurity region 8a. The first insulating interlayer 10 may be formed using oxide such as, for example, silicon oxide.

A P-N diode 11 is formed through the first insulating interlayer 10. The P-N diode 11 may electrically contacts the impurity region 8a. A preliminary conductive pattern 12 is formed on the P-N diode 11 and the first insulating interlayer 10. The preliminary conductive pattern 12 contacts the P-N diode 11. The preliminary conductive pattern 12 may comprise metal.

In an exemplary embodiment, the preliminary conductive pattern 12 may include a material having a low resistance, an oxide of the material having an electrical conductivity, and the oxide of the material upwardly expending while oxidizing the material. For example, the preliminary conductive pattern 12 may comprise metal such as tungsten.

A second insulating interlayer is formed on the first insulating interlayer 10 to cover the preliminary conductive pattern 12. The second insulating interlayer may comprise oxide such as silicon oxide, or nitride like silicon nitride.

The second insulating interlayer is partially etched to form a first opening 16 partially exposing the preliminary conductive pattern 12. The first opening 12 may have a shape of a contact hole. For forming the first opening 16, a second insulating interlayer pattern 14 having the first opening 16 is provided on the first insulating interlayer 10.

Figure 40:
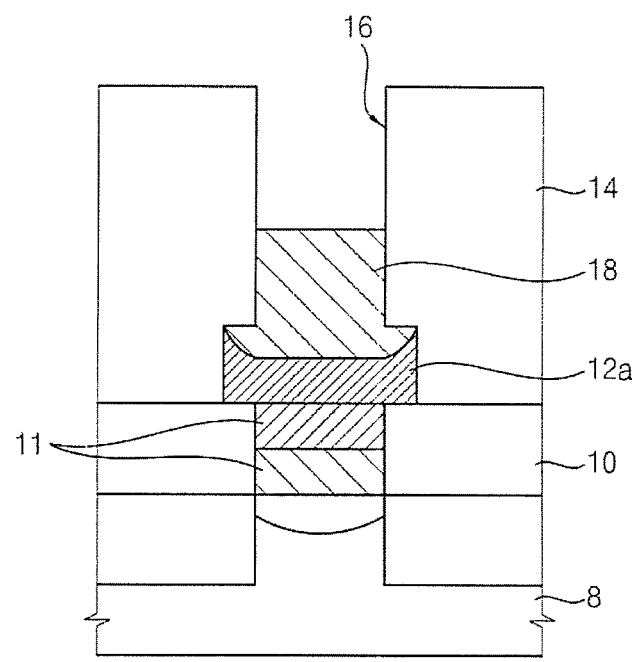

Referring to FIG. 40, an exposed portion of the preliminary conductive pattern 12 through the first opening 16 is thermally treated under an oxygen atmosphere, such that a lower electrode contact 18 is formed on the preliminary conductive pattern 12. For example, oxygen may be reacted with the preliminary conductive pattern 12 and a reacted portion of the preliminary conductive pattern 12 may thermally expanded toward the first opening 16, thereby forming the lower electrode contact 18. The lower electrode contact 18 may partially occupy the first opening 16.

In an exemplary embodiment, the lower electrode contact 18 may include metal oxide generated from the metal included in the preliminary conductive pattern 12. The lower electrode contact 18 including metal oxide may have a resistance substantially larger than that of the preliminary conductive pattern 12.

While thermally treating the preliminary conductive pattern 12 under the oxygen atmosphere, the exposed portion of the preliminary conductive pattern 12 is additionally reacted with oxygen, so that the lower electrode contact 18 may laterally extend along an upper portion of the preliminary conductive pattern 12. Thus, the preliminary conductive pattern 12 is changed into a conductive pattern 12a having a recess formed thereon. In an exemplary embodiment, the recess may have an inclined sidewall. The lower electrode contact 18 may have a laterally enlarged lower portion located in the recess of the conductive pattern 12a. For example, the lower electrode 18 may have a truncated arrow shape.

As described above, the conductive pattern 12a has the recess and the lower electrode contact 18 has the enlarged lower portion in accordance with a thermal treatment process. Therefore, a contact area between the conductive pattern 12a and the lower electrode 18 may be increased.

In exemplary embodiments, the thermal treatment process may include a plasma treatment or an RTA process. For example, the conductive pattern 12a and the lower electrode 18 may be formed by the plasma treatment or the RTA process. Alternatively, the conductive pattern 12a and the lower electrode 18 may be obtained by successively performing the plasma treatment and the RTA process.

According to an exemplary embodiment, a thickness of the lower electrode contact 18 may vary by controlling conditions of the thermal treatment process. For example, the lower electrode 18 may have a thickness in a range of about 200 Å to about 600 Å measured from an upper face of the conductive pattern 12a.

In an exemplary embodiment, the conductive pattern 12a may include tungsten. In an exemplary embodiment, the lower electrode contact 18 may include tungsten oxide. Tungsten may be oxidized under an oxygen atmosphere and tungsten oxide may be rapidly expanded. Tungsten oxide may have a resistance substantially larger than a resistance of tungsten, and also may have an etching resistance relative to an etching solution in a wet etching process. To ensure proper resistance and etching durability of the conductive pattern 12a and/or the lower electrode contact 18, the conductive pattern 12a and the lower electrode contact 18 may include tungsten and tungsten oxide, respectively.

In exemplary embodiments, the thermal treatment process may include the RTA process executed at a temperature of about 400° C. to about 600° C. for about one minute to about 10 minutes under an atmosphere including oxygen. Alternatively, the thermal treatment process may include the plasma treatment performed for about one minute to about 10 minutes under an atmosphere including oxygen by applying a power of about 20 W to about 100 W.

In an exemplary embodiment, the lower electrode contact 18 in the first opening 16 may have a high resistance without any deposition of a layer and etching of the layer. Thus, the lower electrode 18 may be obtained through a simplified process.

Figure 41:
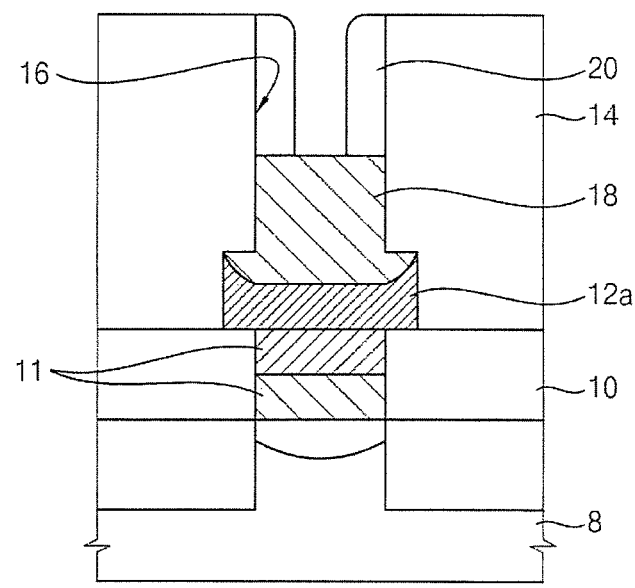

Referring to FIG. 41, a spacer formation layer is formed on the second insulating interlayer 14, the sidewall of the first opening 16 and the lower electrode contact 18. The spacer formation layer may comprise nitride such as silicon nitride. The spacer formation layer may reduce a width of the first opening 16. Thus, the first opening 16 may have a width reduced to a predetermined value by adjusting a thickness of the spacer formation layer.

The spacer formation layer is partially etched to form a spacer on the sidewall of the first opening 16. The spacer 20 may be obtained by an anisotropic etching process. The spacer 20 may have a width substantially the same as that of the spacer formation layer.

Figure 42:
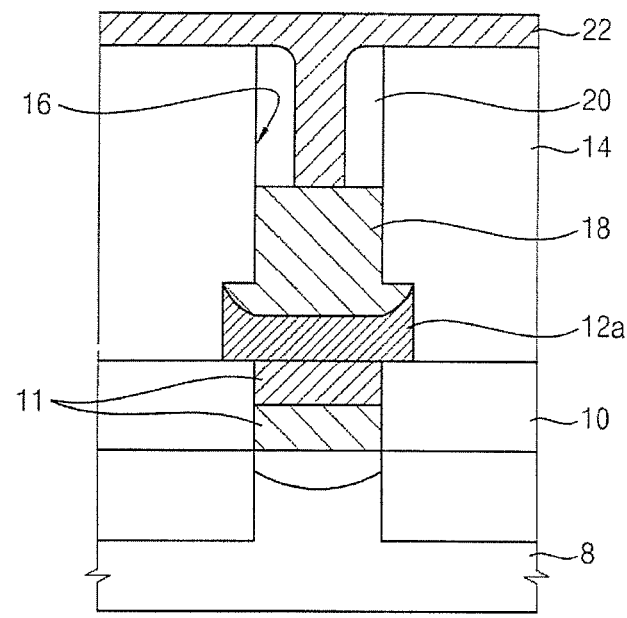

Referring to FIG. 42, a phase change material layer 22 is formed on the lower electrode contact 18 and the spacer 20 to fill up the first opening 16. The phase change material layer 22 may be formed using a chalcogenide compound, for example, an alloy of germanium-antimony-tellurium.

Because of the spacer 20, a contact area between the lower electrode contact 18 and the phase change material layer 22 is reduced. Therefore, a portion of the phase change material layer 22 in which phase transition occurs by the Joule heating effect may have a reduced area to thereby reducing a reset current in the phase change memory device. The first opening 16 where the phase change material layer 22 is disposed may have a decreased aspect ratio because the lower electrode contact 18 is provided in the first opening 16. Thus, the phase change material layer 22 may be easily formed in the first opening 16 without generating a void or a seam in the phase change material layer 22.

Figure 43:
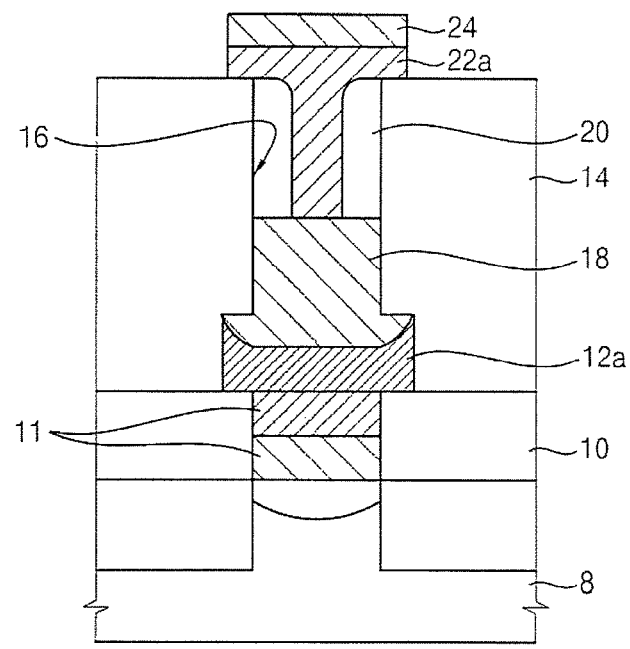

Referring to FIG. 43, an upper electrode layer is formed on the phase change material layer 22. The upper electrode layer may comprise metal nitride. For example, the upper electrode layer may include titanium nitride.

The upper electrode layer and the phase change material layer 22 are patterned to form a phase change structure 22a and an upper electrode 24. The phase change structure 22a is formed on the lower electrode contact 18 and the first insulating interlayer 14, and the upper electrode is disposed on the phase change structure 22a. Here, a lower portion of the phase change structure 22a is positioned in the first opening 16 and an upper portion of the phase change structure 22a is protruded from the second insulating interlayer pattern 14.

Figure 44:
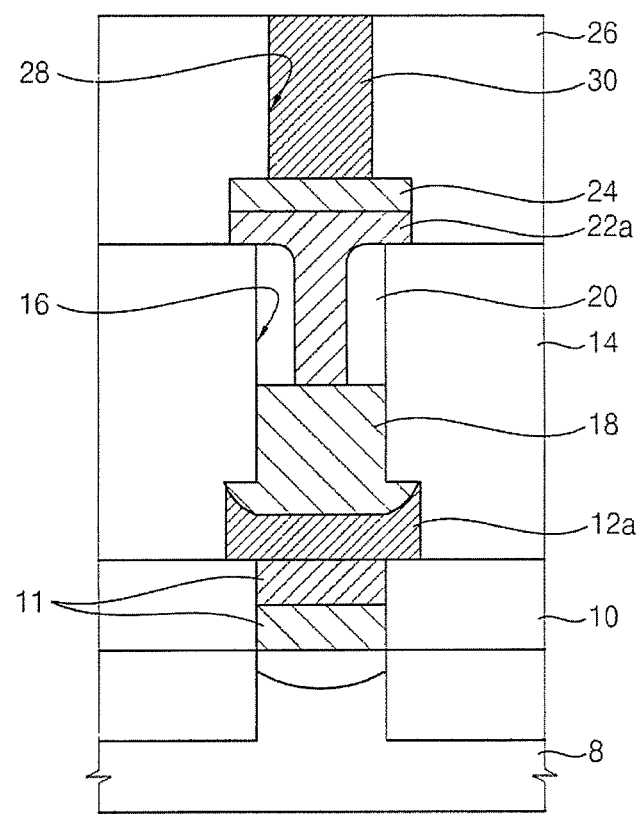

Referring to FIG. 44, a third insulating interlayer is formed on the second insulating interlayer pattern 14 to cover the upper electrode 24 and the phase change structure 22a. The third insulating interlayer is partially etched to form a second opening 28 that partially exposes the upper electrode 24. Hence, the third insulating interlayer is changed into a third insulating interlayer pattern 26 having the second opening 28. The second opening 28 may have a shape such as, for example, a contact hole.

A conductive material is deposited in the second opening 28 to form an upper electrode contact 30 in the second opening 28. The upper electrode contact 30 may comprise metal. For example, the upper electrode contact 30 may include tungsten. As a result, there is provided the phase change memory device having the lower electrode contact 18 that includes metal oxide.

Figure 45:
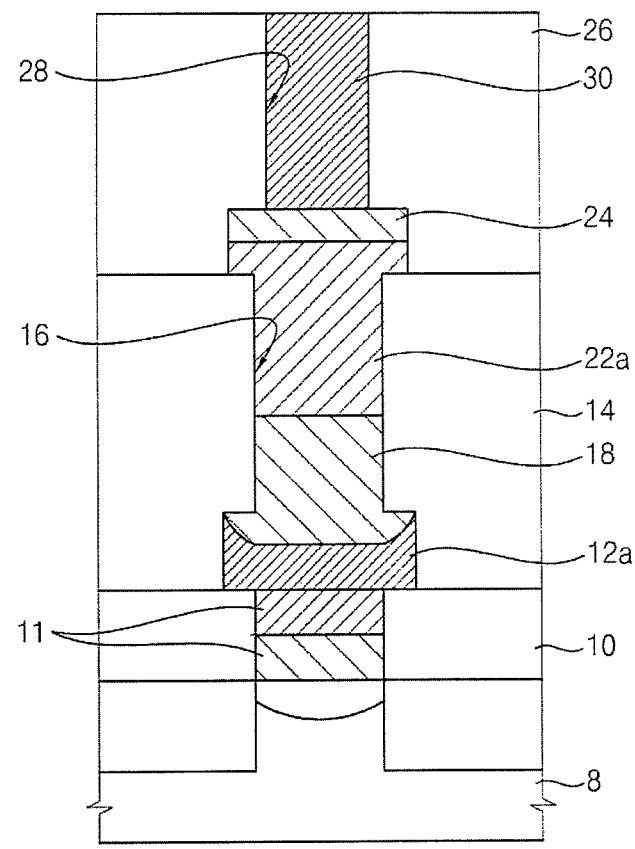
FIG. 45 is a cross sectional view illustrating a phase change memory device in accordance with an exemplary embodiment of the inventive concept.

FIG. 45 is a cross sectional view illustrating a phase change memory device in accordance with an exemplary embodiment of the inventive concept. The phase change memory device in FIG. 45 may have a configuration substantially the same as that of the phase change memory device described with reference to FIG. 38 except that a spacer is not provided on a sidewall of a first opening.

Referring to FIG. 45, a lower electrode contact 18 is provided in a first opening 16 formed through a second insulating interlayer pattern 14 over a substrate 8. The lower electrode contact 18 partially fills the first opening 16 and includes metal oxide.

A phase change structure 22a is disposed on the lower electrode contact 18. The phase change structure 22a may fully fill the first opening 16. The phase change structure 22a may have an upper surface substantially higher than an upper surface of the second insulating interlayer pattern 14. An upper electrode 24 is positioned on the phase change structure 22a.

A third insulating interlayer pattern 26 is disposed on the second insulating interlayer pattern 14, so that the upper electrode 24 and the phase change structure 22a are covered with the third insulating interlayer pattern 26.

A second opening 28 is formed through the third insulating interlayer pattern 26. The second opening 28 partially exposes the upper electrode 24. An upper electrode contact 30 is disposed in the second opening 28.

The phase change memory device in FIG. 45 does not include any spacer on a sidewall of the phase change structure 22a, so that a contact area between the phase change structure 22a and the lower electrode contact 18 may be substantially the same as a width of the first opening 16. Thus, the phase change memory device in FIG. 45 may be manufactured through simplified processes while ensuring desired characteristics.

Figure 46:
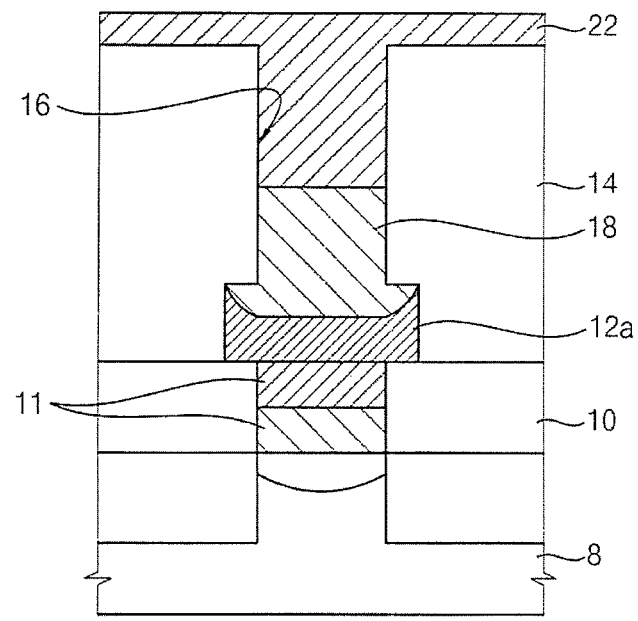
FIG. 46 is a cross sectional view illustrating a method of manufacturing the phase change memory device in FIG. 45.

FIG. 46 is a cross sectional view illustrating a method of manufacturing a phase change memory device according to an exemplary embodiment of the inventive concept.

In a method of manufacturing the phase change memory device in FIG. 45, the resultant structure having a configuration substantially the same as that described with reference to FIG. 40 may be provided through processes substantially the same as those described with reference to FIGS. 39 and 40.

Referring to FIG. 46, a phase change material layer 22 is formed on a second insulating interlayer pattern 14 to fill up a first opening 16 where a lower electrode contact 18 is formed. Here, no spacer is formed on a sidewall of the first opening 16.

Then, the phase change memory device in FIG. 45 may be obtained through processes substantially the same as those described with reference to FIGS. 43 and 44.

Figure 47:
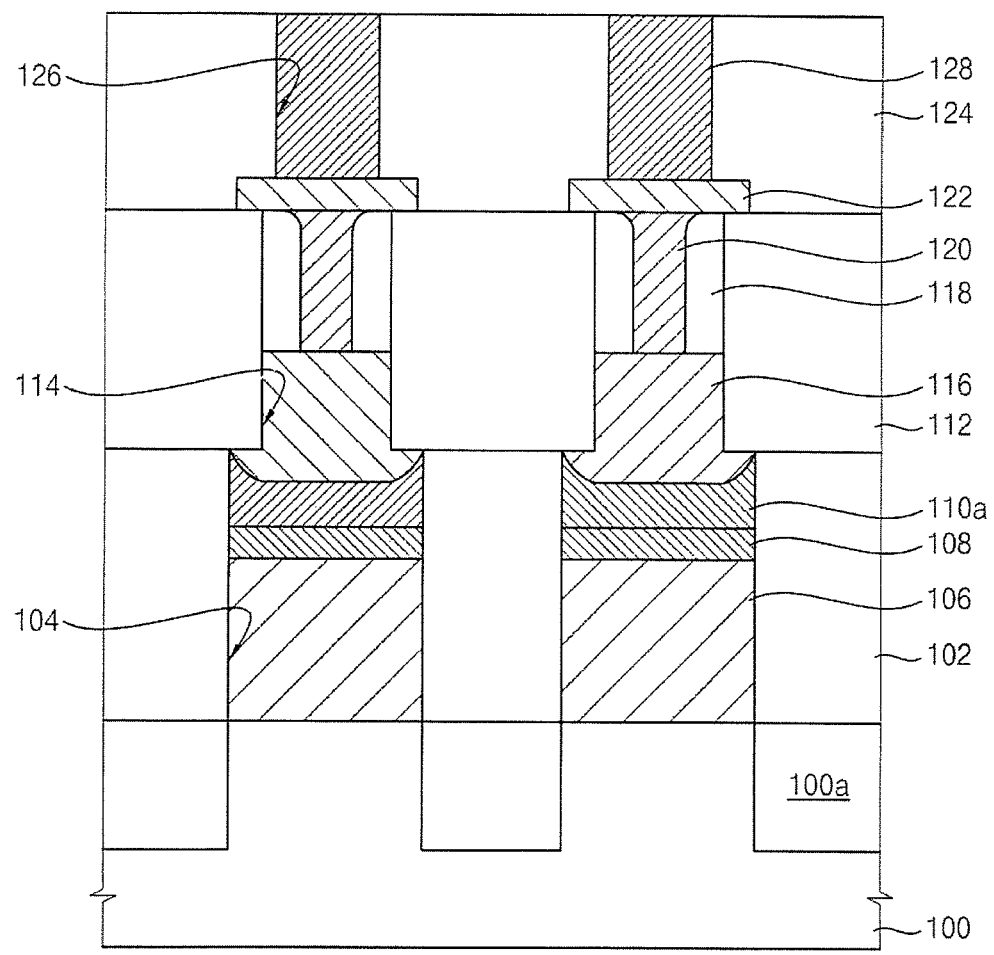
FIG. 47 is a cross sectional view illustrating a phase change memory device in accordance with an exemplary embodiment of the inventive concept.

FIG. 47 is a cross sectional view illustrating a phase change memory device in accordance with an exemplary embodiment of the inventive concept. The phase change memory device in FIG. 47 may have a configuration in which unit cells are disposed as an array structure.

Referring to FIG. 47, a first insulating interlayer pattern 102 is disposed on a substrate 100 where an isolation region 100a and an active region are defined. First openings 104 are formed through the first insulating interlayer pattern 102. The first openings 104 may be disposed at portions of the substrate 100 where unit cells of the phase change memory device are formed. The first openings 104 may be repeatedly arranged on the substrate 100. Each of the first openings 104 may have a shape of a contact hole. The first opening 104 exposes predetermined portions of the substrate 100.

P-N diodes 106 are disposed in the first openings 104, respectively. In an exemplary embodiment, vertical P-N diodes 106 may be located in the first openings 104. Each of the vertical P-N diodes 106 may include, for example, polysilicon. The P-N diodes 106 may partially fill up the first openings 104. For example, the P-N diodes 106 may fill up lower portions of the first openings 104.

Metal silicide patterns 108 are disposed on the P-N diodes 106. The metal silicide patterns 108 reduce contact resistances between the P-N diodes 106 and conductive patterns 110a. Each of the metal silicide patterns 108 may include, for example, cobalt silicide, titanium silicide, nickel silicide, or tungsten silicide.

The conductive patterns 110a are disposed on the metal silicide patterns 108. Each of the conductive patterns 110a may include metal having a small resistance. Here, the conductive patterns 110a may have upper surfaces substantially lower than upper ends of the first openings 106. The conductive patterns 110a may have upper portions including rounded recesses. That is, ends of the upper portions of the conductive patterns 110a may be higher than centers of the upper portions of the conductive patterns 110a. In an exemplary embodiment, each of the conductive patterns 110a may include tungsten.

A second insulating interlayer pattern 112 is provided on the first insulating interlayer pattern 102 and the conductive patterns 110a. The second insulating interlayer pattern 112 may include oxide such as, for example, silicon oxide. Second openings 114 are formed through the second insulating interlayer pattern 112. The second openings 114 partially expose the conductive patterns 110a, respectively. Each of the second openings 114 may have a shape of a contact hole. In an exemplary embodiment, the second openings 114 may have widths substantially smaller than those of the conductive patterns 110a.

Lower electrode contacts 116 are disposed on the conductive patterns 110a in the second openings 114. Each of the lower electrode contacts 116 may include metal oxide generated from the conductive patterns 110a. The lower electrode contacts 116 may partially fill up the second openings 114. For example, the lower electrode contacts 116 may fill up lower portions of the second openings 114.

The lower electrode contacts 116 may be formed by oxidizing the conductive patterns 110a. For example, metal oxide generated from the conductive patterns 110a may be upwardly grown in the second openings 114, so that the lower electrode contacts 116 including metal oxides are formed in the second openings 114. The conductive patterns 110a may have rounded recesses formed thereon, and the lower electrode contacts 116 may have rounded protrusions corresponding to the rounded recesses of the conductive patterns 110a. In an exemplary embodiment, each of the conductive patterns 110a may include tungsten, and thus each of the lower electrode contacts 116 may include tungsten oxide.

Spacers 118 are disposed on sidewalls of the second openings 114. The spacers 118 contact the lower electrode contacts 116. The second openings 114 may have widths reduced by the formations of the spacers 118. Each of the spacers 118 may include nitride or oxynitride. For example, each of the spacers 118 may include silicon nitride or silicon oxynitride.

The phase change structures 120 are disposed on the lower electrode contacts 116 to completely fill up the second openings 114. The phase change structures 120 may include chalcogenide compounds. Upper surfaces of the phase change structure 120 filling the second openings 114 and an upper surface of the second insulating interlayer pattern 112 may be disposed on substantially the same plane. Thus, the phase change structures 120 may not protrude over the second insulating interlayer pattern 112.

Upper electrodes 122 are disposed on the phase change structures 120, respectively. Each of the upper electrodes 122 may include metal nitride such as titanium nitride. The upper electrodes 122 may have widths substantially larger than those of the phase change structures 120.

A third insulating interlayer pattern 124 is disposed on the second insulating interlayer pattern 112. The third insulating interlayer pattern 124 covers the upper electrodes 122 and the phase change structures 120. Third openings 126 are formed through the third insulating interlayer pattern 124. The third openings 126 partially expose the upper electrodes 122. Upper electrode contacts 128 are disposed in the third openings 126, respectively. Each of the upper electrode contacts 30 may include metal such as, for example, tungsten.

FIGS. 48 to 51 are cross sectional views illustrating a method of manufacturing a phase change memory device according to an exemplary embodiment of the inventive concept. The phase change memory device illustrated in FIG. 47 may have a configuration in which first and second openings are provided in portions of a substrate where unit cells of the phase change memory device are formed.

Figure 48:
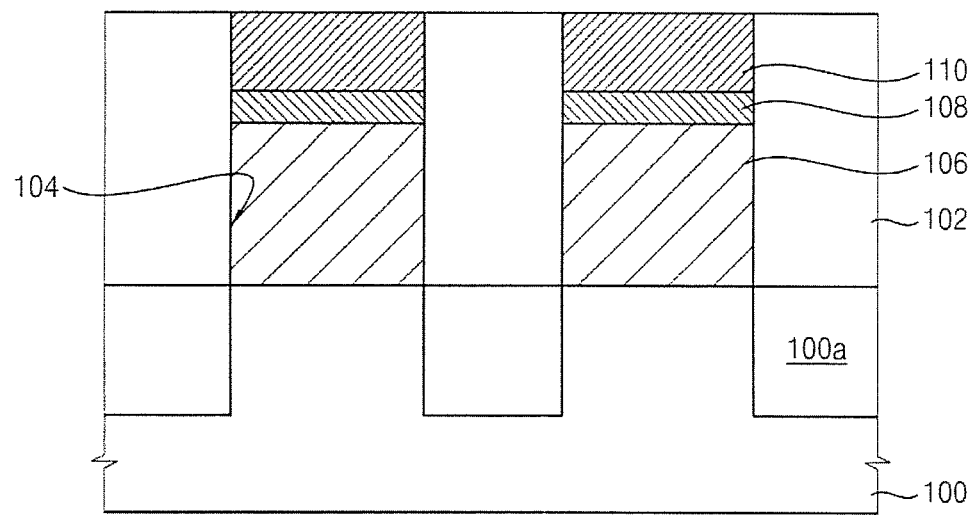
FIGS. 48 to 51 are cross sectional views illustrating a method of manufacturing the phase change memory device in FIG. 47.

Referring to FIG. 48, a shallow trench isolation process is performed about a substrate 100 to define an isolation region 100*a* and an active region of the substrate 100. An oxide layer is formed on the substrate 100 having the isolation region 100*a* and the active region. The oxide layer is partially etched to form first openings 104 while changing the oxide layer into a first insulating interlayer pattern 102. The first openings 104 may be formed at portions of the substrate 100 where the unit cells are formed.

P-N diodes 106 are formed in the first opening 104 of the first insulating interlayer pattern 102. Each of the P-N diodes 106 may include polysilicon and may have a vertical type.

In the formations of the P-N diodes 106, a polysilicon layer may be formed in the first openings 104, and then the polysilicon layer may be partially etched. Impurities may be doped into the polysilicon layer in-situ or out-situ. Hence, the P-N diodes 106 are formed in the first openings 104. In an example embodiment, N type impurities may be doped into a lower portion of the polysilicon layer in the first openings 104 where P type impurities may be implanted into an upper portion of the polysilicon layer in the first openings 104.

Metal silicide patterns 108 are formed on the P-N diodes 106. The metal silicide patterns 108 may be formed on the P-N diodes 106 by forming a metal layer on the P-N diodes 106 and thermally treating the metal layer and the P-N diodes 106. Thus, the metal silicide patterns 108 may be obtained in accordance with the reaction between metal in the metal layer and silicon in the P-N diodes 106. Each of the metal silicide patterns 108 may include cobalt silicide, titanium silicide, tungsten silicide, nickel silicide, etc.

Preliminary conductive patterns 110 are formed on the metal silicide patterns 108. The preliminary conductive patterns 110 may fill up the first openings 104. Each of the preliminary conductive patterns 110 may be formed using metal. For example, each of the preliminary conductive patterns 110 may be formed using tungsten.

In the formations of the preliminary conductive patterns 110, a metal layer may be formed on the metal silicide patterns 108 and the first insulating interlayer pattern 102 to fill up the first openings 104, and then the metal layer may be partially removed by a CMP process until the first insulating interlayer pattern 102 is exposed. Thus, the preliminary conductive patterns 110 may be formed on the metal silicide patterns 108.

Figure 49:
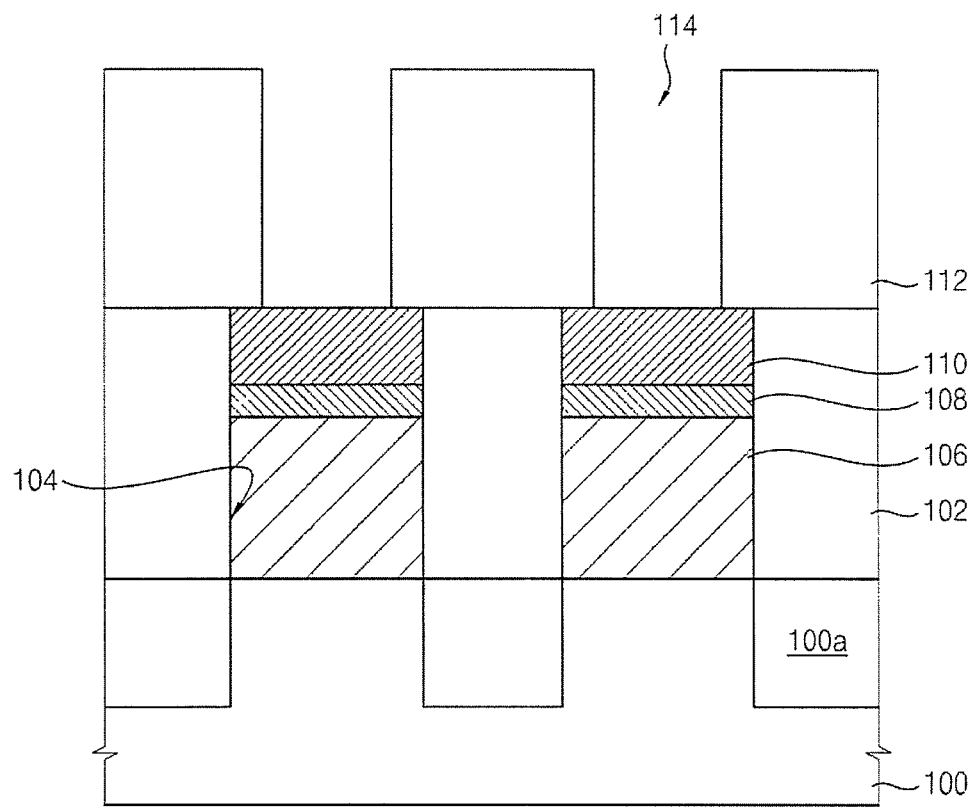

Referring to FIG. 49, a second insulating interlayer including oxide is formed on the first insulating interlayer pattern 102 to cover the preliminary conductive patterns 110. The second insulating interlayer may be formed using silicon oxide.

The second insulating interlayer is partially etched to form second openings 114 partially exposing the preliminary conductive patterns 110 while changing the second insulating interlayer into a second insulating interlayer pattern 112. The second openings 114 may be formed by a photolithography process. In an example embodiment, the second openings 114 may have widths substantially smaller than those of the preliminary conductive patterns 110. Thus, the second openings 114 may partially expose the preliminary conductive patterns 110.

Figure 50:
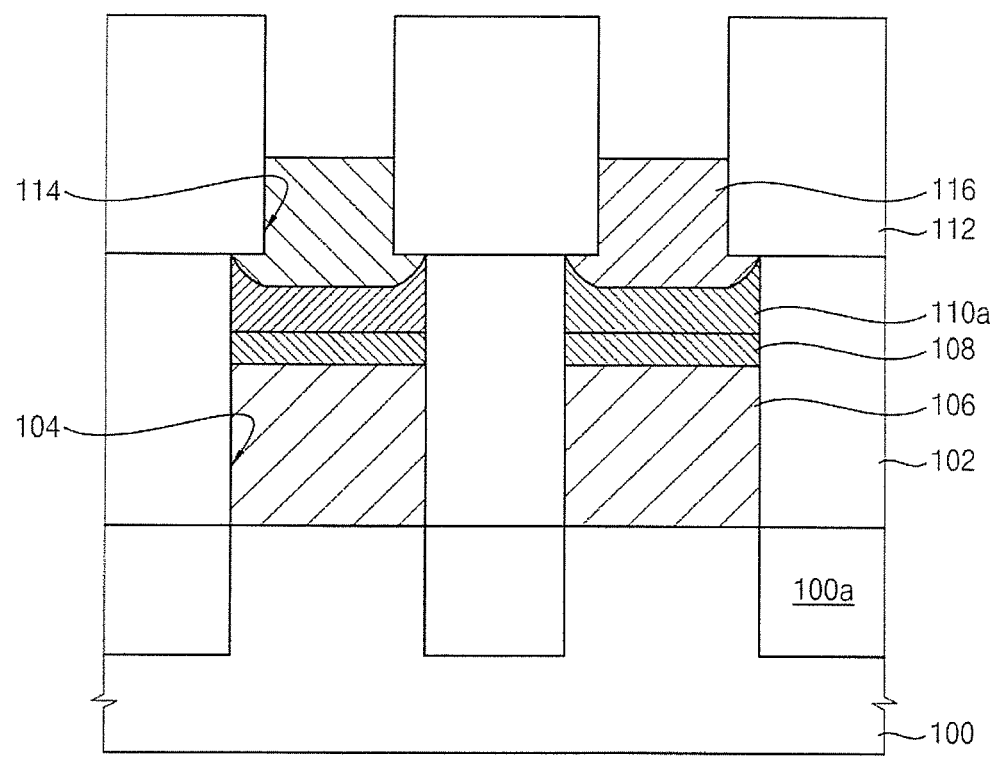

Referring to FIG. 50, the preliminary conductive patterns 110 exposed by the second openings 114 are thermally treated under an atmosphere including oxygen, so that lower electrode contacts 116 are formed on the preliminary conductive patterns 110. The lower electrode contacts 116 may partially fill the second openings 114.

In the formations of the lower electrode contacts 116, upper portions of the preliminary conductive patterns 110 may be reacted with oxygen, and thus metal oxides may be upwardly grown in the second openings 114. Therefore, the lower electrode contacts 116 including metal oxides may be generated from the preliminary conductive patterns 110. Here, the preliminary conductive patterns 110 are changed into conductive patterns 110*a*. The lower electrode contacts 116 may have resistances substantially larger than those of the conductive patterns 110*a*. When the preliminary conductive patterns 110 include tungsten, the lower electrode contacts 116 include tungsten oxide.

After thermally treating the preliminary conductive patterns 110, the conductive patterns 110*a* may have upper portions including rounded recesses whereas the lower electrode contacts 116 may have lower portions including protrusions corresponding to the rounded recesses of the conductive patterns 110*a*. The conductive patterns 110*a* and the lower electrode contacts 116 may be obtained by a process substantially the same as or substantially similar to that described with reference to FIG. 36.

Figure 51:
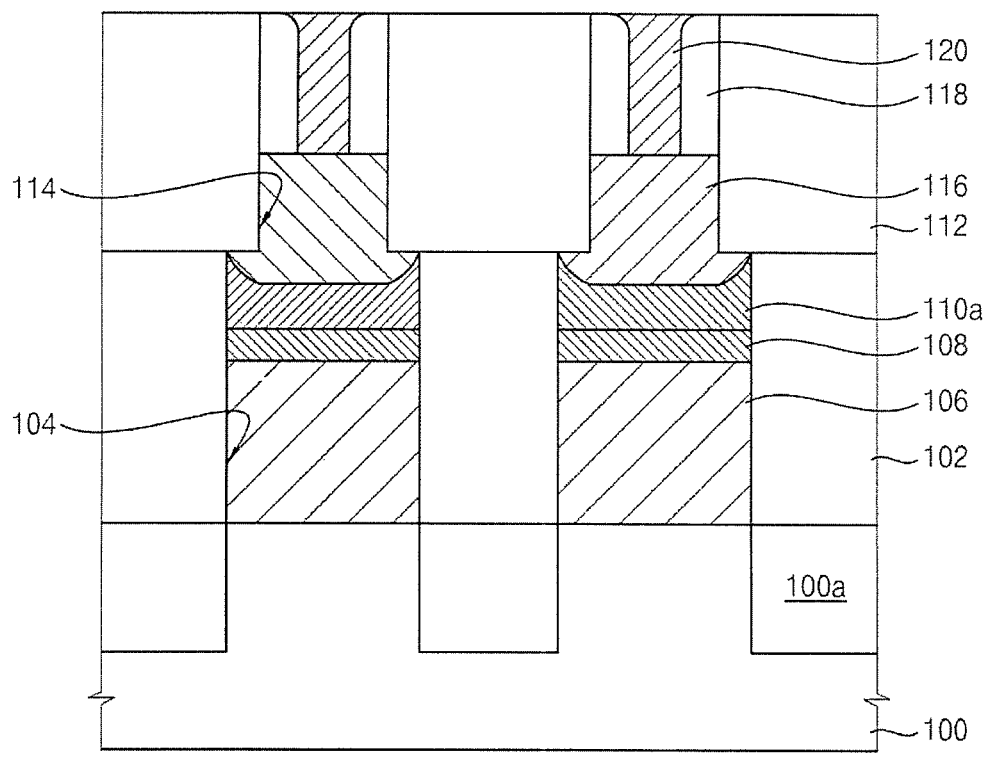

Referring to FIG. 51, spacers 118 are formed on sidewalls of the second openings 114. Phase change material layer is formed on the lower electrode contacts 116 to fully fill up the second openings 114. The phase change material layer may be formed using a chalcogenide compound, for example, an alloy of germanium-antimony-tellurium.

The phase change material layer is partially removed until the second insulating interlayer pattern 112 is exposed, so that phase change structures 120 are formed in the second openings 114. Upper surfaces of the phase change structures 120 and an upper surface of the second insulating interlayer pattern 112 may be located on a substantially same plane.

As illustrated in FIG. 47, an upper electrode layer is formed on the phase change structures 120 and the second insulating interlayer patterns 112. The upper electrode layer is patterned to form upper electrodes 122 on the phase change structures 120.

A third insulating interlayer is formed on the second insulating interlayer pattern 112 to cover the upper electrodes 122. The third insulating interlayer is partially etched to form third openings 126 that partially expose the upper electrodes 122. Thus, the third insulating interlayer is changed into a third insulating interlayer pattern 124 having the third openings 126. Each of the third openings 126 may have a shape, for example, a contact hole.

A conductive material is deposited in the third openings 126 to form upper electrode contacts 128 on the upper electrodes 122 in the third openings 126. Each of the upper electrode contacts 128 may be formed using metal. For example, each of the upper electrode contacts 128 may be formed using tungsten.

Figure 52:
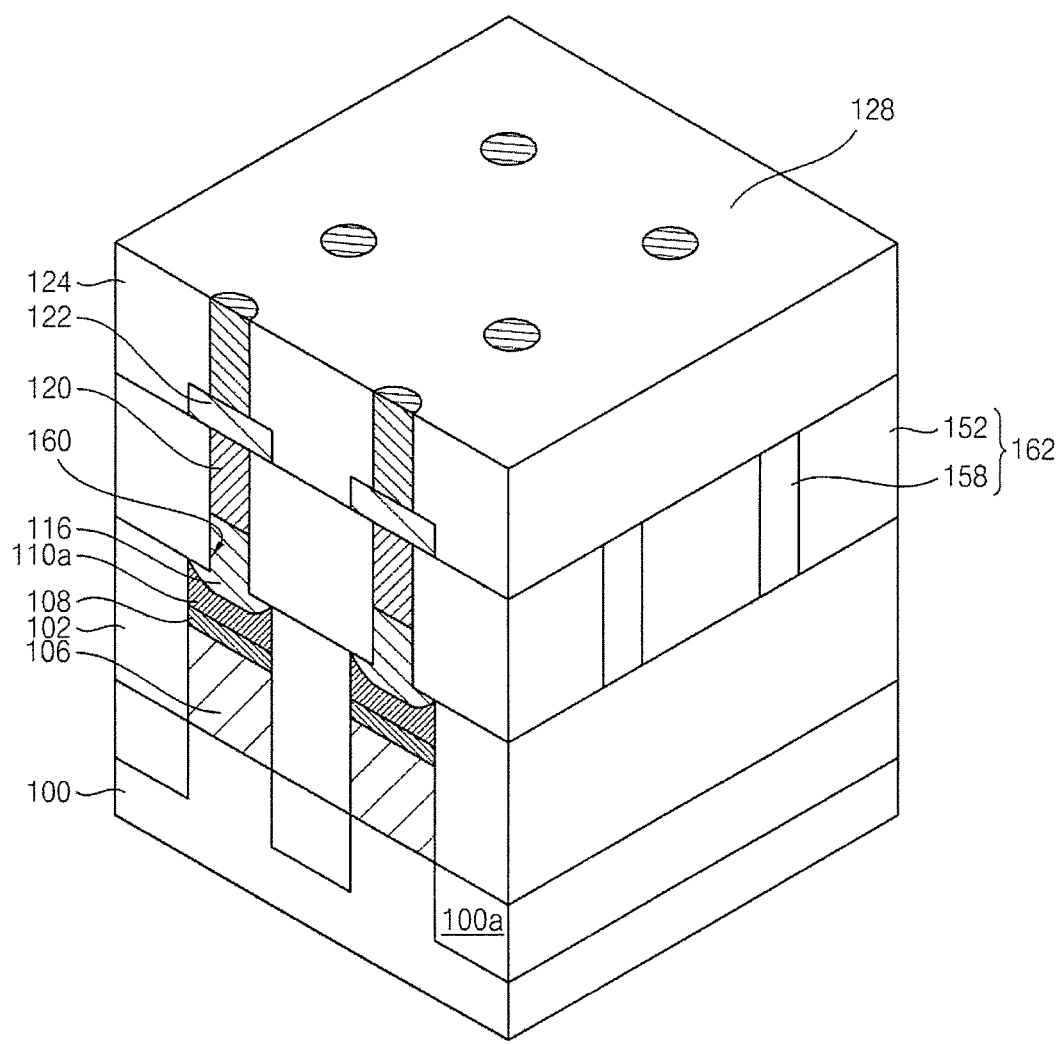
FIG. 52 is a perspective view illustrating a phase change memory device in accordance with an exemplary embodiment of the inventive concept.

FIG. 52 is a perspective view illustrating a phase change memory device in accordance with a twenty-first embodiment of the inventive concept. The phase change memory device in FIG. 52 may have a configuration substantially the same as or substantially similar to that of the phase change memory device described with reference to FIG. 47 except that a vertically stacked structure of a dashed shape including a lower electrode contact and a phase change structure, and a first insulating interlayer pattern.

Referring to FIG. 52, vertically stacked structure including lower electrode contact 116 and phase change structures 120 may have rectangular upper surfaces, and may be repeatedly arranged as dashed shapes over a substrate 100. Therefore, numerous vertically stacked structures may be provided with a considerably small area of the substrate 100.

The first insulating interlayer pattern 162 may enclose the lower electrode contacts 116 and the phase change structures 120. The first insulating interlayer pattern 162 may include nitride, for example, silicon nitride.

In an example embodiment, any spacers may not be provided on the lower electrode contacts 116 and sidewalls of second openings 160 as illustrated in FIG. 52 because the second openings 160 may have sufficiently small widths. In another example embodiment, spacers may be additionally positioned on the lower electrode contacts 116 and sidewalls of second openings 160.

FIGS. 53 to 58 are cross sectional views illustrating a method of manufacturing the phase change memory device in FIG. 52.

Figure 53:
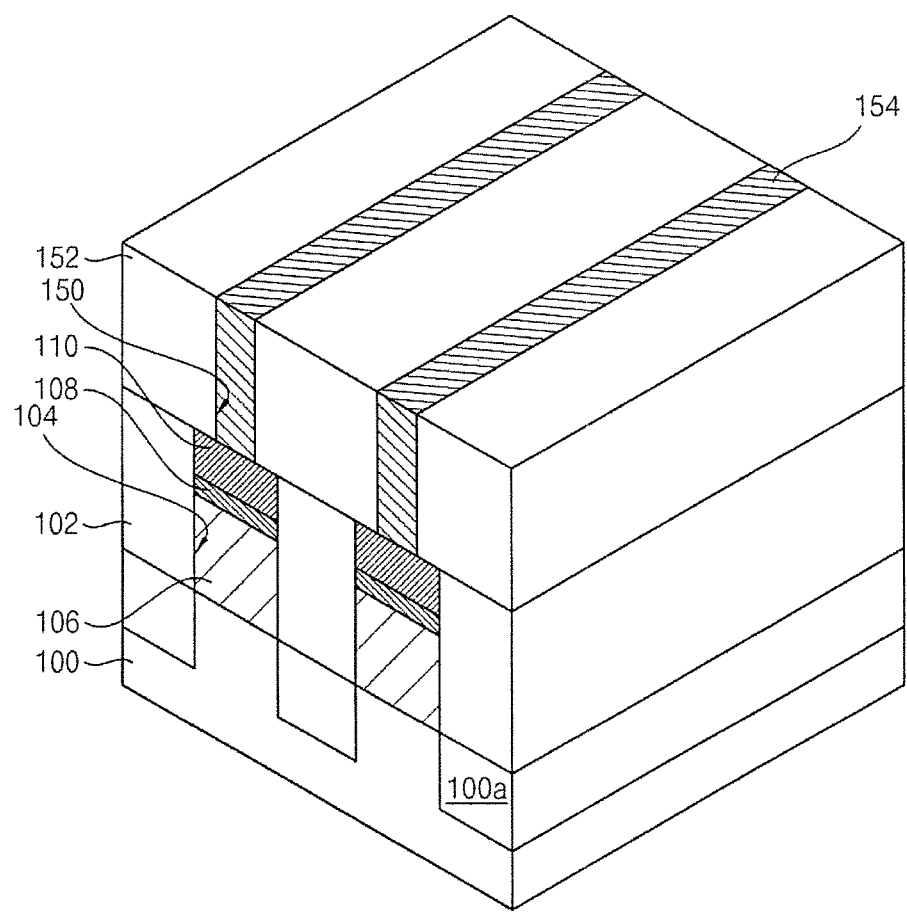
FIGS. 53 to 58 are cross sectional views illustrating a method of manufacturing the phase change memory device in FIG. 52.
Figure 54:
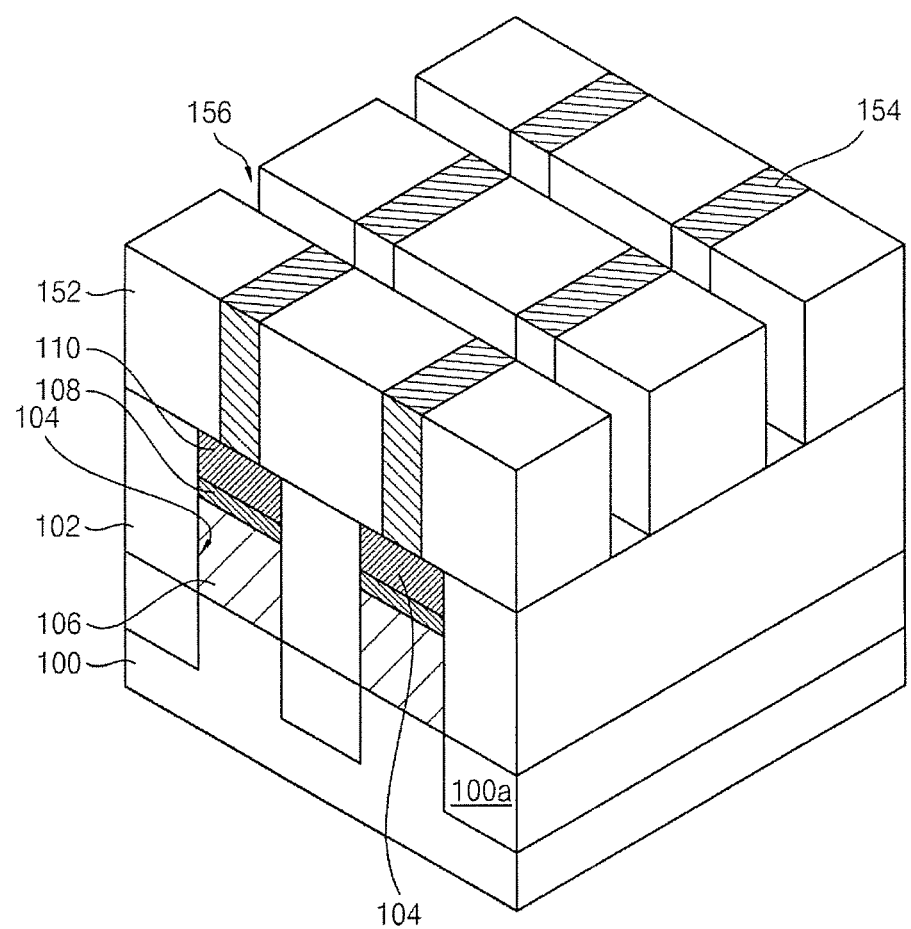

Referring to FIG. 53, the resultant structures having constructions substantially the same as or substantially similar to those described with reference to FIG. 52 may be obtained over a substrate 100 through processes substantially the same as those described with reference to FIG. 51.

A first insulation layer is formed on the preliminary conductive patterns 110 and a first insulating interlayer pattern 102. The first insulation layer may be formed using nitride such as silicon nitride.

The first insulation layer is partially etched to form first trenches 150 exposing the preliminary conductive patterns 110. Each of the first trenches 150 may extend along a first direction. Hence, first insulation layer patterns 152 having the first trenches 150 are formed on the first insulating interlayer pattern 102.

A second insulation layer is formed on the preliminary conductive patterns 110 in the first trenches 150. The second insulation layer may be formed using a material having a relatively high etching selectivity relative to the first insulation layer patterns 152. For example, the second insulation layer may be formed using oxide such as silicon oxide.

The second insulation layer is partially removed until the first insulation layer patterns 152 are exposed. The second insulation layer may be partially removed by a CMP process and/or an etch-back process. Therefore, second insulation layer patterns 154 are formed between the first insulation layer patterns 152. Each of the second insulation layer patterns 154 may extend along a second direction substantially perpendicular to the first direction.

Mask patterns are formed on the first and the second insulation layer patterns 152 and 154. The mark patterns may extend in a second direction substantially perpendicular to the first direction. Each of the mask patterns may have a line shape. Further, the mask patterns may be regularly repeated on the first and the second insulation layer patterns 152 and 154.

Using the mask patterns as etching masks, the first and the second insulation layer patterns 152 and 154 are partially etched until the first insulating interlayer pattern 102 is exposed. Second trenches 156 are formed on the first insulating interlayer pattern 102 in accordance with partially etching the first and the second insulation layer patterns 152 and 154. Here, the preliminary conductive patterns 110 are not exposed. Each of the first and the second insulation layer patterns 152 and 154 may have a circular or polygonal pillar shape.

Figure 55:
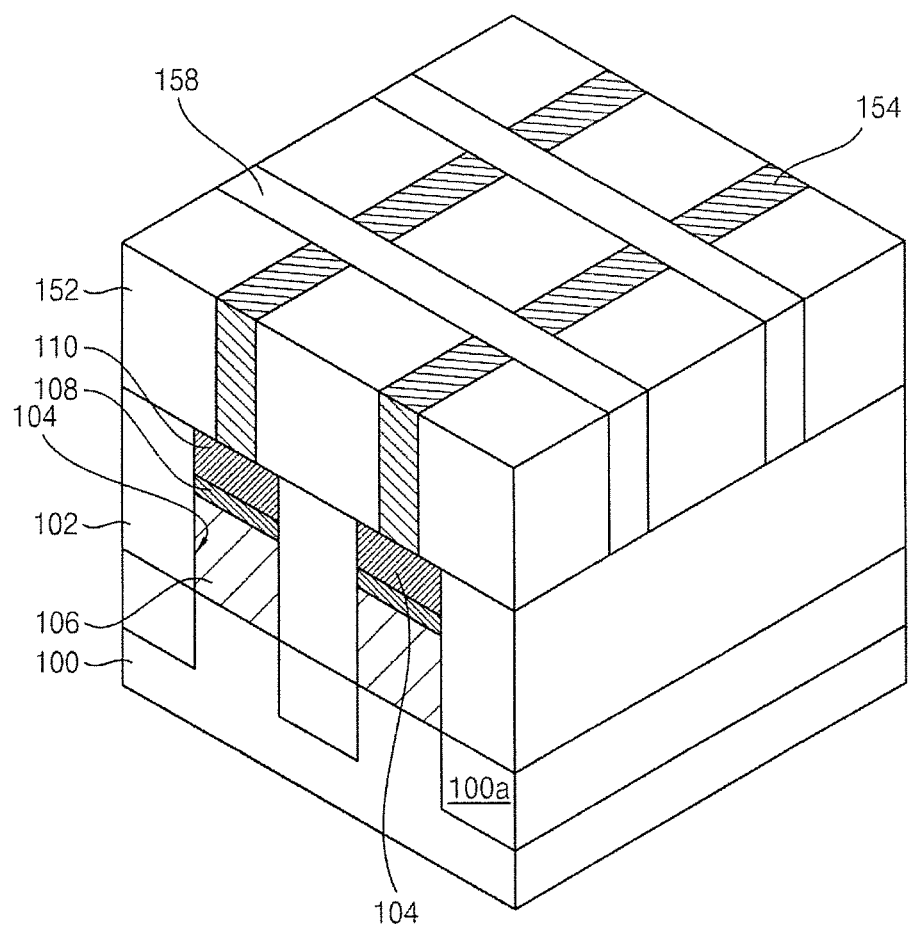

Referring to FIG. 55, a third insulation layer is formed on the first and the second insulation layer patterns 152 and 154. The third insulation layer may be formed using nitride, for example, silicon nitride. The third insulation layer is partially removed until the first and the second insulation layer patterns 152 and 154 are exposed, so that third insulation layer patterns 158 are formed in the third trenches 156.

After forming the third insulation layer patterns 158, the first and the third insulation layer patterns 152 and 158 including substantially the same materials may surround the second insulation layer patterns 154 including materials different from those of the first and the third insulation layer patterns 152 and 158.

Figure 56:
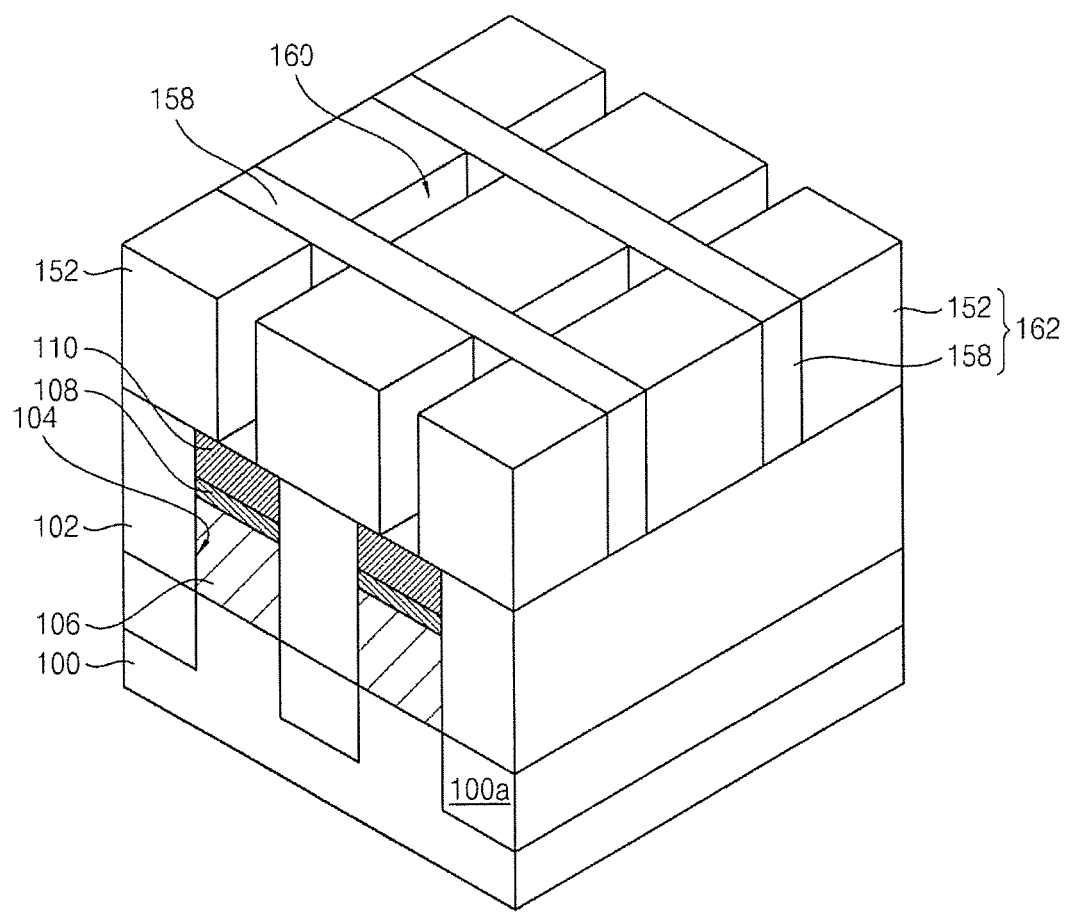

Referring to FIG. 56, the second insulation layer patterns 154 are selectively removed from the first insulating interlayer pattern 102, such that second openings 160 are formed between the first and the third insulation layer patterns 152 and 158. The second openings 160 partially expose the preliminary conductive patterns 110. As a result, a second insulating interlayer pattern 162 is provided on the first insulating interlayer pattern 102. The second insulating interlayer pattern 162 includes the first insulation layer patterns 152, the third insulation layer patterns 158 and the second openings 160. Each of the second openings 160 may have a shape of a contact hole. Further, the second openings 160 may extend along both of the first and the second directions.

In exemplary embodiments, the second insulation layer patterns 154 may be removed by a wet etching process or a dry etching process. To prevent etched damages to adjacent first and third insulation layer patterns 152 and 158 caused by the plasma in the dry etching process, the second insulation layer patterns 154 may be advantageously etched by the wet etching process.

According to an exemplary embodiment, the second openings 160 may have widths substantially smaller than those of the conventional contact hole formed by a photolithography process. The second openings 160 may be arranged in a dash structure on a plane.

Figure 57:
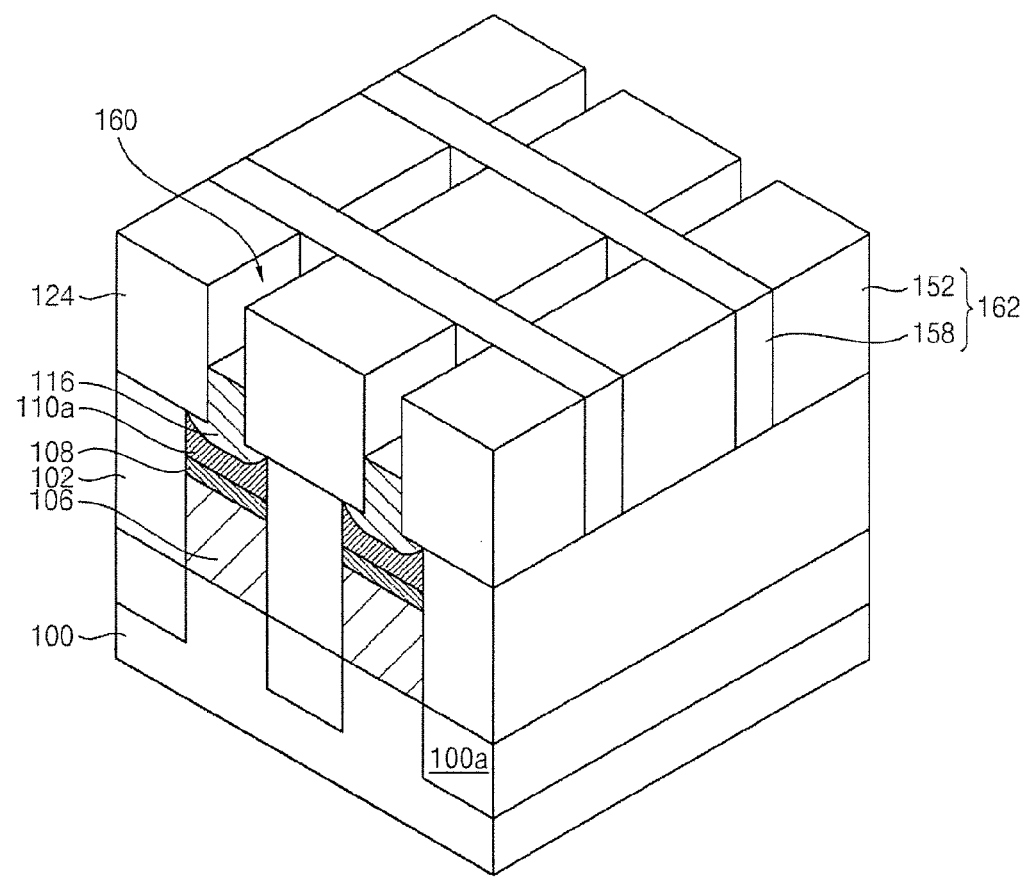

Referring to FIG. 57, the preliminary conductive patterns 110 are partially oxidized by an oxidation process so that metal oxides generated from the preliminary conductive patterns 110 are upwardly grown in the second openings 160. Thus, lower electrode contacts 116 are formed in the second openings 160. In the oxidation process, the preliminary conductive patterns 110 are changed into conductive patterns 110a having upper portions including rounded recess, and the lower electrode contacts 116 may have lower portions including protrusions corresponding to the recesses of the conductive patterns 110a. The conductive patterns 110 and the lower electrode contacts 116 may be obtained through processes substantially the same as or substantially similar to those described with reference to FIG. 40.

Figure 58:
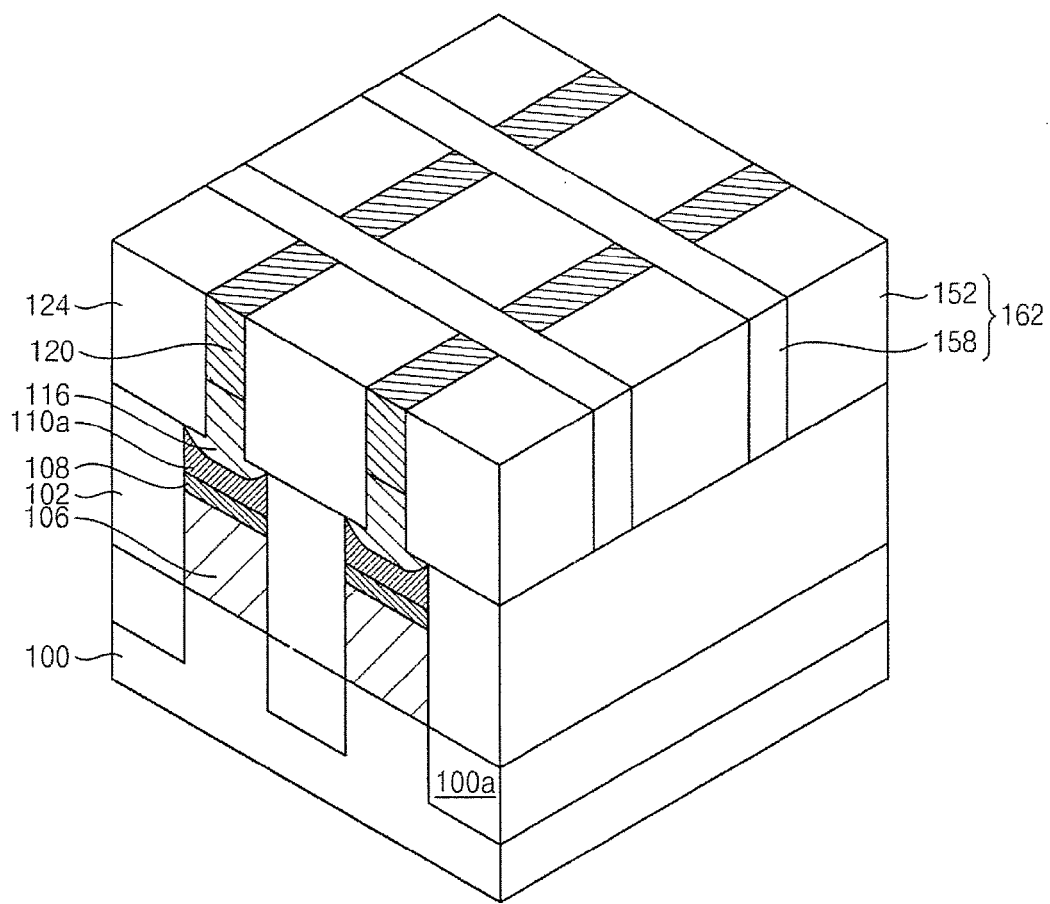

Referring to FIG. 58, a phase change material layer is formed on the lower electrode contacts 116 to fill up the second openings 160, and then the phase change material layer is partially removed until the second insulating interlayer pattern 162 is exposed. Hence, phase change structures 120 filling the second openings 160 are formed on the lower electrode contacts 116.

In an exemplary embodiment, the second openings 160 may have relatively small widths, so that any spacers may not be formed on sidewalls of the second openings 160. However, spacers may be additionally provided on the sidewalls of the second openings 160 to adjust the widths of the second openings 160.

Referring to FIG. 53, upper electrodes 122 are formed on the phase change structures 120. A third insulating interlayer pattern 124 having third openings are formed on the second insulating interlayer pattern 162 to cover the upper electrodes 122. Then, upper electrode contacts 128 are formed on the upper electrode 122 in the third openings. Therefore, a phase change memory device having a high integration degree may be manufactured.

Figure 59:
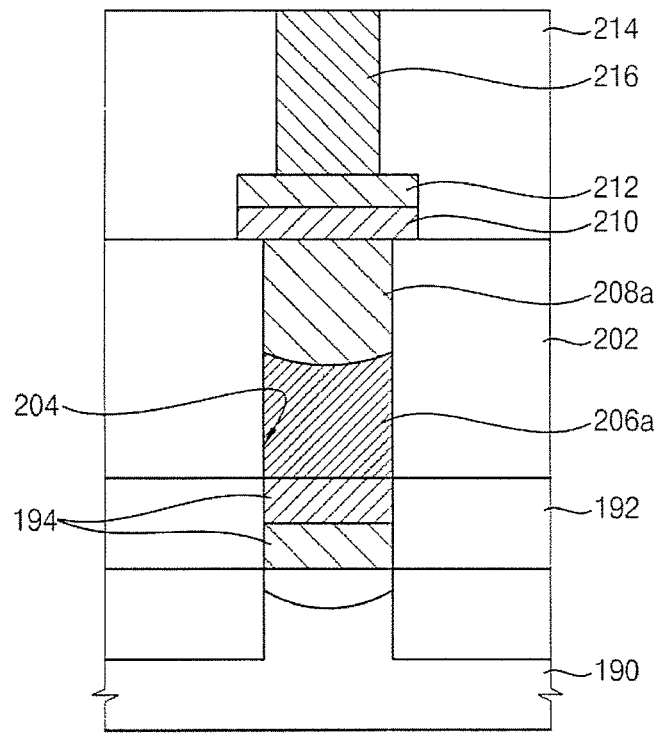
FIG. 59 is a cross sectional view illustrating a phase change memory device in accordance with an exemplary embodiment of the inventive concept.

FIG. 59 is a cross sectional view illustrating a phase change memory device in accordance with an exemplary embodiment of the inventive concept.

Referring to FIG. 59, a first insulating interlayer 192 and a P-N diode 194 are provided on a substrate 190. A second insulating interlayer pattern 202 is formed on the first insulating interlayer 192. The second insulating interlayer pattern 202 includes a first opening 204 that exposes the P-N diode 194. The second insulating interlayer pattern 202 may include nitride such as silicon nitride, or oxide like silicon oxide.

A first lower electrode contact 206a is disposed on the P-N diode 194 to partially fill up the first opening 204. The first lower electrode contact 206a may include metal. A second lower electrode contact 208a is positioned on the first lower electrode contact 206a to completely fill the first opening 204. The second lower electrode contact 208a may include metal oxide generated from metal in the first lower electrode contact 206a. In an exemplary embodiment, the first and the second lower electrode contacts 206a and 208a may include tungsten and tungsten oxide, respectively.

A phase change structure 210 is formed on the second lower electrode contact 208a and the second insulating interlayer pattern 202. An upper electrode 212 is disposed on the phase change structure 202. The upper electrode 212 may include, for example, metal nitride.

A third insulating interlayer pattern 214 covering the upper electrode 212 is disposed on the second insulating interlayer pattern 202. A second opening is provided through the third insulating interlayer pattern 214. The second opening at least partially exposes the upper electrode 212. An upper electrode contact 216 is disposed on the upper electrode 212 in the second opening.

According to exemplary embodiments, the phase change memory device may have improved operation characteristics because the second lower electrode contact contacting the phase change structure has a large resistance.

Figure 60:
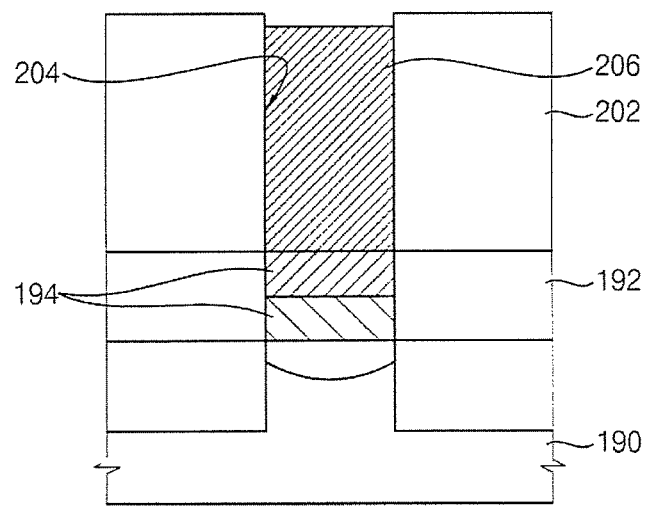
FIGS. 60 to 62 are cross sectional views illustrating a method of manufacturing the phase change memory device in FIG. 59.
Figure 61:
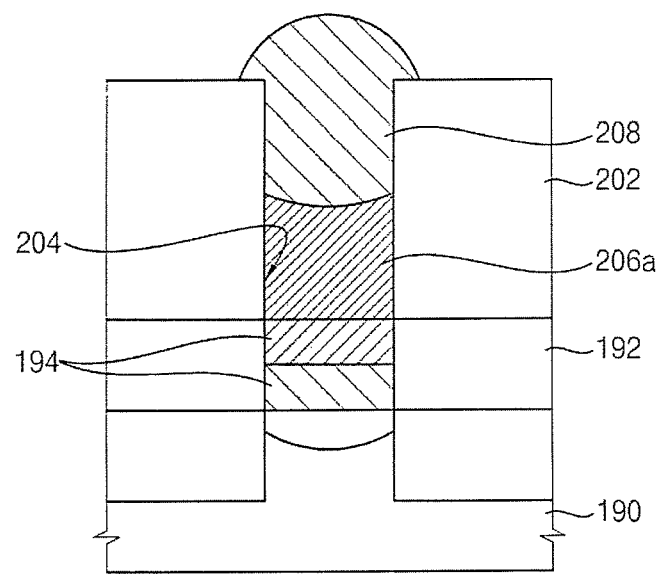
Figure 62:
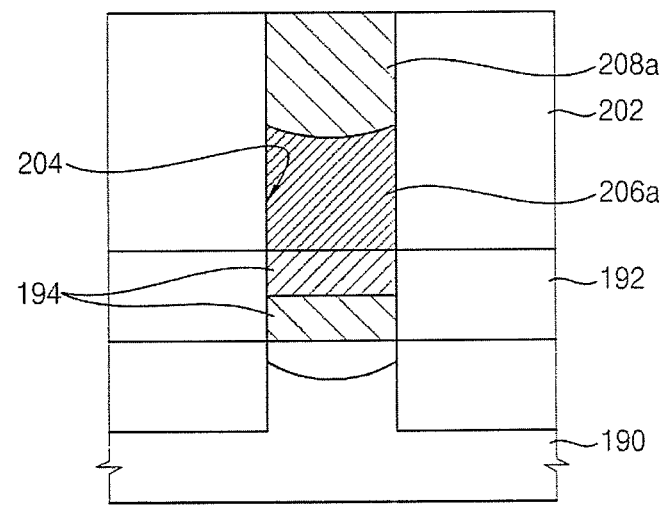

FIGS. 60 to 62 are cross sectional views illustrating a method of manufacturing a phase change memory device according to an exemplary embodiment of the inventive concept.

Referring to FIG. 60, a first insulating interlayer 192 and a P-N diode 194 are formed on a substrate 190. The P-N diode 194 is formed on the substrate 190 through the first insulating interlayer 192. A second insulating interlayer is formed on the first insulating interlayer 192, and then the second insulating interlayer is partially removed. Thus, a second insulating interlayer pattern 202 including a first opening 204 is formed on the first insulating interlayer 192. The first opening 204 exposes the P-N diode 194.

A first metal layer is formed on the P-N diode 194 and the second insulating interlayer pattern 202 to partially fill up the first opening 204. The first metal layer may be formed using tungsten. A preliminary lower electrode contact 206 is formed in the first opening 204 by partially removing the first metal layer. The preliminary lower electrode contact 206 may have an upper surface substantially lower than an upper end of the first opening 204. Alternatively, the upper surface of the preliminary lower electrode contact 206 and the upper end of the first opening 204 may be located on a substantially same plane.

Referring to FIG. 61, the preliminary lower electrode contact 206 is thermally treated under an atmosphere including oxygen, so that a preliminary second lower electrode contact 208 is formed on a first lower electrode contact 206a while changing the preliminary lower electrode contact 206 into the first lower electrode contact 206a. The preliminary second lower electrode contact 208 includes metal oxide generated from metal in the preliminary lower electrode contact 206.

In an exemplary embodiment, the first lower electrode contact 206a may have an upper surface substantially lower than the upper end of the first opening 204 because the preliminary lower electrode contact 206 is oxidized to form the preliminary second lower electrode contact 208. The preliminary second lower electrode contact 208 may be protruded over the first opening 208 because of the oxidation process performed about the preliminary lower electrode contact 206. That is, the preliminary lower electrode contact 206 has the upper surface substantially the same or substantially lower than the upper end of the first opening 204, so that the preliminary second lower electrode contact 208 may be protruded from the first opening 204 by isotropically growing metal oxide from the preliminary lower electrode contact 206.

Referring to FIG. 62, the preliminary second lower electrode contact 208 is partially removed until the second insulating interlayer pattern 202 is exposed, such that a second lower electrode contact 208a filling the first opening 204 is formed on the first lower electrode contact 206a.

Referring to FIG. 59, a phase change material layer and an upper electrode layer are formed on the second insulating interlayer pattern 202 to cover the second lower electrode contact 208a. The phase change material layer and the upper electrode layer are patterned to form a phase change structure 210 and an upper electrode 212 on the second lower electrode contact 208a and the second insulating interlayer pattern 202.

A third insulating interlayer pattern 214 having a second opening is formed on the second insulating interlayer pattern 202 to cover the upper electrode 212. The second opening partially exposes the upper electrode 212. An upper electrode contact 216 is formed on the upper electrode 212 to fill up the second opening.

Figure 63:
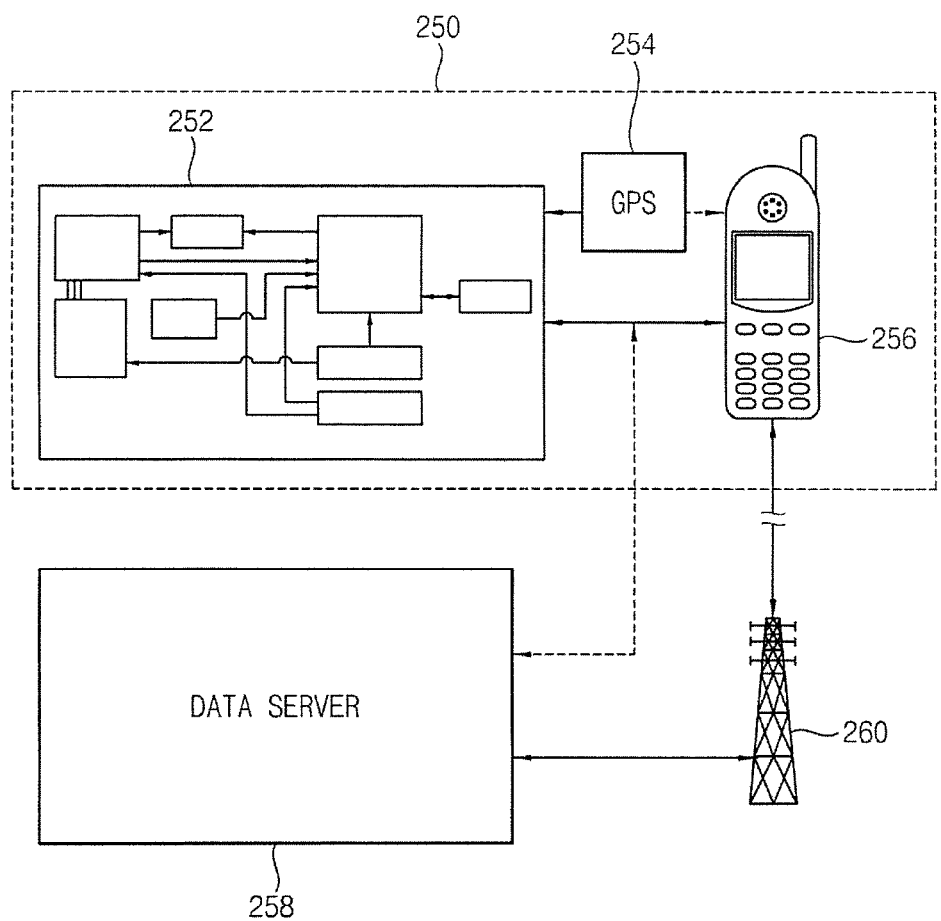
FIG. 63 is a schematic view illustrating a communication system including a mobile phone network capable of a broadband communication in accordance with exemplary embodiments of the inventive concept.

FIG. 63 is a schematic view illustrating a broadband communication system including a mobile telecommunication phone network capable of a broadband communication in accordance with exemplary embodiments of the inventive concept.

Referring to FIG. 63, the broadband communication system 250 includes a sensor module 252, a global positioning system (GPS) 254 and a mobile telecommunication phone 256. The broadband communication system 250 may communicate with a data server 258 and a network base 260. The mobile telecommunication phone 256 may demand rapid communication speed and high reliability of data because the mobile telecommunication phone 256 may receive/transfer much data from from/to the data serves 258 and the network base 260.

The mobile telecommunication phone 256 may include at least one of the resistance memory devices according to exemplary embodiments. The resistance memory devices may include the above-described magnetic memory devices and/or phase change memory devices. Because the resistance memory devices according to exemplary embodiments may ensure low driving current, rapid response speed and high reliability of data, the resistance memory devices may be employed in the mobile telecommunication phone 256.

The resistance memory devices according to exemplary embodiments may be employed in various electric and electronic apparatuses such as, for example, universal serial bus (USB) memories, MP3 players, digital cameras, or memory cards.

Evaluation of Resistances of Contact Structures

The resistance memory devices according to exemplary embodiments of the inventive concept may ensure high Joule heating efficiency because of a lower electrode contact having a high resistance. The following Samples and Comparative Samples were manufactured to compare resistances of lower electrode contact structures thereof.

Sample 1 to Sample 8

Figure 64:
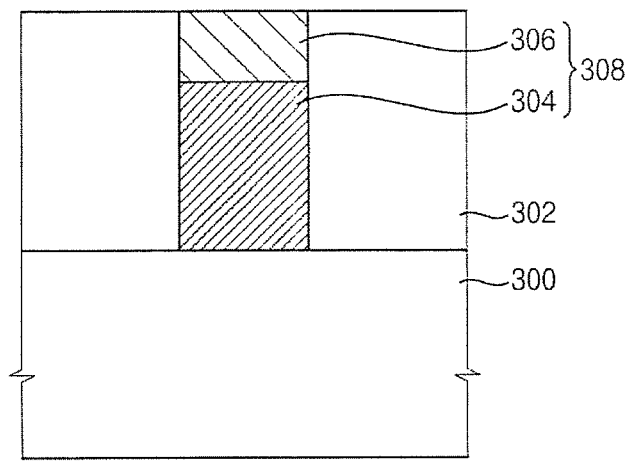
FIG. 64 is a cross sectional view illustrating contact structures according to Sample 1 to Sample 8.

FIG. 64 is a cross sectional view illustrating contact structures according to Sample 1 to Sample 8.

Referring to FIG. 64, insulating interlayer patterns 302 having openings were formed on substrates 300. Contact plugs 308 were formed in the openings. The contact plugs 308 had tungsten patterns 304 and tungsten oxide patterns 308 formed on the tungsten patterns 304. The tungsten oxide patterns 308 were obtained by treating the tungsten patterns 304 with RTA processes.

The contact plugs 308 of Sample 1 to Sample 8 had different diameters. The following Table 1 shows the diameters of the contact plugs 308 according to Sample 1 to Sample 8. The contact plugs 308 of Sample 1 to Sample 8 had constructions substantially the same as those of the above described conductive structures of the resistance memory devices.

Comparative Sample 11 to Comparative Sample 18

Figure 65:
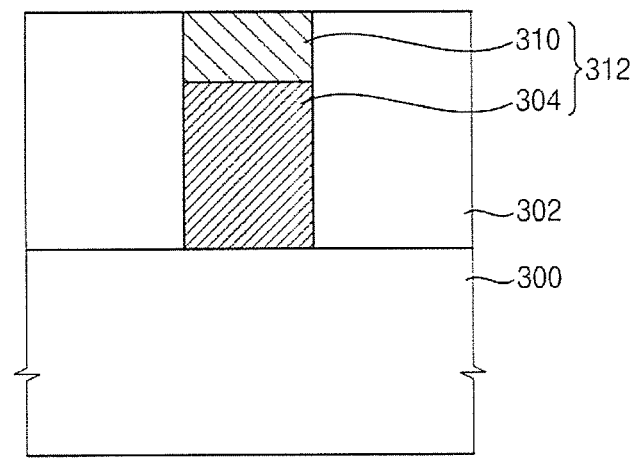
FIG. 65 is a cross sectional view illustrating contact structures according to Comparative Sample 11 to Comparative Sample 18.

FIG. 65 is a cross sectional view illustrating contact structures according to Comparative Sample 11 to Comparative Sample 18.

Referring to FIG. 65, insulating interlayer patterns 302 having openings were formed on substrates 300. Contact plugs 312 were formed in the openings. The contact plugs 308 had tungsten patterns 304 and tungsten nitride patterns 310 formed on the tungsten patterns 304.

The contact plugs 312 of Comparative Sample 11 to Comparative Sample 18 had different diameters. The following Table 1 shows the diameters of the contact plugs 312 according to Comparative Sample 11 to Comparative Sample 18.

Comparative Sample 21 to Comparative Sample 28

Figure 66:
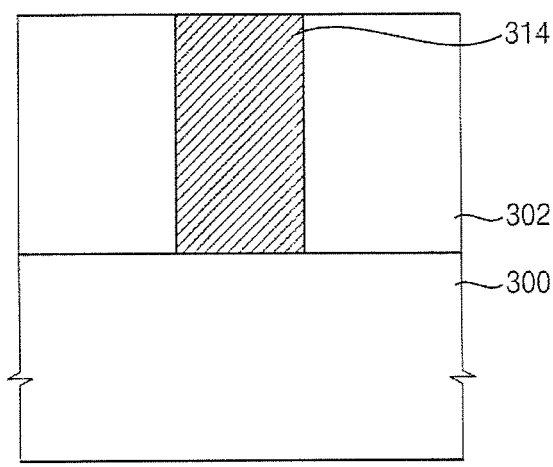
FIG. 66 is a cross sectional view illustrating contact structures according to Comparative Sample 21 to Comparative Sample 28.

FIG. 66 is a cross sectional view illustrating contact structures according to Comparative Sample 21 to Comparative Sample 28.

As shown in FIG. 66, insulating interlayer patterns 302 having openings were formed on substrates 300. Contact plugs 314 including tungsten were formed in the openings. The contact plugs 314 of Comparative Sample 21 to Comparative Sample 28 had different diameters. The following Table 1 shows the diameters of the contact plugs 314 according to Comparative Sample 21 to Comparative Sample 28.

TABLE 1

| Diameter | | | |
|---|---|---|---|
| 130 nm | Sample 1 | Comparative Sample 11 | Comparative Sample 21 |
| 140 nm | Sample 2 | Comparative Sample 12 | Comparative Sample 22 |
| 150 nm | Sample 3 | Comparative Sample 13 | Comparative Sample 23 |
| 160 nm | Sample 4 | Comparative Sample 14 | Comparative Sample 24 |
| 170 nm | Sample 5 | Comparative Sample 15 | Comparative Sample 25 |
| 180 nm | Sample 6 | Comparative Sample 16 | Comparative Sample 26 |
| 190 nm | Sample 7 | Comparative Sample 17 | Comparative Sample 27 |
| 200 nm | Sample 8 | Comparative Sample 18 | Comparative Sample 28 |

Figure 67:
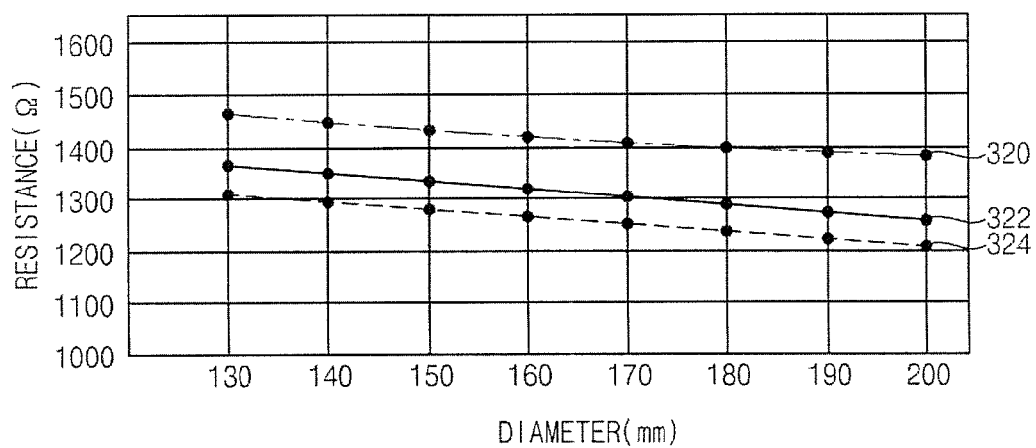
FIG. 67 is a graph showing resistances of contact structures according to Samples and Comparative Samples.

FIG. 67 is a graph showing resistances of contact structures according to Samples and Comparative Samples. In FIG. 67, a line 320 indicates the resistances of the contact structures according to Samples 1 to 8, a line 322 represents the resistances of the contact structures according to Comparative Samples 11 to 18, and a line 324 denotes the resistances of the contact structures according to Comparative Samples 21 to 28.

As shown in FIG. 67, after measuring the resistances of the contact structures having the same diameters according to Samples and Comparative Samples, the contact structures of Samples 1 to 8 had the resistances larger than those of the contact structures according to Comparative Samples 11 to 19 and 21 to 28. For example, the contact structure having the diameter of 130 nm according to Sample 1 had the relatively larger resistance of about 1,480Ω whereas the contact structures having the diameters of 130 nm according to Comparative Samples 11 and 21 had the resistances of 1,380Ω and 1,310Ω, respectively.

As described above, the contact structure of the resistance memory devices of the inventive concept include tungsten patterns and tungsten oxide patterns so that the contact structures may have improved resistances. The resistance memory devices may ensure enhanced characteristics because the contact structures improve the Joule heating efficiencies of the resistance memory devices.

Evaluation of Electrical Characteristics of Resistance Memory Devices Sample 9

A phase change memory device was manufactured through the processes described with reference to FIGS. 45 and 46. The phase change memory device of Sample 9 had the vertical configuration substantially the same as that described with reference to FIG. 39. A conductive pattern of the phase change memory device according to Sample 9 was formed using tungsten. A lower electrode contact was formed on the conductive pattern in a first opening by thermally treating the conductive pattern with a RTA process. The lower electrode contact included tungsten oxide. An upper electrode was formed using titanium nitride, and an upper electrode contact was formed using tungsten.

Comparative Sample 9

To compare the characteristics of the phase change memory device according to Sample 9, another phase change memory device was manufactured.

Figure 68:
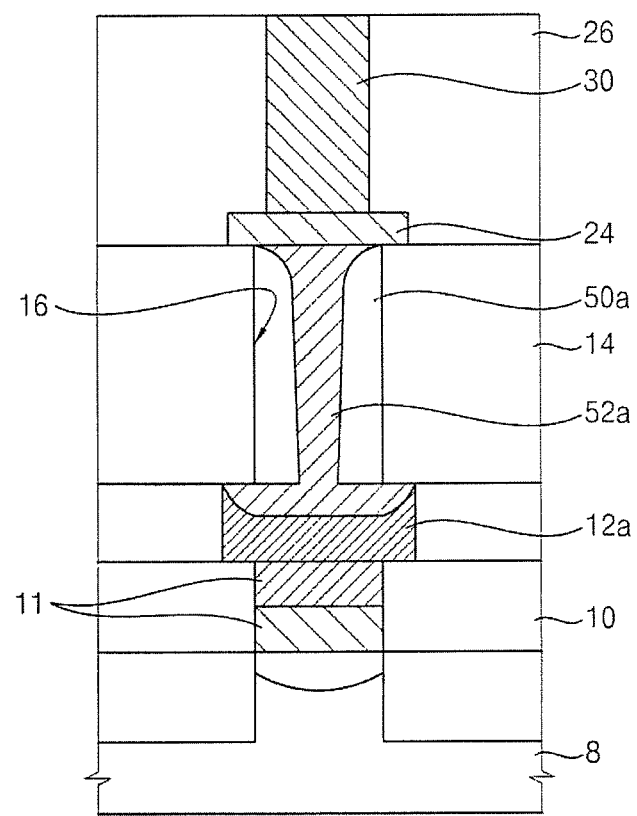
FIG. 68 is a cross sectional view illustrating a phase change memory device according to Comparative Sample 9.

FIG. 68 is a cross sectional view illustrating a phase change memory device according to Comparative Sample 9.

Referring to FIG. 68, the phase change memory device of Comparative Example 9 included a conductive pattern 12*a*, a phase change structure 52*a*, an upper electrode 24 and an upper electrode contact 30. The phase change memory device further includes a first insulating interlayer pattern 14 and a second insulating interlayer pattern 26. In the phase change memory device of Comparative sample 9, the phase change structure 52*a* was disposed on the conductive pattern 12*a* without a lower electrode contact. Thus, the conductive pattern 12a served as a lower electrode. The phase change memory device of Comparative Sample 9 includes a spacer 50a disposed on a sidewall of an opening where the phase change structure 52a was formed.

According to Sample 9 and Comparative Sample 9, a plurality of phase change memory devices was manufactured. Resistances of the phase change memory devices in set and reset states were measured, and currents of the phase change memory devices in the reset states were also measured. The following Table 2 shows the set resistances, the reset resistances and the reset currents of the phase change memory devices.

TABLE 2

| | Set Resistance ($R_{set}$) | Reset Resistance ($R_{reset}$) | Reset Current ($I_{reset}$) |
|---|---|---|---|
| Sample 9 | 1.63 kΩ-53.8 kΩ | 2.14 MΩ-6.35 MΩ | 180 μA-272 μA |
| Comparative Sample 9 | 17 kΩ-151 kΩ | 1.13 MΩ-2.27 MΩ | 166 μA-188 μA |

As shown in Table 2, the phase change memory device of Sample 9 had a set resistance smaller than a set resistance of the phase change memory device according to Comparative Sample 9, and the phase change memory device of Sample 9 also had a resistance distribution lower than a resistance distribution of the phase change memory device according to Comparative Sample 9. The phase change memory device of Sample 9 had a reset resistance larger than the reset resistance of the phase change memory device according to Comparative Sample 9. In the phase change memory device according to Comparative Sample 9, the phase change structure had a considerably large depth in the opening, so that voids or seams were frequently generated in the phase change structure, thereby causing operation failures of the phase change memory devices and deteriorating the electrical characteristics of the phase change memory device.

The phase change memory device according to the inventive concept may have a low resistance distribution and also a large resistance difference between a set state and a reset state to easily identify stored data. Therefore, the phase change memory device of the inventive concept may ensure desired operation characteristics.

According to the inventive concept, a resistance memory device including a conductive structure ensuring an excellent heating efficiency may be easily manufactured through simplified processes. Therefore, the resistance memory of the inventive concept device may be employed as a memory device demanding a high integration degree and a high performance.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

The invention claimed is:

1. A semiconductor device comprising:
   an interlayer insulating layer disposed on a substrate, the interlayer insulating layer comprising an opening exposing a conductive portion on the substrate;
   a barrier layer pattern disposed within the opening; and
   a conductive pattern disposed on the barrier layer pattern, the conductive pattern having an oxidized portion extending out of the opening and a non-oxidized portion within the opening,
   wherein a width of the conductive pattern is determined by a thickness of the barrier layer pattern, wherein a top surface of the non-oxidized portion is lower than a top surface of the interlayer insulating layer, wherein a size of a cross-sectional area of the oxidized portion in a plan view is smaller than a size of a cross-sectional area of the opening in the plan view.

2. The semiconductor device of claim 1, wherein the width of the conductive pattern is smaller than a width of the opening.

3. The semiconductor device of claim 1, wherein the oxidized portion extending out of the opening is thicker than an oxidized portion disposed within the opening.

4. The semiconductor device of claim 1, wherein a width of the oxidized portion is substantially the same as a width of the non-oxidized portion.

5. The semiconductor device of claim 1, wherein a width of the oxidized portion is larger than a width of the non-oxidized portion.

6. The semiconductor device of claim 1, further comprising a filling pattern disposed within the opening such that the conductive pattern is disposed between the barrier layer pattern and the filling pattern.

7. The semiconductor device of claim 6, wherein the conductive pattern has a cylindrical shape.

8. The semiconductor device of claim 1, wherein the conductive pattern comprises tungsten.

9. The semiconductor device of claim 1, wherein the barrier layer pattern comprises at least one of titanium or titanium nitride.

10. The semiconductor device of claim 1, wherein the barrier layer pattern comprises at least one of nitride or oxynitride.

11. The semiconductor device of claim 1, wherein the oxidized portion of the conductive pattern contacts a phase change material thin film in a PRAM.

12. The semiconductor device of claim 11, wherein the barrier layer pattern contacts a P-N diode disposed under the barrier layer pattern.

13. The semiconductor device of claim 1, wherein the oxidized portion of the conductive pattern contacts a free layer pattern in an MRAM.

14. The semiconductor device of claim 13, wherein the barrier layer pattern electrically contacts a MOS transistor disposed under the barrier layer pattern.

15. The semiconductor device of claim 1, wherein the size of the cross-sectional area of the oxidized portion in the plan view is determined by a size of the cross-sectional area of the barrier layer pattern.

16. A semiconductor device comprising:
   a substrate;
   an insulating layer having an opening disposed on the substrate;
   a metal pattern disposed on the substrate; and
   a metal oxide pattern disposed on the metal pattern and inside the opening,
   wherein a cross-sectional area of the entire metal oxide pattern is smaller than a cross-sectional area of the metal pattern, wherein a top surface of the metal pattern is lower than a top surface of the insulating layer, and wherein spacer is disposed between the metal oxide pattern and the insulating layer.

17. The semiconductor device of claim 16, wherein the metal pattern comprises tungsten.

18. The semiconductor device of claim 16, wherein a portion of the metal pattern contacting the metal oxide pattern is recessed and the recessed portion receives a protruding portion of the metal oxide pattern.

19. The semiconductor device of claim 16, wherein the metal pattern is disposed on a P-N junction.

20. The semiconductor device of claim 16, wherein the metal pattern is electrically connected to a MOS transistor.

21. The semiconductor device of claim 16, wherein the metal oxide pattern contacts a free layer pattern of an MRAM.

22. The semiconductor device of claim 16, wherein the metal oxide pattern contacts a phase change material thin film of a PRAM.

23. The semiconductor device of claim 22, wherein a spacer is disposed between the phase change material thin film and the insulating layer.

24. The semiconductor device of claim 22, wherein a top portion of the phase change material thin film has a wider width than a width of a bottom portion of the phase change material.

25. A semiconductor device comprising:
   a first insulating layer disposed on a substrate;
   a second insulating layer disposed on the first insulating layer, the second insulating layer comprising an opening;
   a third insulating layer disposed on the second insulating layer;
   a fourth insulating layer disposed on the third insulating layer;
   a memory storage device disposed in the fourth insulating layer; and
   a conductive pattern for heating the memory storage device, the conductive pattern comprising a metal pattern and a metal oxide pattern,
   wherein the metal pattern is disposed in the opening of the second insulating layer, the metal oxide pattern is disposed in the third insulating layer, and a width of the conductive pattern is smaller than a width of the opening.

26. The semiconductor device of claim 25, further comprising a MOS transistor disposed in the first insulating layer and a free layer pattern of an MRAM disposed in the fourth insulating layer.

27. The semiconductor device of claim 25, further comprising a P-N diode disposed in the first insulating layer and a phase change thin film disposed in the fourth insulating layer.

28. The semiconductor device of claim 25, wherein a top surface of the metal oxide pattern is disposed on a same plane with a top surface of the third insulating layer.

29. The semiconductor device of claim 25, further comprising a metal barrier pattern disposed between the metal pattern and the third insulating layer.

30. The semiconductor device of claim 29, wherein a top surface of the metal barrier pattern is disposed on a same plane with a top surface of the second insulating layer.

31. The semiconductor device of claim 29, wherein a top surface of the metal pattern is disposed lower than a top surface of the metal barrier pattern.

32. The semiconductor device of claim 25, wherein a top surface of the third insulating layer is disposed higher than a top surface of the metal pattern.

* * * * *